United States Patent
Uesaka et al.

(10) Patent No.: US 10,680,017 B2
(45) Date of Patent: Jun. 9, 2020

(54) LIGHT-EMITTING ELEMENT INCLUDING EL LAYER, ELECTRODE WHICH HAS HIGH REFLECTANCE AND A HIGH WORK FUNCTION, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Shogo Uesaka, Kanagawa (JP); Toshiki Sasaki, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 123 days.

(21) Appl. No.: 14/932,343

(22) Filed: Nov. 4, 2015

(65) Prior Publication Data

US 2016/0133878 A1 May 12, 2016

(30) Foreign Application Priority Data

Nov. 7, 2014 (JP) .................. 2014-227128

(51) Int. Cl.
*H01L 27/12* (2006.01)
*H01L 51/52* (2006.01)
(Continued)

(52) U.S. Cl.
CPC ...... *H01L 27/1225* (2013.01); *H01L 51/5218* (2013.01); *H01L 27/323* (2013.01);
(Continued)

(58) Field of Classification Search
CPC .................. H01L 27/1225; H01L 51/5218
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 369 936 A2 | 12/2003 |
| EP | 1 724 790 A1 | 11/2006 |

(Continued)

OTHER PUBLICATIONS

Dhar, A., & Alford, T. (2013). High Mobility IgZo/ItO Double-layered Transparent Composite Electrode: A Thermal Stability Study. MRS Proceedings, 1577. doi:10.1557/opl.2013.662.*

(Continued)

*Primary Examiner* — Lex H Malsawma
*Assistant Examiner* — Laura M Dykes
(74) *Attorney, Agent, or Firm* — Husch Blackwell LLP

(57) ABSTRACT

A light-emitting element including a first electrode, a second electrode, and an EL layer provided between the first and second electrodes is provided. The first electrode includes a conductive layer, a first transparent conductive layer in contact with the conductive layer, and a second transparent conductive layer in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is greater than or equal to that of the first transparent conductive layer.

24 Claims, 36 Drawing Sheets

(51) Int. Cl.
      *H01L 51/50*      (2006.01)
      *H01L 27/32*      (2006.01)
(52) U.S. Cl.
      CPC ...... *H01L 51/5024* (2013.01); *H01L 51/5265*
                    (2013.01); *H01L 2251/5376* (2013.01)

(56) References Cited

U.S. PATENT DOCUMENTS

| | | | |
|---|---|---|---|
| 6,294,274 | B1 | 9/2001 | Kawazoe et al. |
| 6,559,594 | B2 | 5/2003 | Fukunaga et al. |
| 6,563,174 | B2 | 5/2003 | Kawasaki et al. |
| 6,727,522 | B1 | 4/2004 | Kawasaki et al. |
| 6,768,260 | B2 | 7/2004 | Fukunaga et al. |
| 6,780,688 | B2 | 8/2004 | Kim |
| 6,806,643 | B2 | 10/2004 | Hayashi et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,101,242 | B2 | 9/2006 | Fukunaga et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,601,293 | B2 | 3/2009 | Ito et al. |
| 7,626,669 | B2 | 12/2009 | Lim et al. |
| 7,674,650 | B2 | 3/2010 | Akimoto et al. |
| 7,683,535 | B2 | 3/2010 | Fukunaga et al. |
| 7,732,819 | B2 | 6/2010 | Akimoto et al. |
| 7,745,993 | B2 | 6/2010 | Fukunaga et al. |
| 7,830,086 | B2 | 11/2010 | Adachi et al. |
| 7,867,053 | B2 | 1/2011 | Fukunaga et al. |
| 7,989,815 | B2 | 8/2011 | Yamazaki et al. |
| 8,038,857 | B2 | 10/2011 | Inoue et al. |
| 8,102,476 | B2 | 1/2012 | Son et al. |
| 8,324,027 | B2 | 12/2012 | Yamazaki et al. |
| 8,339,038 | B2 | 12/2012 | Fukunaga et al. |
| 8,368,066 | B2 | 2/2013 | Yamazaki et al. |
| 8,389,988 | B2 | 3/2013 | Yamazaki et al. |
| 8,441,011 | B2 | 5/2013 | Yamazaki et al. |
| 8,507,111 | B2 | 8/2013 | Inoue et al. |
| 8,773,628 | B2 | 7/2014 | Inoue et al. |
| 8,810,130 | B2 | 8/2014 | Fukunaga et al. |
| 9,006,755 | B2 | 4/2015 | Seo et al. |
| 9,172,059 | B2 | 10/2015 | Seo et al. |
| 9,252,279 | B2 | 2/2016 | Watanabe et al. |
| 9,472,601 | B2 | 10/2016 | Seo et al. |
| 9,564,609 | B2 | 2/2017 | Sasaki et al. |
| 9,653,705 | B2 | 5/2017 | Uesaka et al. |
| 9,704,894 | B2 | 7/2017 | Miyake et al. |
| 2001/0011868 | A1* | 8/2001 | Fukunaga ........... H01L 51/0097 313/506 |
| 2001/0046027 | A1 | 11/2001 | Tai et al. |
| 2002/0056838 | A1 | 5/2002 | Ogawa |
| 2002/0089023 | A1 | 7/2002 | Yu et al. |
| 2002/0132451 | A1 | 9/2002 | Ohtsu et al. |
| 2003/0189401 | A1 | 10/2003 | Kido et al. |
| 2003/0201716 | A1* | 10/2003 | Yamazaki ............ H01L 27/322 313/506 |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0062057 | A1* | 3/2005 | Yamazaki ........... H01L 27/3244 257/98 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0012016 | A1 | 1/2008 | Inoue et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0251785 | A1* | 10/2008 | Noh .................. H01L 27/12 257/40 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0283762 | A1 | 11/2009 | Kimura |
| 2010/0065839 | A1 | 3/2010 | Yamazaki et al. |
| 2010/0065840 | A1 | 3/2010 | Yamazaki et al. |
| 2010/0065844 | A1 | 3/2010 | Tokunaga |
| 2010/0072470 | A1 | 3/2010 | Yamazaki et al. |
| 2010/0072471 | A1 | 3/2010 | Yamazaki et al. |
| 2010/0092800 | A1 | 4/2010 | Itagaki et al. |
| 2010/0109002 | A1 | 5/2010 | Itagaki et al. |
| 2010/0163874 | A1 | 7/2010 | Koyama et al. |
| 2011/0032435 | A1 | 2/2011 | Kimura |
| 2011/0140205 | A1 | 6/2011 | Sakata et al. |
| 2011/0303953 | A1 | 12/2011 | Kamata |
| 2012/0062811 | A1 | 3/2012 | Miyake |
| 2012/0108018 | A1 | 5/2012 | Okabe et al. |
| 2012/0205676 | A1 | 8/2012 | Seo et al. |
| 2012/0205701 | A1 | 8/2012 | Sasaki et al. |
| 2012/0206675 | A1 | 8/2012 | Seo et al. |

(56) References Cited

U.S. PATENT DOCUMENTS

| | | | |
|---|---|---|---|
| 2012/0211745 A1 | 8/2012 | Ueda et al. | |
| 2012/0241750 A1 | 9/2012 | Chikama et al. | |
| 2012/0298988 A1 | 11/2012 | Hara et al. | |
| 2012/0319107 A1 | 12/2012 | Miyake | |
| 2013/0256639 A1* | 10/2013 | Kambe | H01L 51/5096 257/40 |
| 2014/0014948 A1 | 1/2014 | Matsukura | |
| 2014/0034954 A1 | 2/2014 | Yamazaki et al. | |
| 2014/0042432 A1 | 2/2014 | Yamazaki | |
| 2014/0042443 A1 | 2/2014 | Yamazaki | |
| 2014/0061636 A1 | 3/2014 | Miyake et al. | |
| 2014/0061654 A1 | 3/2014 | Yamazaki et al. | |
| 2014/0070208 A1 | 3/2014 | Yamazaki | |
| 2014/0070209 A1 | 3/2014 | Yamazaki et al. | |
| 2014/0070224 A1 | 3/2014 | Yamazaki | |
| 2014/0077208 A1 | 3/2014 | Matsukura | |
| 2014/0151686 A1 | 6/2014 | Yamazaki et al. | |
| 2014/0175385 A1 | 6/2014 | Li et al. | |
| 2014/0264320 A1* | 9/2014 | Liang | H01L 21/30604 257/43 |
| 2014/0333864 A1 | 11/2014 | Miyake et al. | |
| 2014/0349070 A1* | 11/2014 | Chu | H01L 51/5218 428/142 |
| 2015/0034936 A1 | 2/2015 | Fukunaga et al. | |
| 2016/0079433 A1 | 3/2016 | Watanabe et al. | |
| 2016/0118625 A1 | 4/2016 | Uesaka et al. | |
| 2017/0025479 A1 | 1/2017 | Seo et al. | |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-014514 A | 1/2004 |
| JP | 2004-103957 A | 4/2004 |
| JP | 2004-273614 A | 9/2004 |
| JP | 2004-273732 A | 9/2004 |
| JP | 2005-314734 A | 11/2005 |
| JP | 2006-164808 A | 6/2006 |
| JP | 2009-059666 A | 3/2009 |
| JP | 2010-010111 A | 1/2010 |
| JP | 2010-015786 A | 1/2010 |
| JP | 2012-182119 A | 9/2012 |
| JP | 2012-182127 A | 9/2012 |
| JP | 2013-065843 A | 4/2013 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for The Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of The Amorphous Liquid-Cholesteric Liquid Crystal Transistion:The "Blue Phase"", Physics Letters, Sep. 10, 1973, vol. 45A, No. 2, pp. 115-116.

Costello.M et at., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Perfomance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Being Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO2 as a Charge-Generation Layer", Adv. Mater. (Advanced Materials), 2006, vol. 18, No. 3, pp. 339-342.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International. Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL,YbFe2O4, and Yb2Fe3O7 Types of Structures for Compounds in The In2O3 and Sc2O3—A2O3—Bo Systems [A; Fe, or Al; B: Mn, Fe, Ni, Cu, or Zn] at Temperatures over 1000 ° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany,S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of The 13th International Display Workshops, Dec. 7, 2006, pp. 663-666.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of The Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amophous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by ArPlasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by The Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

"12.2.1 Electromotive Force of Cell," Kagaku Binran Kiso-hen (*Handbook of Chemistry, Fundamentals*), 4th ed., Sep. 30, 1993, pp. 464-468, Maruzen.

\* cited by examiner

β-Ga₂O₃ bixbyite-In₂O₃

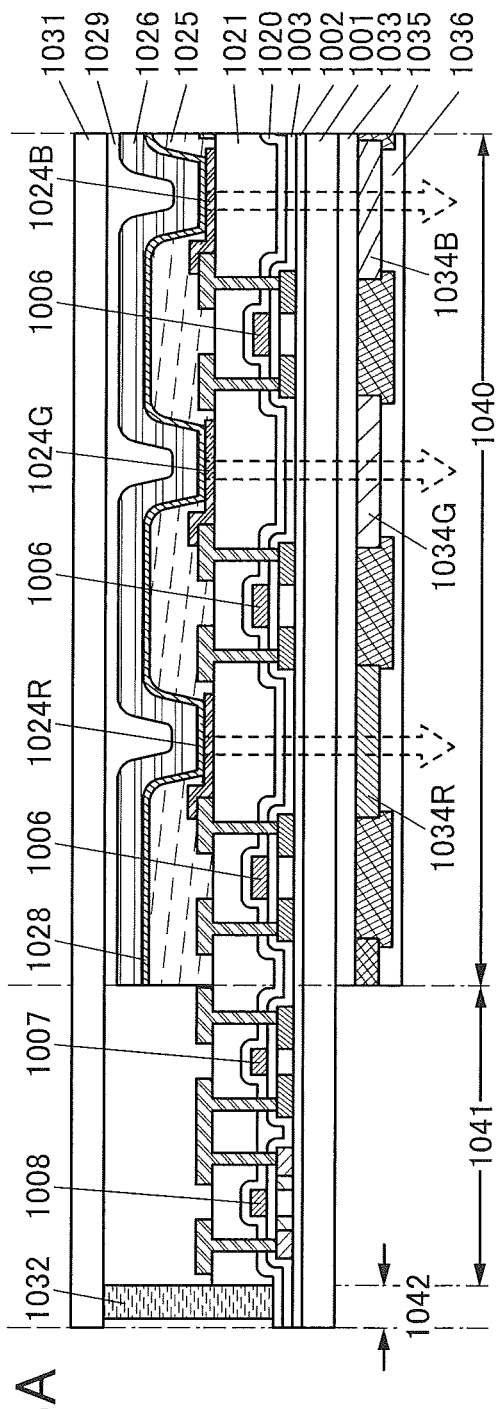
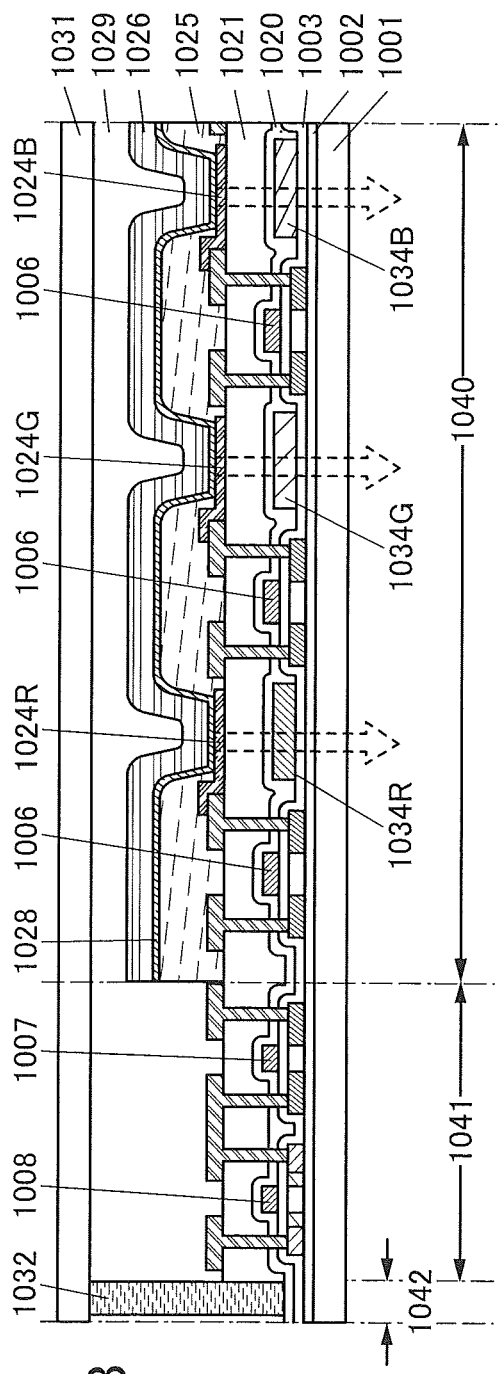
FIG. 13A
FIG. 13B

9100

9200

9101

9201

9102

9201

9201

LIGHT-EMITTING ELEMENT INCLUDING EL LAYER, ELECTRODE WHICH HAS HIGH REFLECTANCE AND A HIGH WORK FUNCTION, DISPLAY DEVICE, ELECTRONIC DEVICE, AND LIGHTING DEVICE

BACKGROUND OF THE INVENTION

1. Field of the Invention

One embodiment of the present invention relates to a light-emitting element, or a light-emitting device, a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying a voltage between the pair of electrodes of this element, light emission from the light-emitting substance can be obtained.

Since the above light-emitting element is a self-luminous type, a light-emitting device using this light-emitting element has advantages such as high visibility, no necessity of a backlight, low power consumption, and the like. Further, the light-emitting device using the light-emitting element also has advantages in that it can be formed to be thin and lightweight, and has high response speed.

In the case where the above light-emitting element is used for a display panel, there are the following two methods: a method of providing subpixels in a pixel with EL layers having functions of emitting light of different colors (hereinafter referred to as a separate coloring method) and a method of providing subpixels in a pixel with, for example, a common EL layer having a function of emitting white light and color filters each having a function of transmitting light of a different color (hereinafter referred to as a white EL+color filter method, and it is noted that the emission color of the common EL layer is not limited to white).

One of the advantages of the white EL+color filter method is that the EL layer can be shared by all of the subpixels. Therefore, compared with the separate coloring method, loss of a material of the EL layer and cost of patterning for forming the EL layer can be reduced; thus, display devices can be manufactured at low cost with high productivity. In the separate coloring method, it is necessary to provide a space between the subpixels to prevent mixture of the materials of the EL layers in the subpixels. In contrast, the white EL+color filter method has another advantage in that the space is not necessary and therefore a high-resolution display device having higher pixel density can be achieved.

The light-emitting element can emit light of a variety of colors depending on the kind of light-emitting substance included in the EL layer. A light-emitting element which can emit white light or light of color close to white with high efficiency has been particularly required to be applied to a lighting and a display device utilizing the white EL+color filter method. In addition, a light-emitting element having low power consumption is required.

In order to improve the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

Furthermore, in order to reduce power consumption of a light-emitting element, a method has been proposed, in which a metal oxide having a high work function is used for one of a pair of electrodes, through which light is not extracted, to reduce voltage loss due to the electrode and thus to reduce the drive voltage of a light-emitting element (e.g., see Patent Document 2).

REFERENCE

Patent Documents

[Patent Document 1] Japanese Published Patent Application No. 2012-182127
[Patent Document 2] Japanese Published Patent Application No. 2012-182119

SUMMARY OF THE INVENTION

In order to improve light extraction efficiency of a light-emitting element, it is preferable to use a material having high reflectance for one of a pair of electrodes, through which light is not extracted. In addition, in order to reduce the drive voltage of a light-emitting element, it is preferable to use a material having a high work function for an anode. However, it is difficult to select a stable material which has high reflectance and a high work function and which is suitable for such an electrode of the light-emitting element.

For this reason, the structure of an electrode in which a material having high reflectance and a material having a high work function are stacked has been employed to achieve an improvement of light extraction efficiency of a light-emitting element and a reduction of its drive voltage. However, electrons might be donated and accepted at an interface between two stacked different kinds of materials because of a difference in ionization tendency. Moreover, oxygen might be donated and accepted at the interface between the two tacked different kinds of materials when an oxide is used as one of them. Such donation and acceptance of electrons or oxygen result in corrosion of the electrode materials. In some cases, a defect due to film separation, a decrease of emission efficiency, or an increase of drive voltage of the light-emitting element might be resulted from the corrosion of the electrode materials because it changes stress of an electrode formed using the electrode materials. Furthermore; these disadvantages also involve an electrical short circuit or a light-emission defect of the light-emitting element.

When a display device that allows full-color display is manufactured by a separate coloring method, a step of evaporating a specific light-emitting layer only on a required subpixel with a shadow mask having minute openings is necessary; therefore, the openings of the shadow mask need to be arranged (aligned) at desired positions with high accuracy (alignment accuracy). A display device capable of high-resolution display requires higher alignment accuracy, which arises problems of a reduction in yield in manufacturing a display device and a cost increase.

In contrast, the white EL+color filter method does not need such a shadow mask having minute openings; thus, a display device can be manufactured with high productivity. However, since a light-emitting layer having a function of emitting white light is shared by subpixels in the white EL+color filter method, light of color which is not necessary for the subpixels is also emitted. Thus, the white EL+color filter method has a problem of low light use efficiency, as compared with the separate coloring method. Therefore, higher emission efficiency is required for the light-emitting element that emits white light. Moreover, a light-emitting element having excellent productivity is required. Furthermore, a light-emitting element having high light use efficiency is required.

In view of the above-described problems, an object of one embodiment of the present invention is to provide a novel light-emitting element. Another object is to provide a novel light-emitting element having high emission efficiency. Another object is to provide a novel light-emitting element with low power consumption. In addition, another object is to provide a novel light-emitting element including an EL layer having a plurality of light-emitting layers. Another object is to provide a light-emitting element where a region of an EL layer in which electrons and holes are recombined is controlled. Another object is to provide a method for manufacturing a novel light-emitting element. Another object is to provide a novel semiconductor device.

Note that the description of the above-described objects does not disturb the existence of other objects. In one embodiment of the present invention, there is no need to achieve all of these objects. Other objects are apparent from and can be derived from the description of the specification and the like.

One embodiment of the present invention is a light-emitting element including a first electrode, a second electrode, and an EL layer provided between the first electrode and the second electrode. The first electrode includes a conductive layer, a first transparent conductive layer in contact with the conductive layer, and a second transparent conductive layer in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is larger than or equal to that of the first transparent conductive layer.

Another embodiment of the present invention is a light-emitting element including a first electrode, an EL layer over the first electrode, and a second electrode over the EL layer. The first electrode includes a conductive layer, a first transparent conductive layer over and in contact with the conductive layer, and a second transparent conductive layer over and in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is larger than or equal to that of the first transparent conductive layer.

Another embodiment of the present invention is a light-emitting element including a first electrode, an EL layer over and in contact with the first electrode, and a second electrode over and in contact with the EL layer. The first electrode includes a conductive layer, a first transparent conductive layer over and in contact with the conductive layer, and a second transparent conductive layer over and in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is larger than or equal to that of the first transparent conductive layer.

Another embodiment of the present invention is a semiconductor device including a first electrode and a transistor. The first electrode includes a conductive layer, a first transparent conductive layer in contact with the conductive layer, and a second transparent conductive layer in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is larger than or equal to that of the first transparent conductive layer.

Another embodiment of the present invention is a semiconductor device including a first electrode and a transistor. The first electrode includes a conductive layer, a first transparent conductive layer over and in contact with the conductive layer, and a second transparent conductive layer over and in contact with the first transparent conductive layer. The first transparent conductive layer contains a first oxide. The second transparent conductive layer contains a second oxide. The conductive layer has a function of reflecting light. The first oxide contains In and M (M represents Al, Si, Ti, Ga, Y, Zr, La, Ce, Nd, or Hf). The second oxide contains In. The resistivity of the second transparent conductive layer is lower than that of the first transparent conductive layer. The thickness of the second transparent conductive layer is larger than or equal to that of the first transparent conductive layer.

In each of the above structures of the semiconductor device, the transistor includes an oxide semiconductor layer used for a channel region, and the oxide semiconductor layer contains In and M (M represents Al, Si, Ti, Ga, Y, Zr, La, Ce, Nd, or Hf).

In each of the above structures, the thickness of the first transparent conductive layer is preferably larger than or equal to 5 nm and less than or equal to 20 nm.

In each of the above structures, the first oxide preferably contains Ga.

In each of the above structures, the first oxide preferably contains In, Ga, and Zn.

In each of the above structures, the conductive layer preferably contains Al.

In each of the above structures, the second electrode preferably contains at least one of In, Ag, and Mg.

In each of the above structures, it is preferable that the EL layer include a first light-emitting layer and a second light-emitting layer, the first light-emitting layer contain a first compound that emits light, and the second light-emitting layer contain a second compound that emits light.

In each of the above structures, it is preferable that the first compound have a peak of an emission spectrum in any one color selected from violet, blue, and blue green, and the second compound have a peak of an emission spectrum in any one color selected from green, yellow green, yellow, orange, and red.

In each of the above structures, it is preferable that the first compound convert singlet excitation energy into light emission, and the second compound convert triplet excitation energy into light emission.

According to another embodiment of the present invention, a display device including the light-emitting element in any one of the above-described structures includes a transistor for switching the light-emitting element. The transistor includes an oxide semiconductor layer used for a channel region. The oxide semiconductor layer includes In and M (M represents Al, Si, Ti, Ga, Y, Zr, La, Ce, Nd, or Hf).

In the above-described structure, the first oxide and the oxide semiconductor layer preferably include the same element.

One embodiment of the present invention includes, in its category, a display device including the light-emitting element in any one of the above-described structures and at least one of a color filter and a transistor; an electronic device including the display device in any one of the above-described structures, and a housing or a touch sensor; and a lighting device including the light-emitting element in any one of the above-described structures, and a housing or a touch sensor. Note that a light-emitting device in this specification means an image display device or a light source (including a lighting device). In addition, the light-emitting element is included, in its category, all of a module in which a light-emitting device is provided with a connector such as a flexible printed circuit (FPC) or a tape carrier package (TCP), a module in which a printed wiring board is provided on the tip of a TCP, and a module in which an integrated circuit (IC) is directly mounted on a light-emitting device by a chip on glass (COG) method.

With one embodiment of the present invention, a novel light-emitting element can be provided. With one embodiment of the present invention, a novel light-emitting element having high emission efficiency can be provided. With one embodiment of the present invention, a novel light-emitting element with low power consumption can be provided. With one embodiment of the present invention, a novel light-emitting element including an EL layer having a plurality of light-emitting layers can be provided. With one embodiment of the present invention, a light-emitting element where a region of an EL layer in which electrons and holes are recombined is controlled can be provided. With one embodiment of the present invention, a method for manufacturing a novel light-emitting element can be provided. With one embodiment of the present invention, a novel semiconductor device can be provided.

Note that the description of these effects does not disturb the existence of other effects. One embodiment of the present invention does not necessarily have all of these effects. Other effects are apparent from and can be derived from the description of the specification, the drawings, the claims, and the like.

BRIEF DESCRIPTION OF THE DRAWINGS

In the accompanying drawings:

FIGS. 13A and 13B are schematic cross-sectional views each illustrating a display device of one embodiment of the present invention;

DETAILED DESCRIPTION OF THE INVENTION

Figure 1A:
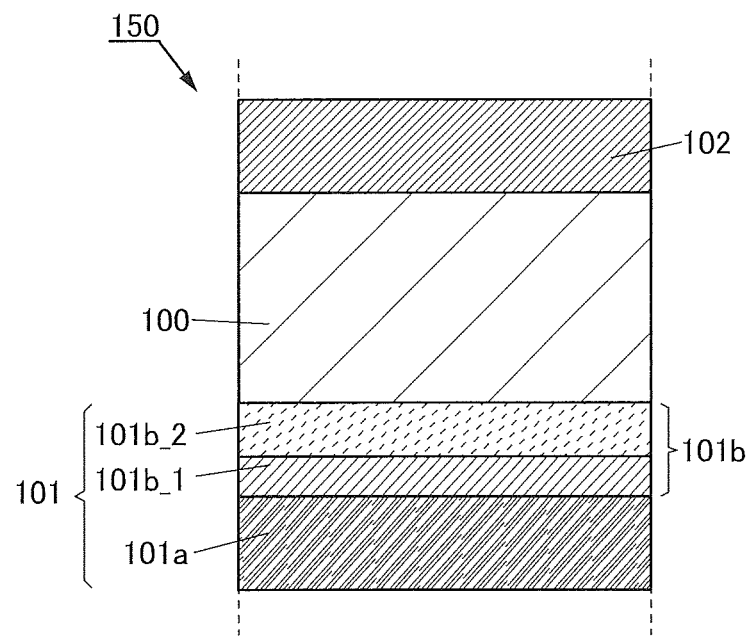
FIGS. 1A and 1B are schematic cross-sectional views illustrating a light-emitting element of one embodiment of the present invention.

Embodiments of the present invention will be described below with reference to the drawings. However, the present invention is not limited to description to be given below, and it is easily understood that modes and details thereof can be variously modified without departing from the purpose and the scope of the present invention. Accordingly, the present invention should not be construed as being limited to the description of the embodiments below.

Note that the position, the size, the range, or the like of each structure shown in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those which specify one embodiment of the present invention.

In describing structures of the invention with reference to the drawings in this specification and the like, common reference numerals are used for the same portions in different drawings.

In general, color is defined by three aspects of hue (corresponding to the wavelength of light of a single color), chroma (saturation, i.e., the degree to which it differs from white), and value (brightness, i.e., the intensity of light). In this specification and the like, color may be defined by only one of the above three aspects or two of the aspects which are selected arbitrarily. In this specification, a difference between two colors of light means a difference in at least one of the above three aspects and includes a difference in the shapes of two spectra of light or in the distributions of the relative intensity of the peaks in the spectra.

In this specification and the like, blue light emission has at least one peak of emission spectrum in a wavelength range of 420 nm or more and 490 nm or less, green light emission has at least one peak of emission spectrum in a wavelength range of 500 nm or more and less than 550 nm, yellow light emission has at least one peak of emission spectrum in a wavelength range of 550 nm or more and less than 590 nm, and red light emission has at least one peak of emission spectrum in a wavelength range of 590 nm or more and 740 nm or less.

In this specification and the like, a fluorescent material refers to a material that emits light in the visible light region when the level of the lowest singlet excited state ($S_1$ level) relaxes to the ground state. A phosphorescent material refers to a material that emits light in the visible light region at room temperature when the level of the lowest triplet excited state ($T_1$ level) relaxes to the ground state. That is, the phosphorescent material refers to a material that can convert triplet excitation energy into visible light.

Note that in this specification and the like, "room temperature" refers to a temperature in a range of 0° C. to 40° C.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, a light-emitting element of one embodiment of the present invention will be described below with reference to FIGS. 1A and 1B, FIGS. 2A and 2B, FIGS. 3A and 3B, FIG. 4, FIGS. 5A and 5B, FIGS. 6A and 6B, FIGS. 7A to 7D, and FIGS. 8A to 8C.

<1. Structure Example 1 of Light-emitting Element>

Figure 1B:
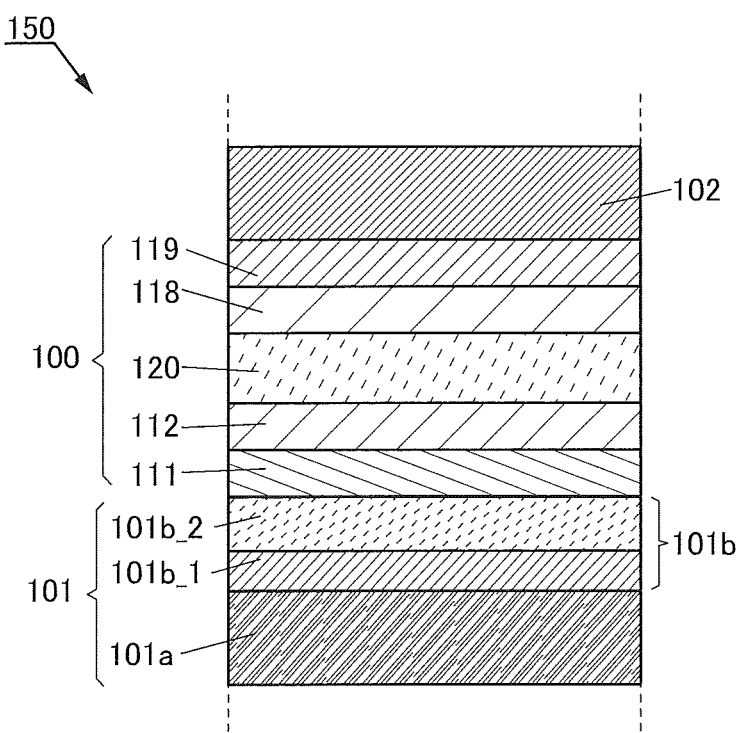

FIGS. 1A and 1B are cross-sectional views illustrating a light-emitting element of one embodiment of the present invention. A light-emitting element 150 illustrated in FIG. 1A includes an electrode 101, an EL layer 100, and an electrode 102. The electrode 101 includes a conductive layer 101a and a conductive layer 101b over and in contact with the conductive layer 101a.

The EL layer 100 illustrated in FIG. 1A may include a hole-injection layer 111, a hole-transport layer 112, a light-emitting layer 120, an electron-transport layer 118, and an electron-injection layer 119 as illustrated in FIG. 1B.

Although the electrode 101 is an anode and the electrode 102 is a cathode in the light-emitting element of this embodiment, the structure of the light-emitting element is not limited thereto. That is, the stacking order of the layers between the electrodes may be reversed assuming that the electrode 101 is a cathode and the electrode 102 is an anode. In other words, the hole-injection layer 111, the hole-transport layer 112, the light-emitting layer 120, the electron-transport layer 118, and the electron-injection layer 119 may be stacked in this order from the anode side.

These layers may be formed in the EL layer between the pair of electrodes, depending on their functions, and are not limited to the above layers. In other words, the EL layer between the pair of electrodes may include a layer which has a function of reducing a barrier to hole or electron injection, enhancing a hole/electron-transport property, inhibiting a hole/electron transport property, suppressing a quenching phenomenon due to an electrode, or the like.

«Structure Example of Electrode»

The conductive layer 101a of the electrode 101 has a function of reflecting light. When the conductive layer 101a is formed using a material containing aluminum (Al) or silver (Ag), the reflectance of the conductive layer 101a can be increased and the emission efficiency of the light-emitting element 150 can be increased. Note that Al is preferable because material cost is low, patterning can be easily performed, and manufacturing cost of a light-emitting element can be reduced. In addition, Ag is preferable because its particularly high reflectance can increase the emission efficiency of a light-emitting element.

In addition, in the case where the electrode 101 is used as an anode, the electrode 101 preferably has a high work function. Accordingly, a hole-injection property from the electrode 101 to the EL layer 100 can be improved. However, it is difficult to select a stable material which has high reflectance and a high work function and which is suitable for an electrode of a light-emitting element. This is because with Al and Ag, surface oxidation easily occurs in the air and a metal oxide film is formed on the surfaces of Al and Ag. When the resistivity of the metal oxide film is high, the resistivity of the electrode 101 also becomes high; as a result, the hole-injection property from the electrode 101 to the EL layer 100 deteriorates and the drive voltage of the light-emitting element 150 increases. Thus, the electrode 101 preferably has a structure where the conductive layer 101b having a high work function is provided over and in contact with the conductive layer 101a.

The conductive layer 101b which is over and in contact with the conductive layer 101a preferably has a function of transmitting visible light and preferably has high transmittance. When the conductive layer 101b has a function of transmitting light, the electrode 101 can have high reflectance and thus the light-emitting element 150 can have high emission efficiency.

In addition, the conductive layer 101b is preferably formed using an oxide, and in particular, an oxide containing indium (In) is preferably used. When the conductive layer 101b contains In, the conductivity of the conductive layer 101b can be increased. In addition, the light transmittance of the conductive layer 101b can be increased. In addition, with an oxide containing In, the hole-injection property from the conductive layer 101b to the EL layer 100 can be improved because of a high work function of the oxide. Therefore, drive voltage for the light-emitting element 150 can be reduced.

The conductive layer 101b has conductivity, and the resistivity of the conductive layer 101b is preferably lower than or equal to $1\times10^5$ Ω·cm, further preferably lower than or equal to $1\times10^4$ Ω·cm. Since the conductive layer 101b has conductivity, a property of electron or hole injection from the electrode 101 to the EL layer 100 can be improved and the drive voltage of the light-emitting element 150 can be reduced.

With a structure where the conductive layer 101a and the conductive layer 101b, which are included in the electrode 101, are in contact with each other, a difference in ionization tendency might arise between a material used for the conductive layer 101a and a material used for the conductive layer 101b (here, In).

The value of a standard electrode potential can be used as an index for an ionization tendency. For example, the standard electrode potential of Al is −1.68 V and that of In is −0.34 V; therefore, Al has a higher ionization tendency than In. In the case where a material containing Al is used for the conductive layer 101a and an oxide including In is used for the conductive layer 101b, the material containing Al and the oxide including In differ in ionization tendency; thus, electrons are donated and accepted between these materials, resulting in electrolytic corrosion. In addition, the bonding strength of Al with oxygen is higher than that of In with oxygen; therefore, oxygen might be donated and accepted between the material containing Al and the oxide including In, resulting in electrolytic corrosion, or an oxide of Al might be formed at an interface between the material containing Al and the oxide including In. Since the oxide of Al has low conductivity, the conductivity of the electrode 101 is reduced and thus the drive voltage of the light-emitting element 150 is increased. Furthermore, electrolytic corrosion might cause film separation because it changes stress of the electrode.

Therefore, in one embodiment of the present invention, the conductive layer 101b includes a transparent conductive layer 101b_1 over and in contact with the conductive layer 101a and a transparent conductive layer 101b_2 over and in contact with the transparent conductive layer 101b_1. The transparent conductive layer 101b_1 contains a first oxide, and the transparent conductive layer 101b_2 contains a second oxide.

The first oxide contains In and an element whose bond energy with oxygen is higher than that of In. Alternatively, the first oxide contains In and an element whose ionization tendency is higher than that of In. Further alternatively, the first oxide contains In and an element whose standard electrode potential is lower than that of In. In other words, the first oxide contains In and a stabilizer M (M represents Al, silicon (Si), titanium (Ti), gallium (Ga), yttrium (Y), zirconium (Zr), lanthanum (La), cerium (Ce), neodymium (Nd), or hafnium (Hf)). When the first oxide contains In, the conductivity of the transparent conductive layer 101b_1 can be increased. In addition, the light transmittance of the transparent conductive layer 101b_1 can be increased.

The second oxide contains In and thus the conductivity of the transparent conductive layer 101b_2 can be increased. In addition, the light transmittance can be increased. Moreover, the work function can be high, so that the hole-injection property to the EL layer 100 can be improved and the drive voltage of the light-emitting element 150 can be reduced. Thus, the second oxide preferably has higher transmittance than that of the first oxide. Furthermore, the second oxide preferably has lower resistivity than that of the first oxide. Therefore, the second oxide particularly preferably contains In and tin (Sn). Note that the second oxide does not necessarily contain the element whose bond energy with oxygen is higher than that of In, and does not necessarily contain the element whose ionization tendency is higher than that of In or the element whose standard electrode potential is lower than that of In.

With the above structure, the bonding strength of a metal element with oxygen is increased in the transparent conductive layer 101b_1; thus, donation and acceptance of oxygen between the transparent conductive layer 101b_1 and the conductive layer 101a can be prevented. Therefore, electrolytic corrosion of the electrode 101 can be prevented, resulting in lower drive voltage of the light-emitting element 150.

Furthermore, to increase the conductivity and the transmittance of the conductive layer 101b, it is preferable that the resistivity of the transparent conductive layer 101b_2 be lower than that of the transparent conductive layer 101b_1 and the thickness of the transparent conductive layer 101b_2 be larger than or equal to that of the transparent conductive layer 101b_1.

Here, the standard electrode potentials of In and elements which are examples that can be used as the stabilizer M are shown in Table 1. The calculated values of the bond energy between In and oxygen and between Ga, which is an example of the element that can be used as the stabilizer M, and oxygen are shown in Table 2.

TABLE 1

| | Standard electrode potential (V) |
|---|---|
| In | −0.34 |
| Al | −1.68 |
| Ti | −1.63 |
| Ga | −0.53 |
| Y | −2.37 |
| Zr | −1.55 |
| La | −2.37 |
| Ce | −2.34 |
| Nd | −2.32 |
| Hf | −1.70 |

TABLE 2

| | Bond energy (eV) |
|---|---|
| In—O | 1.83 |
| Ga—O | 2.39 |

*Chemistry manual (the 4th edition of revision) basic volume (II)* published by Maruzen Co., Ltd. is referred to for the standard electrode potentials in Table 1. As shown in Table 1, when an element whose standard electrode potential is lower than that of In is contained in the first oxide as the stabilizer M, a difference between standard electrode potential of the transparent conductive layer 101b_1 and that of the conductive layer 101a containing Al is reduced; thus, redox reaction between the transparent conductive layer 101b_1 and the conductive layer 101a is less likely to occur. In other words, it is possible to prevent donation and acceptance of electrons or oxygen between the conductive layer 101a containing Al and the conductive layer 101b.

Figure 6A:
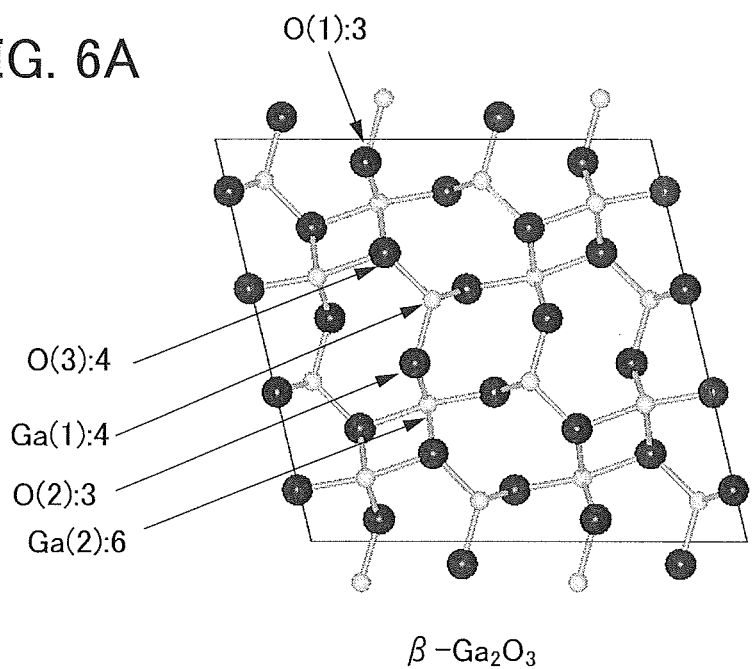
FIGS. 6A and 6B illustrate crystal models used for calculation of one embodiment of the present invention.
Figure 6B:
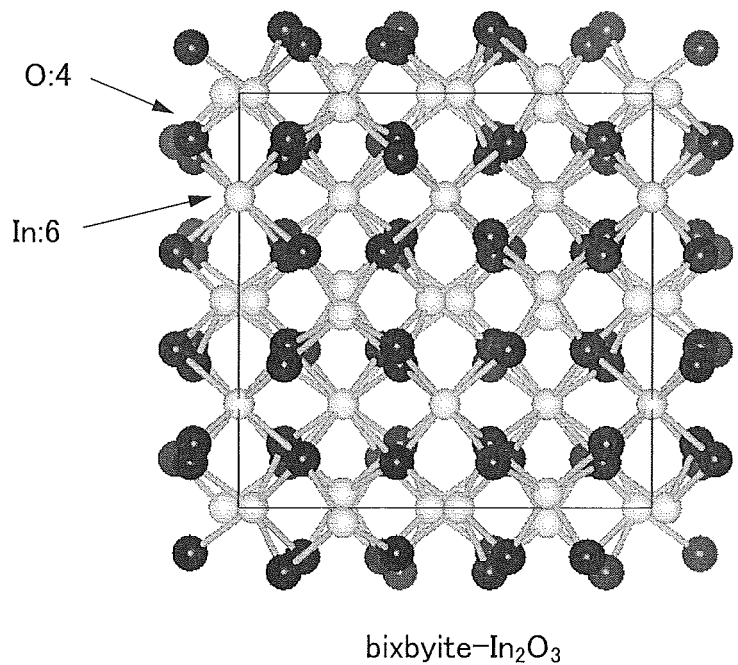

In the calculation of the bond energy between the metal elements and oxygen shown in Table 2, first principles calculation software VASP (the Vienna Ab initio Simulation Package) was used. FIGS. 6A and 6B illustrate crystal models used for the calculation. The effect of inner-shell electron was calculated by a projector augmented wave (PAW) method, and as a functional, generalized-gradient-approximation/Perdew-Burke-Ernzerhof (GGA/PBE) was used. The calculation conditions are shown in Table 3.

TABLE 3

| Software | VASP |
|---|---|
| Calculation model | bixbyite-In$_2$O$_3$: 80 atoms |
| | βGa$_2$O$_3$: 80 atoms |
| Functional | GGA/PBE |
| Pseudo potential | PAW |
| Cut-off energy | 500 eV |
| K-point | 3 × 3 × 3 (bixbyite-In$_2$O$_3$) |
| | 3 × 5 × 3 (β-Ga$_2$O$_3$) |

In addition, the bond energy with oxygen ($E_{binding}$ (M-O)) was calculated from Formula 1. Note that in Formula 1, M represents In or Ga and n represents the number of atoms depending on the model size, here n=16. $E_{atom}(M)$ and $E_{atom}(O)$ are total energy of M and O, respectively, and $E_{tot}(M_{2n}O_{3n})$ is total energy of an M$_2$O$_3$ crystal model. As in FIG. 6B, an In$_2$O$_3$ crystal includes only hexacoordinate In atoms and tetracoordinate O atoms, and the strength of the In—O bond can be regarded constant. In contrast, as in FIG. 6A, in a β-Ga$_2$O$_3$ crystal, energies of Ga—O bonds are not uniform because there are tricoordinate and tetracoordinate O atoms and tetracoordinate and hexacoordinate Ga atoms. However, their average value was used as the energy of the Ga—O bond to simplify the calculation.

[Formula 1]

$$E_{binding}(M-O) = \frac{2n \times E_{atom}(M) + 3n \times E_{atom}(O) - E_{tot}(M_{2n}O_{3n})}{(\text{the number of bonds in the model})} \quad (1)$$

As a result of the calculation, as in Table 2, the energy of the Ga—O bond is higher than the energy of the In—O bond. Thus, Ga bonds with oxygen more strongly.

Note that in an oxide including a plurality of metal elements like an In—Ga—Zn oxide, oxygen is more likely to bond with two or three kinds of metal elements than with a single metal element. Therefore, bond energy between a metal element and oxygen (M—O) was calculated next with a crystal model having an atomic ratio of In to Ga and Zn of 1:1:1. The number of atoms in the model was 84, and the conditions shown in Table 3 were used for the calculation. The bond energy ($E_{B,M-O}$) was calculated from Formula 2. In Formula 2, the bond energy ($E_{B,M-O}$) depends on a distance between M and O ($d_{M-O}$). In Formula 2, $a_{0,M}$, $a_{1,M}$, and $a_{2,M}$ were calculated by fitting so that S in Formula 3 has a minimum value. Note that in Formula 4, IGZO:V$_O$ represents a model of an In—Ga—Zn oxide in which oxygen vacancy (Vo) exists in the In—Ga—Zn oxide, and E(Vo) represents Vo generation energy in the model.

[Formula 2]

$$E_{B,M-O}(d_{M-O}) = a_{0,M} + a_{1,M}d_{M-O} + a_{2,M}d_{M-O}^2 \quad (2)$$

[Formula 3]

$$S = \sum_{i=all V_O} \left( E(V_O) - \sum_{j=all\_coordinated\_Metal} (a_{0,j} + a_{1,j}d_{j-O,i} + a_{2,j}d_{j-O,i}^2) \right)^2 \quad (3)$$

[Formula 4]

$$E(V_O) = E_{tot}(IGZO:V_O) + E_{atom}(O) - E_{tot}(IGZO) \quad (4)$$

The energy of the Ga—O bond between which the average distance was 0.195 nm was calculated to be 2.33 eV, and the energy of the In—O bond between which the average distance was 0.220 nm was calculated to be 1.80 eV. Therefore, also in an oxide including a plurality of metal elements like an In—Ga—Zn oxide, the energy of the Ga—O bond is higher than the energy of the In—O bond and thus Ga bonds with oxygen more strongly.

As described above, when an element whose standard electrode potential is lower than that of In, an element whose ionization tendency is higher than that of In, or an element whose bond energy with oxygen is higher than that of In is used as the stabilizer M for the transparent conductive layer 101b_1, it is possible to inhibit donation and acceptance of electrons or oxygen between the conductive layer 101*b* containing In and the conductive layer 101*a* containing Al. In other words, when the transparent conductive layer 101*b*_1 is formed using a first oxide containing In and the stabilizer M (M represents Al, Si, Ti, Ga, Y, Zr, La, Ce, Nd, or Hf), electrolytic corrosion of the electrode 101 can be prevented and accordingly the drive voltage of the light-emitting element 150 can be reduced. When the transparent conductive layer 101*b*_2 contains a second oxide containing In, the conductivity of the conductive layer 101*b* can be increased. In addition, the light transmittance of the conductive layer 101*b* can be increased. To achieve this, it is preferable that the resistivity of the transparent conductive layer 101*b*_2 be lower than that of the transparent conductive layer 101*b*_1 and the thickness of the transparent conductive layer 101*b*_2 be larger than or equal to that of the transparent conductive layer 101*b*_1. The thickness of the transparent conductive layer 101*b*_1 is preferably larger than or equal to 5 nm and less than or equal to 20 nm.

Note that the standard electrode potential of Ag is 0.80 V; therefore, Ag has a lower ionization tendency than In. Thus, a material containing Ag is preferably used for the conductive layer 101*a*, in which case donation and acceptance of oxygen from the conductive layer 101*b* to the conductive layer 101*a* is less likely to occur. However, also in this case, the transparent conductive layer 101*b*_1 is preferably formed using a first oxide containing In and the stabilizer M (M represents Al, Si, Ti, Ga, Y, Zr, La, Ce, Nd, or Hf) because the bonding strength with oxygen in the transparent conductive layer 101*b*_is further increased and thus the electrode 101 which is more stable can be formed.

The electrode 102 has a function of transmitting light. When the electrode 102 is formed using a material containing at least one of In, Ag, and magnesium (Mg), the light transmittance of the electrode 102 can be increased and the emission efficiency of the light-emitting element 150 can be increased.

In the case where the electrode 102 has functions of transmitting light and reflecting light, the emission efficiency of the light-emitting element 150 can be increased by a microcavity effect. For this reason, it is preferable to use the material containing at least one of In, Ag, and Mg for the electrode 102.

The electrode 101 may have functions of reflecting light and transmitting light. In such a case, the conductive layer 101*a* of the electrode 101 preferably has a thickness that can transmit light. In the case where the electrode 101 has functions of reflecting light and transmitting light, the electrode 102 preferably has a function of reflecting light and particularly preferably includes Ag having high reflectance.

When a color filter is provided over the electrode through which light is extracted, the color purity of the light-emitting element 150 can be improved. Therefore, the color purity of a display device including the light-emitting element 150 can be improved.

<2. Structure Example 2 of Light-emitting Element>

Next, a structure example different from the light-emitting element 150 illustrated in FIGS. 1A and 1B is described below with reference to FIG. 2A.

Figure 2A:
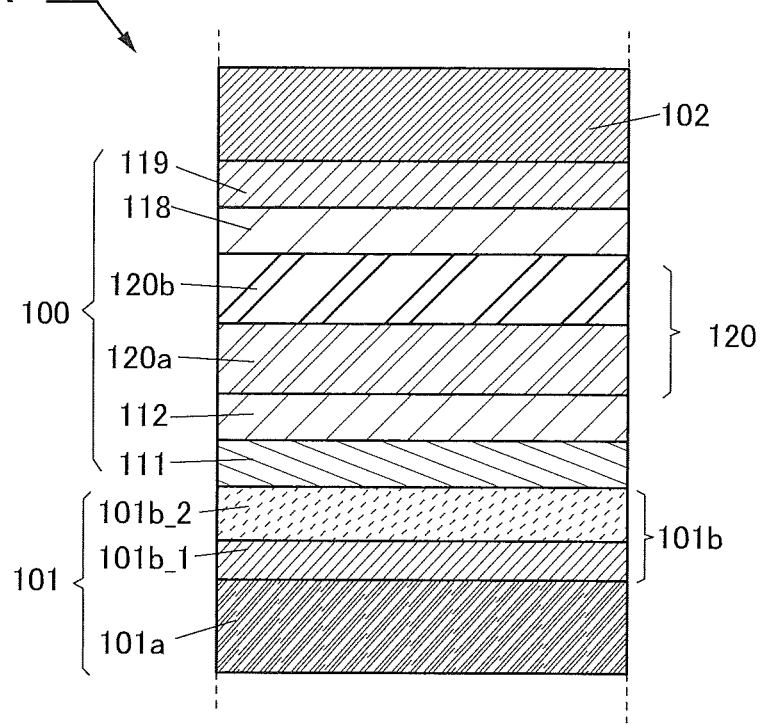
FIGS. 2A and 2B are schematic cross-sectional views each illustrating a light-emitting element of one embodiment of the present invention.

FIG. 2A is a cross-sectional view illustrating a light-emitting element of one embodiment of the present invention. In FIG. 2A, a portion having a function similar to that in FIGS. 1A and 1B is represented by the same hatch pattern as in FIGS. 1A and 1B and not especially denoted by a reference numeral in some cases. In addition, common reference numerals are used for portions having similar functions, and a detailed description of the portions is omitted in some cases.

In a light-emitting element 152 illustrated in FIG. 2A, the electrode 101 includes the conductive layer 101*a* having a function of reflecting light and the conductive layer 101*b* over and in contact with the conductive layer 101*a*. In addition, the conductive layer 101*b* includes the transparent conductive layer 101*b*_1 over and in contact with the conductive layer 101*a* and the transparent conductive layer 101*b*_2 over and in contact with the transparent conductive layer 101*b*_1.

In the case where the electrode 101 is used as an anode, it is preferable to use a material having a high work function for the transparent conductive layer 101*b*_2. In the case where the electrode 101 is used as a cathode, it is preferable to use a material having a low work function for the transparent conductive layer 101*b*_2. With such a transparent conductive layer 101*b*_2, the electrode 101 has a favorable property of carrier injection to the EL layer.

The light-emitting layer 120 may have a stacked-layer structure of a light-emitting layer 120*a* and a light-emitting layer 120*b* as in the light-emitting element 152 in FIG. 2A. When light-emitting materials having functions of emitting light of different colors are used for the light-emitting layers 120*a* and 120*b*, light of a plurality of emission colors can be obtained at the same time from the light-emitting element 152. In addition, it is preferable to select light-emitting materials so that white light can be obtained by combining light emission from the light-emitting layers 120*a* and 120*b*.

The light-emitting layer 120 may have a structure in which three or more layers are stacked or may include a layer having no light-emitting material.

<3. Structure Example 3 of Light-emitting Element>

Next, a structure example different from the light-emitting elements illustrated in FIGS. 1A and 1B and FIG. 2A is described below with reference to FIG. 2B.

Figure 2B:
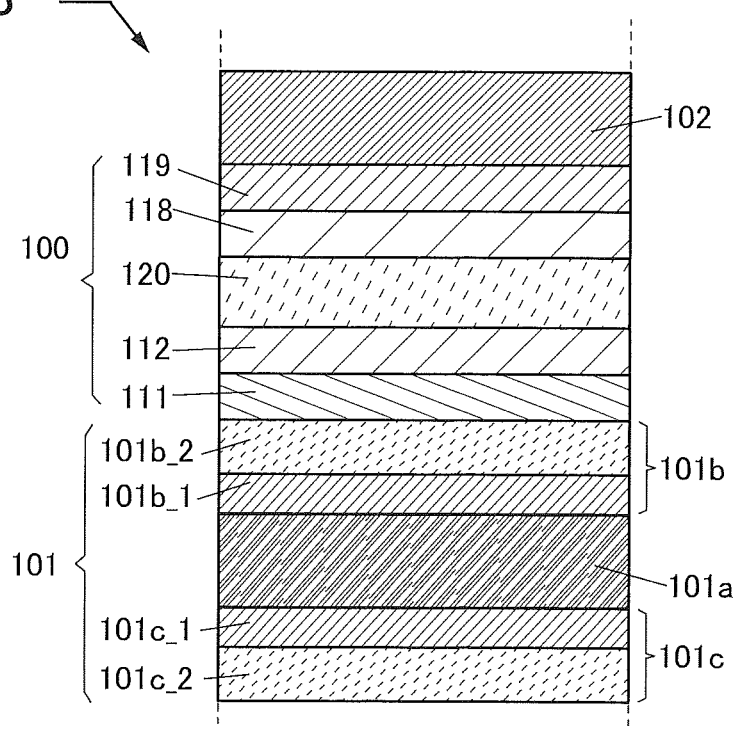

FIG. 2B is a cross-sectional view illustrating a light-emitting element of one embodiment of the present invention. In FIG. 2B, a portion having a function similar to that in FIGS. 1A and 1B and FIG. 2A is represented by the same hatch pattern as in FIGS. 1A and 1B and FIG. 2A and not especially denoted by a reference numeral in some cases. In addition, common reference numerals are used for portions having similar functions, and a detailed description of the portions is omitted in some cases.

FIG. 2B illustrates a structure example of a light-emitting element further including a lower conductive layer 101*c* in a lower part of the electrode 101. A light-emitting element 154 illustrated in FIG. 2B includes the conductive layer 101*b* over and in contact with the conductive layer 101*a* and the lower conductive layer 101*c* under and in contact with the conductive layer 101*a* as components of the electrode 101. In other words, FIG. 2B illustrates a structure example of the electrode 101 in which the conductive layer 101*a* is interposed between the conductive layer 101*b* and the lower conductive layer 101*c*. In addition, the conductive layer 101*b* includes the transparent conductive layer 101*b*_1 over and in contact with the conductive layer 101*a* and the transparent conductive layer 101*b*_2 over and in contact with the transparent conductive layer 101*b*_1. The lower conductive layer 101*c* includes the lower conductive layer 101*b*_1 under and in contact with the conductive layer 101*a* and the lower conductive layer 101*b*_2 under and in contact with the lower conductive layer 101*b*_1. In other words, the light-emitting element 154 is a structure example of a light-emitting element which includes the electrode 101 in which the conductive layer 101a is interposed between the transparent conductive layer 101b_1 and the lower conductive layer 101b_1 and further between the transparent conductive layer 101b_2 and the lower conductive layer 101b_2.

Materials used for the transparent conductive layer 101b_1 and the lower conductive layer 101b_1 may be different or the same. In the case of using the same materials, the conductive layer 101a is interposed between the same oxide materials. When the structure of one embodiment of the present invention is employed for the transparent conductive layer 101b_1 and the lower conductive layer 101b_1, the conductive layer 101a is interposed between layers containing stable oxide. Thus, the electrode 101 which is stable can be formed. Moreover, the electrode 101 preferably has a structure interposed between the same oxide materials, in which case patterning by an etching step can be easily performed.

Materials used for the transparent conductive layer 101b_2 and the lower conductive layer 101b_2 may be different or the same. In the case of using the same materials, the conductive layer 101a, the transparent conductive layer 101b_1, and the lower conductive layer 101b_1 are interposed between the same transparent conductive materials. Moreover, the electrode 101 preferably has a structure interposed between the same transparent conductive materials, in which case patterning by an etching step can be easily performed.

Note that only one of the transparent conductive layer 101b_2 and the lower conductive layer 101b_2 may be provided in the light-emitting element 154. In addition, only one of the transparent conductive layer 101b_and the lower conductive layer 101b_1 may be provided.

<4. Structure Example 4 of Light-emitting Element>

Next, structure examples different from the light-emitting elements illustrated in FIGS. 1A and 1B and FIGS. 2A and 2B are described below with reference to FIGS. 3A and 3B.

Figure 3A:
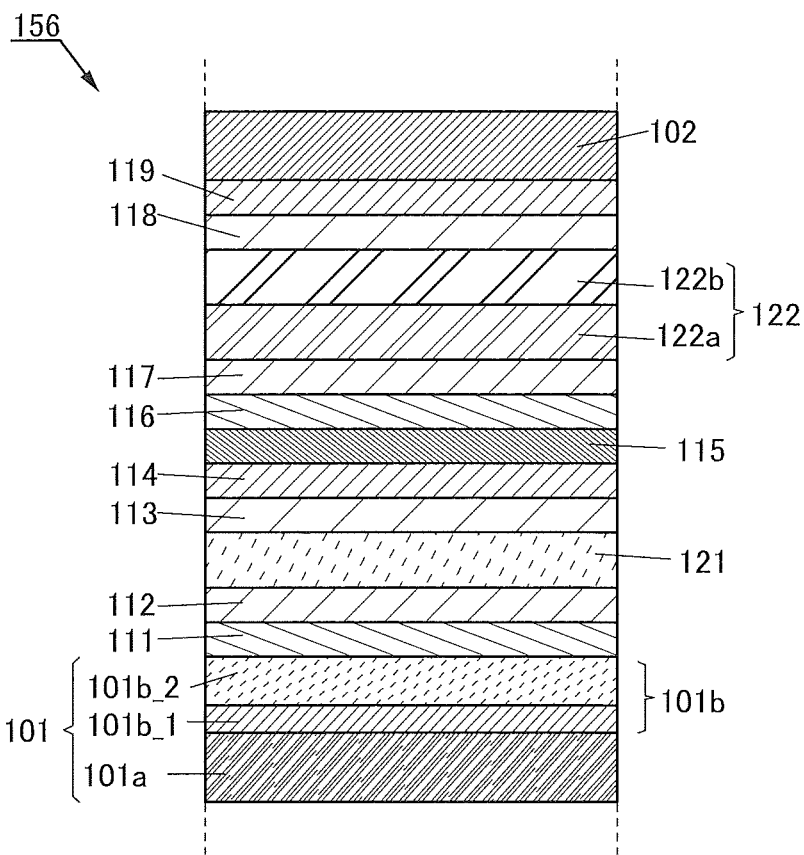
FIGS. 3A and 3B are schematic cross-sectional views each illustrating a light-emitting element of one embodiment of the present invention.
Figure 3B:
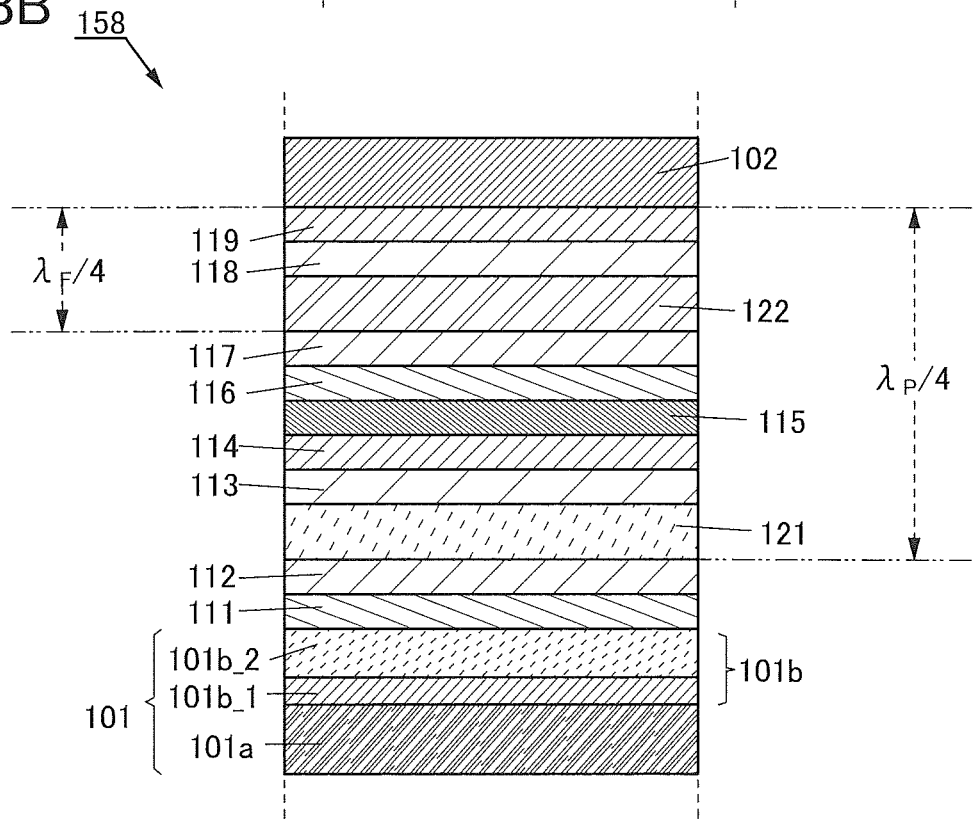

FIGS. 3A and 3B are cross-sectional views each illustrating a light-emitting element of one embodiment of the present invention. In FIGS. 3A and 3B, a portion having a function similar to that in FIGS. 1A and 1B and FIGS. 2A and 2B is represented by the same hatch pattern as in FIGS. 1A and 1B and FIGS. 2A and 2B and not especially denoted by a reference numeral in some cases. In addition, common reference numerals are used for portions having similar functions, and a detailed description of the portions is omitted in some cases.

FIGS. 3A and 3B each illustrate a structure example of a tandem light-emitting element in which a plurality of light-emitting layers are stacked between a pair of electrodes with a charge-generation layer provided between the light-emitting layers. A tandem light-emitting element 156 and a light-emitting element 158 each include a light-emitting layer 121, a charge-generation layer 115, and a light-emitting layer 122 between the electrode 101 and the electrode 102. In addition, the hole-injection layer 111, the hole-transport layer 112, an electron-transport layer 113, an electron-injection layer 114, a hole-injection layer 116, a hole-transport layer 117, the electron-transport layer 118, and the electron-injection layer 119 are included.

The light-emitting layers 121 and 122 each contain a light-emitting material. The light-emitting layers 121 and 122 can each have a stacked-layer structure of two layers, for example, a light-emitting layer 122a and a light-emitting layer 122b in the light-emitting element 156 in FIG. 3A. Two kinds of light-emitting materials (a first compound and a second compound) having functions of emitting light of different colors are used for the two light-emitting layers, so that light of a plurality of emission colors can be obtained at the same time. It is particularly preferable to select light-emitting materials for the light-emitting layers 121 and 122 so that white light can be obtained by combining light emission from the light-emitting layers.

The light-emitting layer 121 or 122 may have a structure in which three or more layers are stacked or may include a layer having no light-emitting material.

Furthermore, the light-emitting elements 156 and 158 each preferably have a microcavity structure. The microcavity structure will be described below.

«Microcavity Structure»

Light emitted from the light-emitting layer 121 and the light-emitting layer 122 resonates between a pair of electrodes (the electrode 101 and the electrode 102). The light-emitting layer 121 is formed at a position where the wavelength of light to be emitted is amplified. For example, an optical path length from the electrode 101 to the light-emitting layer 121 and an optical path length from the electrode 102 to the light-emitting layer 121 are adjusted, whereby the wavelength of light emitted from the light-emitting layer 121 can be amplified. In addition, the light-emitting layer 122 is formed at a position where the wavelength of light to be emitted is amplified. For example, an optical path length from the electrode 102 to the light-emitting layer 122 and an optical path length from the electrode 101 to the light-emitting layer 122 are adjusted, whereby the wavelength of light emitted from the light-emitting layer 122 can be amplified.

In the light-emitting elements 156 and 158, the above optical lengths are satisfied, and the optical path length between the electrode 101 and the electrode 102 is adjusted to be $m\lambda_X/2$ (m is a natural number and $\lambda_X$ is a wavelength of a desired color).

In the case of a tandem light-emitting element in which a plurality of light-emitting layers (here, the light-emitting layers 121 and 122) are stacked with the charge-generation layer 115 provided therebetween, the optical path lengths of the light-emitting layers 121 and 122 are preferably optimized.

Thus, a further preferable structure is the following structure: the light-emitting layer 121 which is a light-emitting layer on the side apart from the electrode 102 has a peak of an emission spectrum on a longer wavelength side than the light-emitting layer 122 which is a light-emitting layer on the side close to the electrode 102 does; and the optical path lengths between the electrode 102 and each of the light-emitting layers are set to approximately $\lambda_X/4$ ($\lambda_X$ represents a wavelength of a desired color) that is a minimum value of the optical path length at which the wavelength of each light-emitting layer is amplified.

That is, as in the light-emitting element 158 in FIG. 3B, the light-emitting layer 121 preferably has the peak of the emission spectrum on the longer wavelength side than the light-emitting layer 122 does, and is preferably formed at a position where a distance (thickness) from the electrode 102 is 130 nm or less.

Therefore, in the light-emitting element 158, light emission from the light-emitting layer 121 has a peak of an emission spectrum in any one color selected from green, yellow green, yellow, orange, and red, and light emission from the light-emitting layer 122 has a peak of an emission spectrum in any one color selected from violet, blue, and blue green. For example, for the light-emitting layer 121, a phosphorescent material emitting yellow light can be used as a light-emitting material. Furthermore, for the light-emitting layer 122, a phosphorescent material emitting blue light can be used as a light-emitting material.

In the case where the wavelength of light emitted from the light-emitting layer 121 is 600 nm or more and 780 nm or less, which exhibits red light, the optical path length $\lambda_P/4$ ($\lambda_P$ represents a wavelength of light to be amplified) from the electrode 102 to the light-emitting layer 121 is 195 nm or less. Furthermore, in the case where the wavelength of light emitted from the light-emitting layer 122 is 400 nm or more and less than 480 nm, which exhibits blue light, the optical path length $\lambda_F/4$ ($\lambda_F$ represents a wavelength of light to be amplified) between the electrode 102 and the light-emitting layer 122 is less than 120 nm. Note that an optical path length is represented by "actual distance×refractive index"; thus, when the refractive index of an organic compound which forms the light-emitting layer 121, the charge-generation layer 115, and the light-emitting layer 122 is set to 1.5 or more and 2.0 or less, the distance (thickness) from the electrode 102 to the light-emitting layer 121 is 130 nm or less. In other words, the light-emitting layer 121 is formed at a position where the distance (thickness) from the electrode 102 is 130 nm or less. Similarly, the distance (thickness) from the electrode 102 to the light-emitting layer 122 is less than 80 nm. In other words, the light-emitting layer 122 is formed at a position where the distance (thickness) from the electrode 102 is less than 80 nm. Note that, for example, an optical path length between an electrode and a light-emitting layer is an optical path length between a reflection region of the electrode and a light-emitting region of the light-emitting layer. However, it is difficult to precisely determine the reflection region of the electrode in some cases; thus, the optical path length may be calculated wherever the reflection region may be set in the electrode. In addition, in the case where it is difficult to precisely determine the light-emitting region of the light-emitting layer, the optical path length may be calculated wherever the light-emitting region may be set in the light-emitting layer.

Furthermore, when the distance (thickness) from the electrode 102 to the light-emitting layer 121 is 130 nm or less and the distance (thickness) from the electrode 102 to the light-emitting layer 122 is less than 80 nm, the distance (thickness) between the light-emitting layers 121 and 122 is approximately 50 nm, which is a value obtained by subtracting 80 nm from 130 nm. However, in consideration of the thicknesses of the light-emitting layers 121 and 122, the distance (thickness) between the light-emitting layers 121 and 122 is 40 nm or less, preferably 30 nm or less. The distance (thickness) between the light-emitting layers 121 and 122 is in the above range, whereby the light-emitting layers 121 and 122 can be formed at positions where the wavelengths of the light-emitting layers are amplified, and the optical path lengths of the light-emitting layers 121 and 122 can be optimized.

In the case where the wavelength of light emitted from the light-emitting layer 121 is 550 nm or more and less than 600 nm, which exhibits yellow light, the optical path length $\lambda_P/4$ ($\lambda_P$ represents a wavelength of light to be amplified) between the electrode 102 and the light-emitting layer 121 is less than 150 nm. Furthermore, in the case where the wavelength of light emitted from the light-emitting layer 122 is 400 nm or more and less than 480 nm, which exhibits blue light, the optical path length $\lambda_F/4$ ($\lambda_F$ represents a wavelength of light to be amplified) between the electrode 102 and the light-emitting layer 122 is less than 120 nm. If the optical path length is replaced with the distance (thickness) in consideration of the refractive index with the use of the above description, the distance (thickness) from the electrode 102 to the light-emitting layer 121 is less than 100 nm. In other words, the light-emitting layer 121 is formed at a position where the distance (thickness) from the electrode 102 is less than 100 nm. Similarly, the distance (thickness) from the electrode 102 to the light-emitting layer 122 is less than 80 nm. In other words, the light-emitting layer 122 is formed at a position where the distance (thickness) from the electrode 102 is less than 80 nm.

In the case where light emitted from the light-emitting layer 121 is amplified, the optical path length needs to be greater than that in the case where light emitted from the light-emitting layer 122 is amplified. Thus, not only the optical path length from each light-emitting layer (the light-emitting layers 121 and 122) to the electrode 102 but also the optical path length from each light-emitting layer (the light-emitting layers 121 and 122) to the electrode 101 needs to be adjusted to an optimized optical path length. In order to increase the optical path length from each light-emitting layer (the light-emitting layers 121 and 122) to the electrode 101 without increasing drive voltage of the light-emitting element 158 as much as possible, the thickness of the conductive layer 101b in the electrode 101 is preferably adjusted. In addition, the thickness of the transparent conductive layer 101b_2 in the conductive layer 101b is preferably adjusted. Thus, the resistivity of the transparent conductive layer 101b_2 is lower than that of the transparent conductive layer 101b_1, and the thickness of the transparent conductive layer 101b_2 is larger than or equal to that of the transparent conductive layer 101b_1.

<5. Structure Example 5 of Light-emitting Element>

Next, a structure example different from the light-emitting elements illustrated in FIGS. 1A and 1B, FIGS. 2A and 2B, and FIGS. 3A and 3B is described below with reference to FIG. 4.

Figure 4:
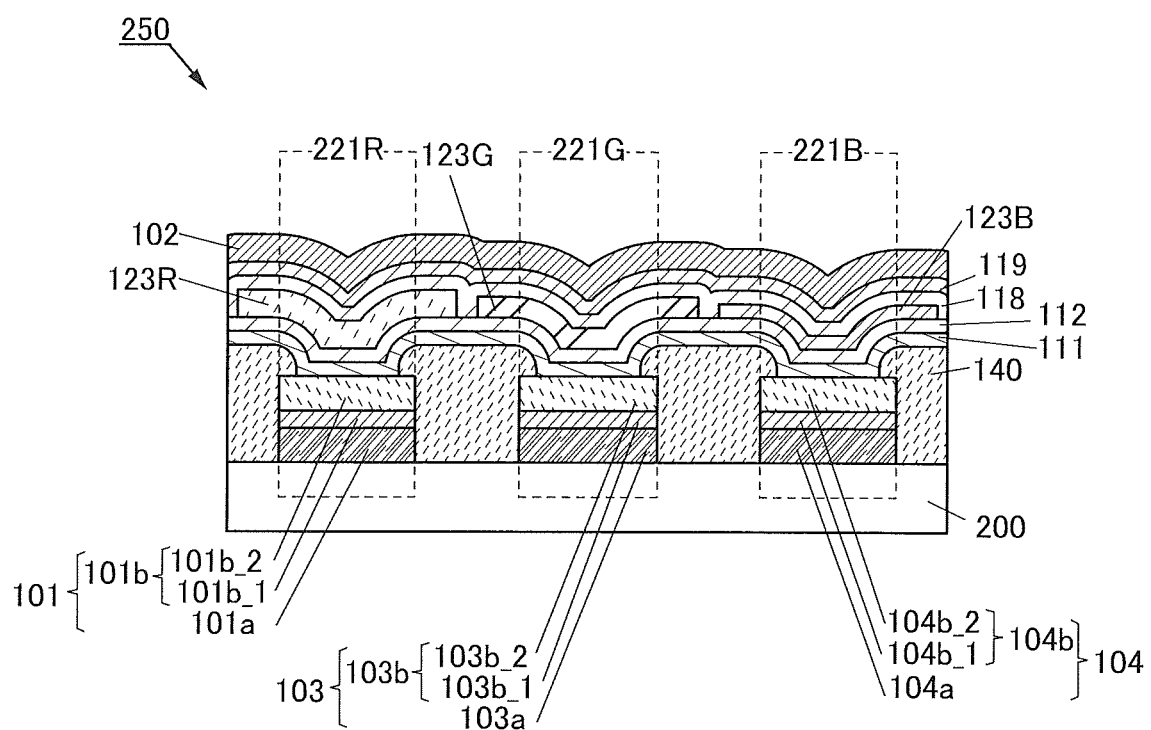
FIG. 4 is a schematic cross-sectional view illustrating a light-emitting element of one embodiment of the present invention.

FIG. 4 is a cross-sectional view illustrating a light-emitting element of one embodiment of the present invention. In FIG. 4, a portion having a function similar to that in FIGS. 1A and 1B, FIGS. 2A and 2B, and FIGS. 3A and 3B is represented by the same hatch pattern as in FIGS. 1A and 1B, FIGS. 2A and 2B, and FIGS. 3A and 3B and not especially denoted by a reference numeral in some cases. In addition, common reference numerals are used for portions having similar functions, and a detailed description of the portions is omitted in some cases.

FIG. 4 illustrates a structure example of a light-emitting element 250 having a structure different from the structures of the light-emitting elements illustrated in FIGS. 1A and 1B, FIGS. 2A and 2B, and FIGS. 3A and 3B. The light-emitting element 250 illustrated in FIG. 4 includes the electrode 101, the electrode 102, an electrode 103, and an electrode 104 over a substrate 200. The electrode 101 includes the conductive layer 101a and the conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The conductive layer 101b includes a transparent conductive layer 101b_1 over and in contact with the conductive layer 101a and a transparent conductive layer 101b_2 over and in contact with the transparent conductive layer 101b_1. The conductive layer 103b includes a transparent conductive layer 103b_1 over and in contact with the conductive layer 103a and a transparent conductive layer 103b_2 over and in contact with the transparent conductive layer 103b_1. The conductive layer 104b includes a transparent conductive layer 104b_1 over and in contact with the conductive layer 104a and a transparent conductive layer 104b_2 over and in contact with the transparent conductive layer 104b_1.

The light-emitting element 250 further includes the hole-injection layer 111, the hole-transport layer 112, a light-emitting layer 123R, the electron-transport layer 118, and the electron-injection layer 119 between the electrode 101 and the electrode 102. The light-emitting element 250 further includes the hole-injection layer 111, the hole-transport layer 112, a light-emitting layer 123G, the electron-transport layer 118, and the electron-injection layer 119 between the electrode 102 and the electrode 103. The light-emitting element 250 further includes the hole-injection layer 111, the hole-transport layer 112, a light-emitting layer 123B, the electron-transport layer 118, and the electron-injection layer 119 between the electrode 102 and the electrode 104.

In FIG. 4, a partition wall 140 is provided between a region 221R sandwiched between the electrode 101 and the electrode 102, a region 221G sandwiched between the electrode 102 and the electrode 103, and a region 221B sandwiched between the electrode 102 and the electrode 104. The partition wall 140 has an insulating property. The partition wall 140 covers end portions of the electrodes 101, 103, and 104 and has openings overlapping with the electrodes. With the partition wall 140, the electrodes provided with the substrate 200 in the regions can be separated into island shapes The light-emitting layers 123R, 123G, and 123B preferably contain light-emitting materials having functions of emitting light of different colors. When the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 250 having such a structure is used in a pixel of a display device, whereby a full-color display device can be fabricated.

The electrodes 101, 103, and 104 can have high conductivity if the electrodes 101, 103, and 104 have the following structures. The transparent conductive layer 101b_1, the transparent conductive layer 103b_1, and the transparent conductive layer 104b_1 each contain an oxide containing In and a stabilizer M (M represents Al, Si, Ti, Ga, Y, Zr, La, Ce, Nd, or Hf). The transparent conductive layer 101b_2, the transparent conductive layer 103b_2, and the transparent conductive layer 104b_2 each contain an oxide containing In. The resistivity of the transparent conductive layer 101b_2 is lower than that of the transparent conductive layer 101b_1 and the thickness of the transparent conductive layer 101b_2 is larger than or equal to that of the transparent conductive layer 101b_1. The resistivity of the transparent conductive layer 103b_2 is lower than that of the transparent conductive layer 103b_1 and the thickness of the transparent conductive layer 103b_2 is larger than or equal to that of the transparent conductive layer 103b_1. The resistivity of the transparent conductive layer 104b_2 is lower than that of the transparent conductive layer 104b_1 and the thickness of the transparent conductive layer 104b_2 is larger than or equal to that of the transparent conductive layer 104b_1. In addition, with such structures, the electrodes 101, 103, and 104 can have high transmittance. Moreover, the electrodes 101, 103, and 104 can be stable and suitable for a light-emitting element.

Materials used for the conductive layers 101a, 103a, and 104a may be different or the same. In the case of using the same materials, manufacturing cost of the light-emitting element 250 can be reduced.

Materials used for the transparent conductive layers 101b_1, 103b_1, and 104b_1 may be different or the same. In the case of using the same materials, manufacturing cost of the light-emitting element 250 can be reduced.

Materials used for the transparent conductive layers 101b_2, 103b_2, and 104b_2 may be different or the same. In the case of using the same materials, manufacturing cost of the light-emitting element 250 can be reduced.

<6. Structure Example 6 of Light-emitting Element>

Next, structure examples different from the light-emitting elements illustrated in FIGS. 1A and 1B, FIGS. 2A and 2B, FIGS. 3A and 3B, and FIG. 4 are described below with reference to FIGS. 5A and 5B.

Figure 5A:
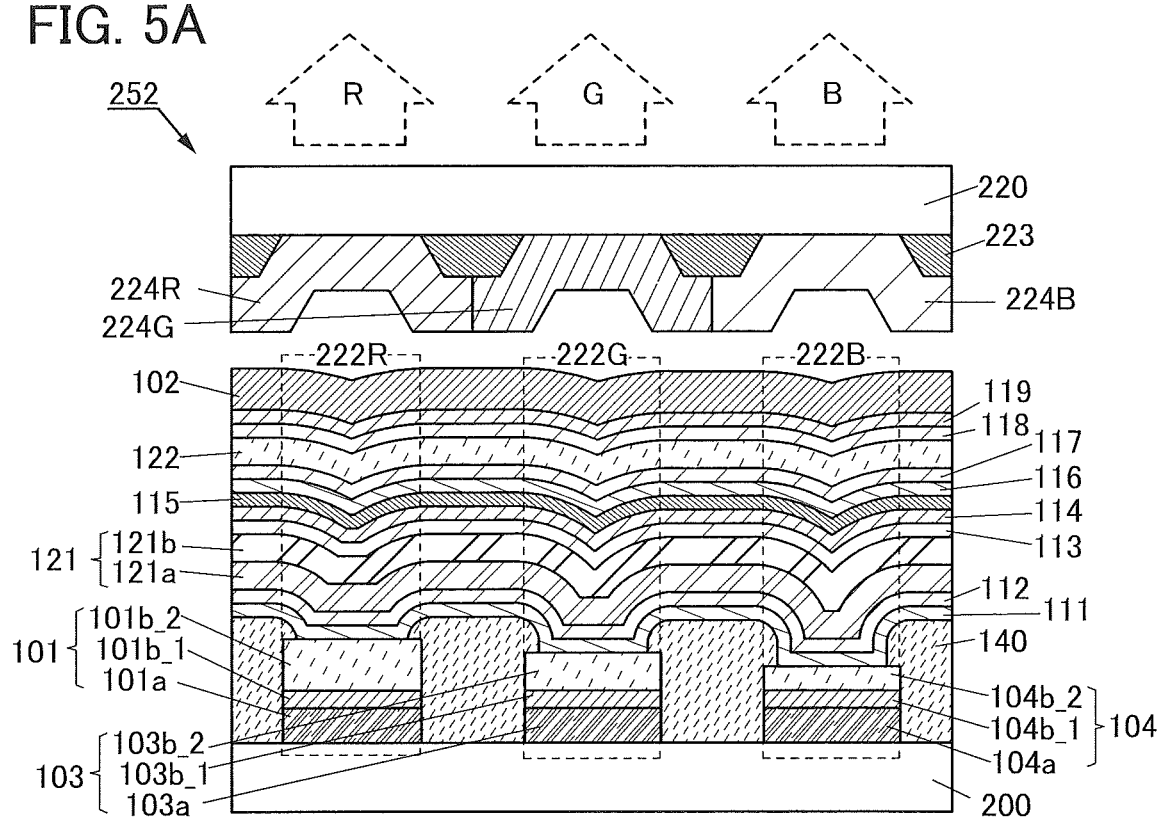
FIGS. 5A and 5B are schematic cross-sectional views each illustrating a light-emitting element of one embodiment of the present invention.
Figure 5B:
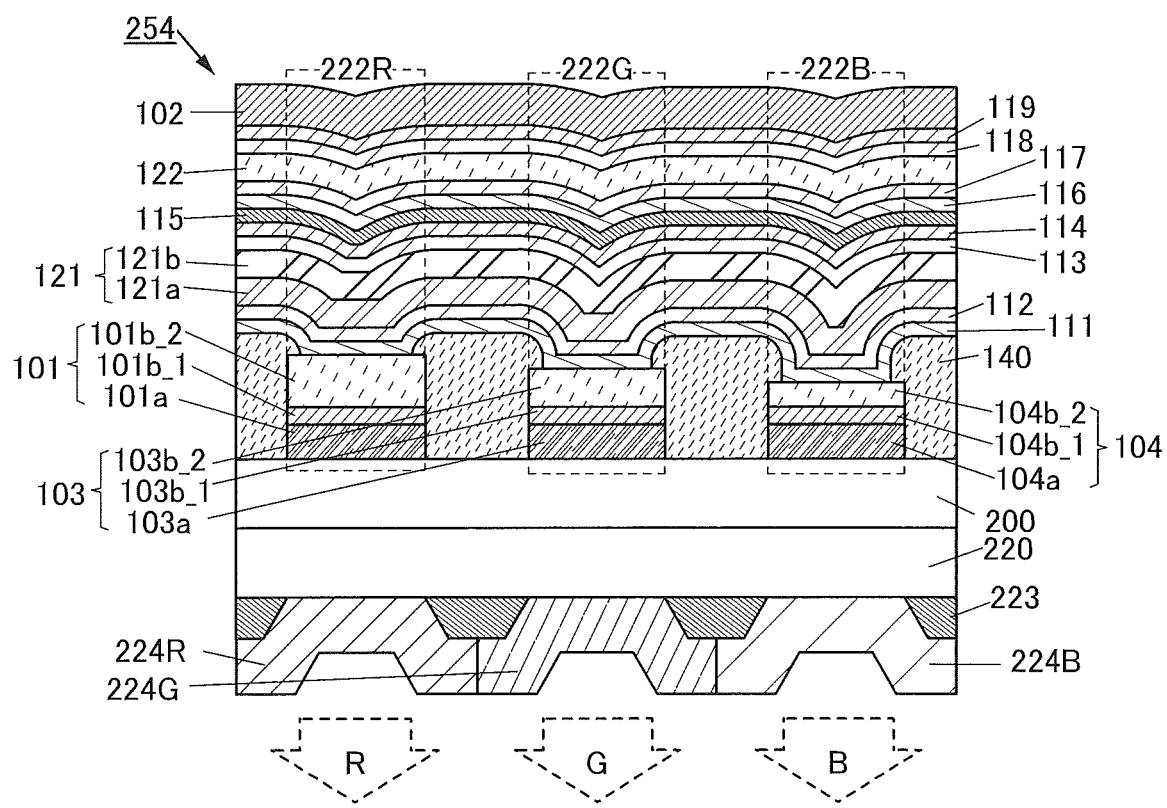

FIGS. 5A and 5B are cross-sectional views illustrating light-emitting elements of one embodiment of the present invention. In FIGS. 5A and 5B, a portion having a function similar to that in FIGS. 1A and 1B, FIGS. 2A and 2B, FIGS. 3A and 3B, and FIG. 4 is represented by the same hatch pattern as in FIGS. 1A and 1B, FIGS. 2A and 2B, FIGS. 3A and 3B, and FIG. 4 and not especially denoted by a reference numeral in some cases. In addition, common reference numerals are used for portions having similar functions, and a detailed description of the portions is omitted in some cases.

FIGS. 5A and 5B each illustrate a structure example of a tandem light-emitting element in which a plurality of light-emitting layers are stacked between a pair of electrodes with the charge-generation layer 115 provided between the light-emitting layers. A light-emitting element 252 illustrated in FIG. 5A has a top-emission structure in which light is extracted in a direction opposite to the substrate 200, and a light-emitting element 254 illustrated in FIG. 5B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 252 and 254 each include the electrode 101, the electrode 102, the electrode 103, and an electrode 104 over the substrate 200. The light-emitting layer 121, the charge-generation layer 115, and the light-emitting layer 122 are included between the electrode 101 and the electrode 102, between the electrode 102 and the electrode 103, and between the electrode 102 and the electrode 104. The hole-injection layer 111, the hole-transport layer 112, the electron-transport layer 113, the electron-injection layer 114, the hole-injection layer 116, the hole-transport layer 117, the electron-transport layer 118, and the electron-injection layer 119 are further included.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The conductive layer 101b includes the transparent conductive layer 101b_1 over and in contact with the conductive layer 101a and the transparent conductive layer 101b_2 over and in contact with the transparent conductive layer 101b_1. The conductive layer 103b includes the transparent conductive layer 103b_1 over and in contact with the conductive layer 103a and the transparent conductive layer 103b_2 over and in contact with the transparent conductive layer 103b_1. The conductive layer 104b includes the transparent conductive layer 104b_1 over and in contact with the conductive layer 104a and the transparent conductive layer 104b_2 over and in contact with the transparent conductive layer 104b_1.

In the light-emitting element 252 illustrated in FIG. 5A and the light-emitting element 254 illustrated in FIG. 5B, a partition wall 140 is provided between a region 222R sandwiched between the electrode 101 and the electrode 102, a region 222G sandwiched between the electrode 102 and the electrode 103, and a region 222B sandwiched between the electrode 102 and the electrode 104. The partition wall 140 has an insulating property. The partition wall 140 covers end portions of the electrodes 101, 103, and 104 and has openings overlapping with the electrodes. With the partition wall 140, the electrodes provided with the substrate 200 in the regions can be separated into island shapes like the electrodes 101, 103, and 104.

The light-emitting elements 252 and 254 each include a substrate 220 provided with an optical element 224R, an optical element 224G, and an optical element 224B in the direction in which light emitted from the region 222R, light emitted from the region 222G, and light emitted from the region 222B are extracted. The light emitted from each region is emitted outside the light-emitting element through each optical element. In other words, the light from the region 222R, the light from the region 222G, and the light from the region 222B are emitted through the optical element 224R, the optical element 224G, and the optical element 224B, respectively.

The optical elements 224R, 224G, and 224B each have a function of selectively transmitting light of a particular color out of incident light. For example, the light emitted from the region 222R through the optical element 224R is red light, the light emitted from the region 222G through the optical element 224G is green light, and the light emitted from the region 222B through the optical element 224B is blue light.

Note that in FIGS. 5A and 5B, red light (R), green light (G), and blue light (B) emitted from the regions through the optical elements are schematically illustrated by arrows of dashed lines. However, the colors of light emitted from these regions are not limited thereto.

A light-blocking layer 223 is provided between the optical elements. The light-blocking layer 223 has a function of blocking light emitted from the adjacent regions. Note that a structure without the light-blocking layer 223 may also be employed.

Furthermore, the light-emitting elements 252 and 254 each have a microcavity structure.

«Microcavity Structure»

Light emitted from the light-emitting layers 121 and 122 resonates between a pair of electrodes (e.g., the lower electrode 101 and the upper electrode 102). In each of the light-emitting elements 252 and 254, the thickness of the transparent conductive layer in each region is adjusted, so that the wavelength of light emitted from the light-emitting layers 121 and 122 can be intensified. Note that the thickness of at least one of the hole-injection layer 111 and the hole-transport layer 112 may differ between the regions so that the wavelength of light emitted from the light-emitting layers 121 and 122 is intensified.

For example, in the case where the refractive index of the conductive layer having a function of reflecting light in the electrodes 101, 102, 103, and 104 is lower than the refractive index of the light-emitting layer 121 or 122, the thicknesses of the transparent conductive layer 101b_1 and the transparent conductive layer 101b_2 of the electrode 101 are adjusted so that the optical path length between the electrode 101 and the electrode 102 is $m_R\lambda_R/2$ ($m_R$ is a natural number and $\lambda_R$ is a wavelength of light which is intensified in the region 222R). Similarly, the thicknesses of the transparent conductive layer 103b_1 and the transparent conductive layer 103b_2 of the electrode 103 are adjusted so that the optical path length between the electrode 103 and the electrode 102 is $m_G\lambda_G/2$ ($m_G$ is a natural number and $\lambda_G$ is a wavelength of light which is intensified in the region 222G). Furthermore, the thicknesses of the transparent conductive layer 104b_1 and the transparent conductive layer 104b_2 of the electrode 104 are adjusted so that the optical path length between the electrode 104 and the electrode 102 is $m_B\lambda_B/2$ ($m_B$ is a natural number and $\lambda_B$ is a wavelength of light which is intensified in the region 222B).

In the above manner, with the microcavity structure, in which the optical path length between the electrodes in the respective regions is adjusted, scattering and absorption of light in the vicinity of the electrodes can be suppressed, resulting in high light extraction efficiency.

Note that since the light-emitting element 252 illustrated in FIG. 5A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 254 illustrated in FIG. 5B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

The light-emitting layers 121 and 122 can each have a stacked-layer structure of two layers, for example, the light-emitting layer 121a and the light-emitting layer 121b. Two kinds of light-emitting materials (the first compound and the second compound) having functions of emitting light of different colors are used for the two light-emitting layers, so that light of a plurality of emission colors can be obtained at the same time. It is particularly preferable to select light-emitting materials so that white light can be obtained by combining light emission from the light-emitting layers 121 and 122.

The light-emitting layer 121 or 122 may have a structure in which three or more layers are stacked or may include a layer having no light-emitting material.

The electrodes 101, 103, and 104 can have high conductivity if the electrodes 101, 103, and 104 have the following structures. The transparent conductive layer 101b_1, the transparent conductive layer 103b_1, and the transparent conductive layer 104b_1 each contain an oxide containing In and a stabilizer M (M represents Al, Si, Ti, Ga, Y, Zr, La, Ce, Nd, or Hf). The transparent conductive layer 101b_2, the transparent conductive layer 103b_2, and the transparent conductive layer 104b_2 each contain an oxide containing In. The resistivity of the transparent conductive layer 101b_2 is lower than that of the transparent conductive layer 101b_1 and the thickness of the transparent conductive layer 101b_2 is larger than or equal to that of the transparent conductive layer 101b_1. The resistivity of the transparent conductive layer 103b_2 is lower than that of the transparent conductive layer 103b_1 and the thickness of the transparent conductive layer 103b_2 is larger than or equal to that of the transparent conductive layer 103b_1. The resistivity of the transparent conductive layer 104b_2 is lower than that of the transparent conductive layer 104b_1 and the thickness of the transparent conductive layer 104b_2 is larger than or equal to that of the transparent conductive layer 104b_1. In addition, with such structures, the electrodes 101, 103, and 104 can have high transmittance. Moreover, the electrodes 101, 103, and 104 can be stable and suitable for a light-emitting element.

In each of the light-emitting elements 252 and 254, materials used for the conductive layers 101a, 103a, and 104a may be different or the same. In the case of using the same materials, manufacturing cost of the light-emitting element 250 can be reduced.

Materials used for the transparent conductive layers 101b_1, 103b_1, and 104b_1 may be different or the same. In the case of using the same materials, manufacturing cost of the light-emitting element 250 can be reduced. Alternatively, in the case of using different materials, the electrodes 101, 103, and 104 can differ in a property of electron or hole injection to the EL layer.

Materials used for the transparent conductive layers 101b_2, 103b_2, and 104b_2 may be different or the same. In the case of using the same materials, manufacturing cost of the light-emitting element 250 can be reduced. Alternatively, in the case of using the different materials, the electrodes 101, 103, and 104 can differ in a property of electron or hole injection to the EL layer. In particular, in the case where a material having a relatively low work function and a low hole-injection property among them is used for the transparent conductive layers, a region in which holes injected from the anode and electrons injected from the cathode to the EL layer are recombined is distributed relatively on the anode side at a high density. In contrast, in the case where a material having a relatively high work function and a high hole-injection property is used for the transparent conductive layers, a region in which holes and electrons are recombined (a recombination region) is distributed relatively on the cathode side at a high density. For example, in the case where the light-emitting layer 121 includes a plurality of layers (the light-emitting layers 121a and 121b) as in FIGS. 5A and 5B, the ratio between the intensity of light emitted from the light-emitting layer 121a and the intensity of light emitted from the light-emitting layer 121b is changed when an electron or hole injection property is changed and the region in the light-emitting layer 121 in which holes and electrons are recombined (the recombination region) is changed. Therefore, in the case where light of a different color is emitted from each of the light-emitting layers 121a and 121b, the shapes of spectra of light extracted from the whole light-emitting element (the relative intensity ratio of wavelength components) are changed, that is, the color of light emitted from the light-emitting element 252 or 254 can be controlled. For example, the transparent conductive layers 101b_2 and 103b_2 are different in structure so that the regions 222R and 222G differ in a property of electron or hole injection, whereby light emitted from the region 222R and light emitted from the region 222G have colors different from one another.

Furthermore, the optical path lengths in the regions 222R, 222G, and 222B in the above microcavity structure are adjusted to differ from one another, so that an emission color of light from the region 222R, an emission color of light from the region 222G, and an emission color of light from the region 222B are different from one another. In other words, a difference between the electrode 101, the electrode 103, and the electrode 104 in structure enables light emitted from the regions 222R, 222G, and 222B to have colors different from one another in each of the light-emitting elements 252 and 254.

Note that in each of the light-emitting elements 252 and 254, a property of electron or hole injection from the electrode 101 to the EL layer may be made different from those from the electrodes 103 and 104 to the EL layer in such a manner that the transparent conductive layers 101b_2, 103b_2, and 104b_2 are formed using the same materials under different film formation processes. For example, pressure, film formation gas (e.g., oxygen, argon, or a mixed gas including oxygen), film formation energy, a temperature at film formation, a distance between a target and the substrate in a film formation chamber at film formation, a temperature or surface treatment after the film formation, or the like may be changed between the transparent conductive layers 101b_2, 103b_2, and 104b 2 so that the transparent conductive layers have different properties, whereby properties of electron or hole injection from the transparent conductive layers to the EL layer may be made different from each other. In addition, when the transparent conductive layers 101b_2, 103b_2, and 104b_2 include the same element at different percentages, the materials used for the transparent conductive layers 101b_2, 103b_2, and 104b_2 can be different from one another.

Note that in the case where the electrodes 101, 103, and 104 are different in structure, not all of the three electrodes need to be different from one another as long as at least one electrode is different from the other electrodes. For example, the electrodes 103 and 104 are the same and different from the electrode 101 in structure.

As described above, for example, when the light-emitting element 252 or 254 including the regions 222R, 222G, and 222B emitting light of different colors is used for a pixel of a display device, light of different emission colors can be extracted from subpixels in the pixel without depositing the EL layers side by side. Thus, a display device having high light use efficiency can be manufactured easily. In other words, a display device including the light-emitting element 252 or 254 can have low power consumption. Moreover, manufacturing cost of the display device including the light-emitting element 252 or 254 can be reduced. In addition, layout limitation by a space (margin) required in depositing the EL layers side by side is not caused; therefore, a display device can be easily manufactured with high layout flexibility.

<7. Components of Light-emitting Element>

Components of the light-emitting elements illustrated in FIGS. 1A and 1B, FIGS. 2A and 2B, FIGS. 3A and 3B, FIG. 4, and FIGS. 5A and 5B are described in detail below.

«Substrate»

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting elements or a display device. Another material having a function of protecting the light-emitting elements or the optical elements may be used.

Note that in this specification and the like, a light-emitting element or a transistor can be formed using any of a variety of substrates, for example. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate such that the light-emitting element and the transistor is provided directly on the flexible substrate. Further alternatively, a separation layer may be provided between the substrate and the transistor or the substrate and the light-emitting element. The separation layer can be used when part or the whole of a display device formed over the separation layer is separated from the substrate and transferred onto another substrate. In such a case, the light-emitting element and the transistor can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element and the transistor are formed using a substrate, the light-emitting element and the transistor may be transferred to another substrate. Example of the substrate to which the light-emitting element and the transistor are transferred are, in addition to the above substrate over which the light-emitting element and the transistor can be formed, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a transistor with excellent properties or a transistor with low power consumption can be formed, a display device with high durability can be formed, high heat resistance can be provided, or reduction in weight or thickness can be achieved.

«Pair of Electrodes»

The electrodes 101, 103, and 104 each function as an anode or a cathode of the light-emitting element. Although the conductive layer 101a, the conductive layer 101b, the transparent conductive layer 101b_1, and the transparent conductive layer 101b_2 that are included in the electrode 101 are described below, similar structures and materials to those of the above layers can be used for the conductive layer 103a, the conductive layer 103b, the transparent conductive layer 103b_1, and the transparent conductive layer 103b_2 that are included in the electrode 103, and for the conductive layer 104a, the conductive layer 104b, the transparent conductive layer 104b_1, and the transparent conductive layer 104b_2 that are included in the electrode 104.

The conductive layer 101a of the electrode 101 is preferably formed using a conductive material having a function of reflecting light. Examples of the conductive material include Al, an alloy containing Al, and the like. Examples of the alloy containing Al include an alloy containing Al and L (L represents one or more of Ti, Nd, nickel (Ni), and La), and the like. Aluminum has low resistance and high light reflectance. Aluminum is included in earth's crust in large amount and is inexpensive; therefore, it is possible to reduce costs for manufacturing a light-emitting element with aluminum. Alternatively, Ag, an alloy of Ag and N (N represents one or more of Y, Nd, Mg, Al, Ti, Ga, Zn, In, tungsten (W), manganese (Mn), Sn, iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, and the like. Note that in the case where light is extracted through the electrode 101, it is preferable that the conductive layer 101a be formed of a thin film having a thickness that allows transmission of light (preferably, approximately greater than or equal to 5 nm and less than or equal to 30 nm) using a metal exemplified as the above conductive material and have functions of reflecting light and transmitting light.

Furthermore, the transparent conductive layer 101b_1 of the electrode 101 is preferably formed using an oxide including In and the stabilizer M (M represents Al, Si, Ti, Ga, Y, Zr, Sn, La, Ce, Nd, or Hf). With such a structure, it is possible to suppress donation and acceptance of electrons or oxygen between the conductive layer 101b and the conductive layer 101a. Therefore, electrolytic corrosion of the electrode 101 can be prevented, resulting in lower drive voltage of the light-emitting element.

An electrode with high conductivity can be formed if the transparent conductive layer 101b_2 contains an oxide containing In, the resistivity of the transparent conductive layer 101b_2 is lower than that of the transparent conductive layer 101b_1, and the thickness of the transparent conductive layer 101b_2 is larger than or equal to the transparent conductive layer 101b_1. In addition, with such a structure, an electrode with high transmittance can be formed. Moreover, an electrode which is stable and suitable for a light-emitting element can be formed. Note that the thickness of the transparent conductive layer 101b_1 is preferably 5 nm or more and 20 nm or less.

As another example of the stabilizer M, one or plural kinds of lanthanoid such as praseodymium (Pr), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

The transparent conductive layer 101b_1 may include a metal element other than In and the stabilizer M. A material containing zinc (Zn) or zinc oxide is particularly preferable because a film with a uniform thickness can be formed. In other words, an oxide including In, the stabilizer M, and Zn is preferably used for the transparent conductive layer 101b_1.

As an oxide included in the transparent conductive layer 101b_1, any of the followings can be used, for example: an In—Ga—Zn-based oxide, an In—Al—Zn-based oxide, an In—Si—Zn-based oxide, an In—Ti—Zn-based oxide, an In—Ti—Y-based oxide, an In—Zr—Zn-based oxide, an In—Sn—Zn-based oxide, an In—La—Zn-based oxide, an In—Ce—Zn-based oxide, an In—Nd—Zn-based oxide, an In—Hf—Zn-based oxide, an In—Pr—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

In the case where the transparent conductive layer 101$b$_1 is an In-M-Zn oxide, as a sputtering target used for forming the In-M-Zn oxide, it is preferable to use an In—Ga—Zn-based oxide having an atomic ratio of In:Ga:Zn=1:1:1, In:Ga:Zn=1:3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, In:Ga:Zn=1:6:10, In:Ga:Zn=1:9:4, In:Ga:Zn=1:1:4, In:Ga:Zn=5:5:6, In:Ga:Zn=3:1:2, In:Ga:Zn=2:1:3, or In:Ga:Zn=4:2:4.1, or an oxide whose composition is in the neighborhood of the above composition. Note that the atomic ratio of metal elements in the transparent conductive layer 101$b$_1 formed using the above sputtering target varies from the above atomic ratio of metal elements of the sputtering target within a range of ±20% as an error.

The transparent conductive layer 101$b$_1 can be formed by a sputtering method, a molecular beam epitaxy (MBE) method, a chemical vapor deposition (CVD) method, a pulsed laser deposition (PLD) method, an atomic layer deposition (ALD) method, or the like as appropriate.

In the case where the transparent conductive layer 101$b$_1 of the electrode 101, the transparent conductive layer 103$b$_1 of the electrode 103, and the transparent conductive layer 104$b$_1 of the electrode 104 are formed using different materials, a property of electron or hole injection to the EL layer is different between the electrode 101, the electrode 103, and the electrode 104.

The transparent conductive layer 101$b$_2 of the electrode 101 can have a function of adjusting the optical path length so that desired light emitted from each light-emitting layer resonates and its wavelength can be amplified.

The transparent conductive layer 101$b$_2 can be formed using, for example, indium tin oxide (hereinafter, referred to as ITO), indium tin oxide containing silicon or silicon oxide (ITSO), indium oxide-zinc oxide (indium zinc oxide), indium oxide containing tungsten oxide and zinc oxide, or the like. In particular, in the case where the electrode 101 is used as an anode, the transparent conductive layer 101$b$_2 is preferably formed using a material having a high work function (higher than or equal to 4.0 eV). The transparent conductive layer 101$b$_2 can be formed by a sputtering method, an evaporation method, a printing method, a coating method, or the like.

In this specification and the like, a transparent conductive layer transmits visible light and has conductivity. Examples of the transparent conductive layer include, in addition to the above-described oxide conductor layer typified by an ITO, an oxide semiconductor layer and an organic conductor layer containing an organic substance. Examples of the organic conductor layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1\times10^5$ Ω·cm, further preferably lower than or equal to $1\times10^4$ Ω·cm.

Note that in the case where a field-effect transistor (FET) is formed in addition to the light-emitting element, an oxide semiconductor layer used for a channel region of the transistor and the transparent conductive layer 101$b$_1 of the electrode 101 preferably include the same elements. In other words, the oxide semiconductor layer used for the channel region of the transistor preferably includes In and the stabilizer M (M represents Al, Si, Ti, Ga, Y, Zr, La, Ce, Nd, or Hf). In addition, it is particularly preferable to use the same materials for the oxide semiconductor layer and the transparent conductive layer 101$b$_1. The use of common materials for the oxide semiconductor layer and the transparent conductive layer 101$b$_1 does not increase the kind of deposition materials; thus, the manufacturing cost can be reduced. In such a case, different film formation processes are used for the oxide semiconductor layer and the transparent conductive layer 101$b$_1. In other words, pressure, film formation gas (e.g., oxygen, argon, or a mixed gas including oxygen), film formation energy, a temperature at film formation, a distance between a target and the substrate in a film formation chamber at film formation, a temperature or surface treatment after the film formation, or the like can be changed between the oxide semiconductor layer and the transparent conductive layer so that the oxide semiconductor layer and the transparent conductive layer have different properties, so that the oxide semiconductor layer and the transparent conductive layer each have a different function. Note that a "semiconductor" or "semiconductor layer" includes characteristics of a "conductor" or "conductive layer" in some cases when the conductivity is sufficiently high, for example. Further, it is difficult to strictly distinguish a "semiconductor" and a "conductor" or a "semiconductor layer" and a "conductive layer" from each other in some cases because a border between them is not clear. Accordingly, a "semiconductor" in this specification and the like can be called a "conductor" and a "semiconductor layer" in this specification and the like can be called a "conductor layer" in some cases.

An oxide semiconductor is a semiconductor material whose resistance can be controlled by oxygen vacancy in the film of the semiconductor material and/or the concentration of impurities such as hydrogen or water in the film of the semiconductor material. Thus, treatment to be performed on the oxide semiconductor layer and the transparent conductive layer 101$b$_1 is selected from the following to control the resistivity of each of the oxide semiconductor layer and the transparent conductive layer 101$b$_1 formed with the same materials: treatment for increasing oxygen vacancy and/or impurity concentration and treatment for reducing oxygen vacancy and/or impurity concentration.

Specifically, plasma treatment is performed on the transparent conductive layer 101$b$_1 functioning as part of the pixel electrode to increase oxygen vacancy and/or impurities such as hydrogen or water in the transparent conductive layer 101$b$_1, so that an oxide semiconductor layer with a higher carrier density and a lower resistance can be obtained. Furthermore, an insulating layer containing hydrogen is formed in contact with the transparent conductive layer 101$b$_1 to diffuse hydrogen from the insulating layer containing hydrogen to the transparent conductive layer

101b_1, so that the transparent conductive layer 101b_1 can be an oxide semiconductor layer with a higher carrier density and a lower resistance.

In contrast, an insulating layer is preferably provided over the oxide semiconductor layer used for the channel region of the transistor to prevent the oxide semiconductor layer from being subjected to the plasma treatment. Since the insulating layer is provided, the oxide semiconductor layer is not in contact with the insulating layer containing hydrogen, which is in contact with the transparent conductive layer 101b_1. An insulating layer capable of releasing oxygen is provided over the oxide semiconductor layer, whereby oxygen can be supplied to the oxide semiconductor layer. The oxide semiconductor layer to which oxygen is supplied is a high-resistance oxide semiconductor in which oxygen vacancy in the film or at the interface is filled. Note that as the insulating layer capable of releasing oxygen, a silicon oxide film or a silicon oxynitride film can be used, for example.

As the plasma treatment to be performed on the transparent conductive layer 101b_1, plasma treatment using a gas containing one of a rare gas (He, Ne, Ar, Kr, or Xe), hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, oxygen vacancy is formed in a lattice from which oxygen is released (or in a portion from which oxygen is released) in the transparent conductive layer 101b_. This oxygen vacancy can cause carrier generation. Further, when hydrogen is supplied from an insulating film that is in the vicinity of the transparent conductive layer 101b_1, specifically, that is in contact with the lower surface or the upper surface of the transparent conductive layer 101b_1, and hydrogen is combined with the oxygen vacancy, an electron serving as a carrier might be generated. Accordingly, the transparent conductive layer 101b_1 whose oxygen vacancy is increased by the plasma treatment has higher carrier density than the oxide semiconductor layer.

The insulating layer containing hydrogen, that is, a layer capable of releasing hydrogen is formed in contact with the transparent conductive layer 101b_1, whereby hydrogen can be supplied to the transparent conductive layer 101b_1. The layer capable of releasing hydrogen preferably has a concentration of hydrogen of $1\times10^{22}$ atoms/cm$^3$ or higher. Such a layer is formed in contact with the transparent conductive layer 101b_1, whereby hydrogen can be effectively contained in the transparent conductive layer 101b_1. In this manner, the above plasma treatment is performed and the structure of the layer in contact with the transparent conductive layer 101b_1 is changed, whereby the resistance of the transparent conductive layer 101b_1 can be appropriately adjusted.

The oxide semiconductor layer in which oxygen vacancy is filled with oxygen and the concentration of hydrogen is reduced can be referred to as a highly purified intrinsic or substantially highly purified intrinsic oxide semiconductor layer. The term "substantially intrinsic" refers to the state where an oxide semiconductor layer has a carrier density lower than $8\times10^{11}$/cm$^3$, preferably lower than $1\times10^{11}$/cm$^3$ and further preferably lower than $1\times10^{10}$/cm$^3$, and is higher than or equal to $1\times10^{-9}$/cm$^3$. A highly purified intrinsic or substantially highly purified intrinsic oxide semiconductor has few carrier generation sources, and thus has a low carrier density. The highly purified intrinsic or substantially highly purified intrinsic oxide semiconductor layer has a low density of defect states and accordingly can have a low density of trap states.

Furthermore, the highly purified intrinsic or substantially highly purified intrinsic oxide semiconductor layer has an extremely low off-state current; even when an element has a channel width W of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Accordingly, the transistor in which the channel region is formed in the oxide semiconductor layer can have a small variation in electrical characteristics and high reliability.

Hydrogen contained in the transparent conductive layer 101b_1 reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transparent conductive layer 101b_containing hydrogen has a higher carrier density than the oxide semiconductor layer.

In other words, the transparent conductive layer 101b_1 functioning as part of the electrode 101 is a low-resistance oxide layer that has a high concentration of hydrogen and/or a large amount of oxygen vacancy as compared with the oxide semiconductor layer including the channel region of the transistor.

Hydrogen in the oxide semiconductor layer of the transistor in which a channel region is formed is preferably reduced as much as possible. Specifically, in the oxide semiconductor layer, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

It is preferable to perform heat treatment after the oxide semiconductor layer used for the channel region of the transistor is formed. The heat treatment is preferably performed at a temperature higher than or equal to 250° C. and lower than or equal to 650° C., preferably higher than or equal to 300° C. and lower than or equal to 400° C. and further preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here allows impurities such as hydrogen and water to be removed from the oxide semiconductor layer. Note that the heat treatment may be performed before the oxide semiconductor layer is processed into an island shape.

Note that stable electrical characteristics can be effectively imparted to a transistor in which an oxide semiconductor serves as a channel by reducing the concentration of impurities in the oxide semiconductor to make the oxide semiconductor intrinsic or substantially intrinsic.

The thickness of the oxide semiconductor layer is greater than or equal to 3 nm and less than or equal to 200 nm, preferably greater than or equal to 3 nm and less than or equal to 100 nm and further preferably greater than or equal to 3 nm and less than or equal to 50 nm.

The oxide semiconductor layer in which the amount of the stabilizer M is larger than or equal to the amount of In in an atomic ratio may have any of the following effects: (1) the energy gap of the oxide semiconductor layer is widened; (2) the electron affinity of the oxide semiconductor layer decreases; (3) an impurity from the outside is blocked; and (4) an insulating property increases. Furthermore, oxygen vacancy is less likely to be generated in the oxide semiconductor layer containing the amount of the stabilizer M larger than or equal to the amount of In in an atomic ratio because the stabilizer M is a metal element which is strongly bonded to oxygen.

Note that, without limitation to those described above, a material with an appropriate composition may be used for the oxide semiconductor layer depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor layer be set to be appropriate.

The electrode 102 functions as an anode or a cathode of each light-emitting element. Note that in the case where the electrode 101 has a function of reflecting light, the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used. The electrode 102 may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. In the case where the electrode 101 has a function of transmitting light, the electrode 102 is preferably formed using a conductive material having a function of reflecting light.

The electrode 102 can be formed using one or more kinds of conductive metals and alloys, conductive compounds, and the like. For example, ITO, ITSO, indium oxide-zinc oxide (indium zinc oxide), indium oxide-tin oxide containing titanium, indium titanium oxide, indium oxide containing tungsten oxide and zinc oxide, or the like can be used. A metal thin film having a thickness that allows transmission of light (preferably, approximately greater than or equal to 5 nm and less than or equal to 30 ran) can also be used. As the metal, for example, Ag, an alloy of Ag and Al, an alloy of Ag and Mg, an alloy of Ag and Au, an alloy of Ag and Yb, or the like can be used. Particularly when the electrode 102 functions as a cathode, a material containing at least one metal element selected from In, Ag, and Mg is preferably used. In addition, it is preferable to use a material having a low work function (3.8 eV or less). The examples include an element belonging to Group 1 or 2 of the periodic table (e.g., an alkali metal such as lithium or cesium, an alkaline earth metal such as calcium or strontium, or magnesium), an alloy containing any of these elements (e.g., Ag—Mg or Al—Li), a rare earth metal such as europium or ytterbium, an alloy containing any of these rare earth metals, an alloy containing aluminum and silver, and the like. The electrode 102 can be formed by a sputtering method, an evaporation method, a printing method, a coating method, or the like.

«Light-emitting Layer»

The light-emitting layers 120, 121, and 122 each contain a light-emitting material serving as a first compound that has a function of emitting light of at least one of violet, blue, and blue green or a light-emitting material serving as a second compound that has a function of emitting light of at least one of green, yellow green, yellow, orange, and red. Each light-emitting layer contains either or both of an electron-transport material and a hole-transport material in addition to the light-emitting material serving as the first compound or the light-emitting material serving as the second compound.

As the first compound and the second compound, any of light-emitting substances that convert singlet excitation energy into light emission and light-emitting substances that convert triplet excitation energy into light emission can be used. Examples of the above-described light-emitting substance are given below.

Examples of the light-emitting substance that converts singlet excitation energy into light emission include substances that emit fluorescence. For example, any of the following substances having an anthracene skeleton, a tetracene skeleton, a chrysene skeleton, a phenanthrene skeleton, a pyrene skeleton, a perylene skeleton, a stilbene skeleton, an acridone skeleton, a coumarin skeleton, a phenoxazine skeleton, a phenothiazine skeleton, or the like can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-diphenyl-N,N'-bis[4-(9-phenyl-9H-fluoren-9-yl)phenyl] pyrene-1,6-diamine (abbreviation: 1,6FLPAPrn), N,N'-bis (3-methylphenyl)-N,N'-bis[3-(9-phenyl-9H-fluoren-9-yl) phenyl]-pyrene-1,6-diamine (abbreviation: 1,6mMemFLPAPrn), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl) phenyl]-N,N',N'-triphenyl-1,4-phenylenediamine (abbreviation: 2DPAPPA), N,N,N',N',N'',N'',N''',N'''-octaphenyldibenzo[g,p]clrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-(9,10-diphenyl-2-anthryl)-N,N',N'-triphenyl-1,4-phenylenediamine (abbreviation: 2DPAPA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

Examples of the light-emitting substance that converts triplet excitation energy into light emission include substances that emit phosphorescence.

Examples of the substance that has an emission peak in the blue or green wavelength range include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complex having a 4H-triazole skeleton has high reliability and high emission efficiency and is thus especially preferable.

Examples of the substance that has an emission peak in the green or yellow wavelength range include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III)acetylacetonate (abbreviation: Ir(dpo)$_2$(acac)), bis{2-[4'-(perfluorophenyl)phenyl]pyridinato-N,C$^{2'}$}iridium(III)acetylacetonate (abbreviation: Ir(p-PF-ph)$_2$(acac)), and bis(2-phenylbenzothiazolato-N,C$^{2'}$)iridium(III)acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complex having a pyrimidine skeleton has distinctively high reliability and emission efficiency and is thus particularly preferable.

Examples of the substance that has an emission peak in the yellow or red wavelength range include organometallic iridium complexes having pyrimidine skeletons, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium (III) (abbreviation: Eu(DBM)$_3$(Phen)) and tris[1-(2-thenoyl)-3,3,3-trifluoroacetonato](monophenanthroline)europium (III) (abbreviation: Eu(TTA)$_3$(Phen)). Among the materials given above, the organometallic iridium complex having a pyrimidine skeleton has distinctively high reliability and emission efficiency and is thus particularly preferable. Further, the organometallic iridium complexes having pyrazine skeletons can provide red light emission with favorable chromaticity.

Although there is no particular limitation on a material that can be used as a host material of the light-emitting layer, for example, any of the following substances can be used for the host material: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: Bphen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-Carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and the like. One or more substances having a wider energy gap than the above-described light-emitting material is preferably selected from these substances and a variety of substances. Moreover, in the case where the light-emitting substance emits phosphorescence, a substance having triplet excitation energy (energy difference between a ground state and a triplet excited state) which is higher than that of the light-emitting substance is preferably selected as the host material.

In the case where a plurality of materials are used as the host material of the light-emitting layer, it is preferable to use a combination of two kinds of compounds which form an exciplex. In this case, a variety of carrier-transport materials can be used as appropriate. In order to form an exciplex efficiently, it is particularly preferable to combine a compound which easily accepts electrons (a material having an electron-transport property) and a compound which easily accepts holes (a material having a hole-transport property).

This is because in the case where the combination of a material having an electron-transport property and a material having a hole-transport property which form an exciplex is used as a host material, the carrier balance between holes and electrons in the light-emitting layer can be easily optimized by adjustment of the mixture ratio of the material having an electron-transport property and the material having a hole-transport property. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the compound which easily accepts electrons (the material having an electron-transport property), a π-electron deficient heteroaromatic compound such as a nitrogen-containing heteroaromatic compound, a metal complex, or the like can be used. Specific examples include metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having azole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); a heterocyclic compound having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); and heterocyclic compounds having pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a reduction in drive voltage.

As the compound which easily accepts holes (the material having a hole-transport property), a π-electron rich heteroaromatic compound (e.g., a carbazole derivative or an indole derivative), an aromatic amine compound, or the like can be favorably used. Specific examples include compounds having aromatic amine skeletons, such as 2-[N-(9-phenylcarbazol-3-yl)-N-phenylamino]spiro-9,9'-bifluorene (abbreviation: PCASF), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), N,N'-bis{4-[bis(3-methylphenyl)amino]phenyl}-N,N'-diphenyl-(1,1'-biphenyl)-4,4'-diamine (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), N-(4-biphenyl)-N-(9,9-dimethyl-9H-fluoren-2-yl)-9-phenyl-9H-carbazol-3-amine (abbreviation: PCBiF), and N-(1,1'-biphenyl-4-yl)-N-[4-(9-phenyl-9H-carbazol-3-yl)phenyl]-9,9-dimethyl-9H-fluoren-2-amine (abbreviation: PCBBiF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 9-phenyl-9H-3-(9-phenyl-9H-carbazol-3-yl)carbazole (abbreviation: PCCP); compounds having thiophene skeletons, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above-described materials, compounds having aromatic amine skeletons and compounds having carbazole skeletons are preferable because these compounds are highly reliable and have high hole-transport properties to contribute to a reduction in drive voltage.

Note that the combination of the materials which form an exciplex and is used as a host material is not limited to the above-described compounds, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other materials may be used.

As the light-emitting material or host material of the light-emitting layer, a thermally activated delayed fluorescent (TADF) substance may be used. The thermally activated delayed fluorescent substance is a material having a small difference between the level of the triplet excitation energy and the level of the singlet excitation energy and a function of converting triplet excitation energy into singlet excitation energy by reverse intersystem crossing.

The thermally activated delayed fluorescent substance may be composed of one kind of material or a plurality of materials. For example, in the case where the thermally activated delayed fluorescent substance is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae.

[Chemical Formulae 1]
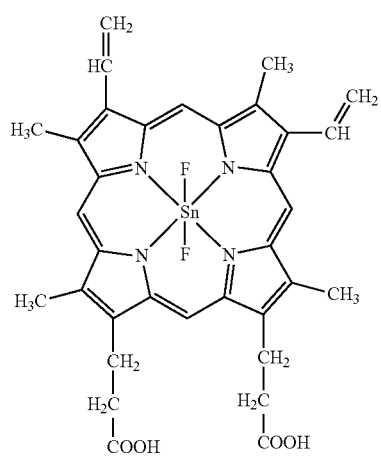
SnF₂(Proto IX)
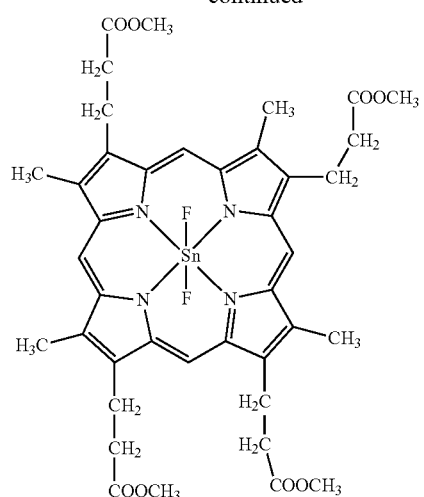
SnF₂(Copro III-4Me)
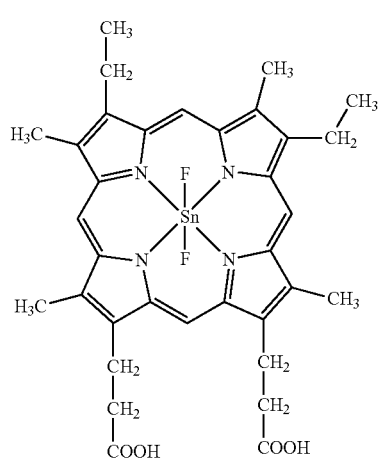
SnF₂(Meso IX)
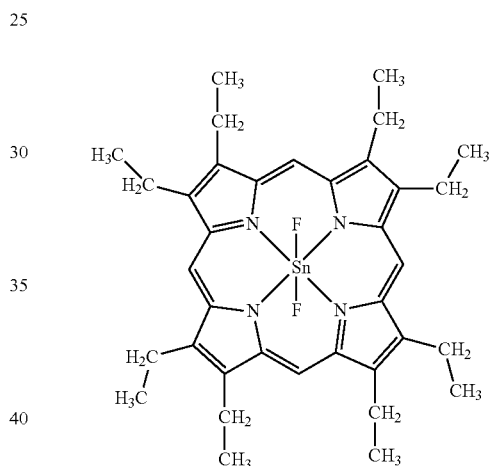
SnF₂(OEP)
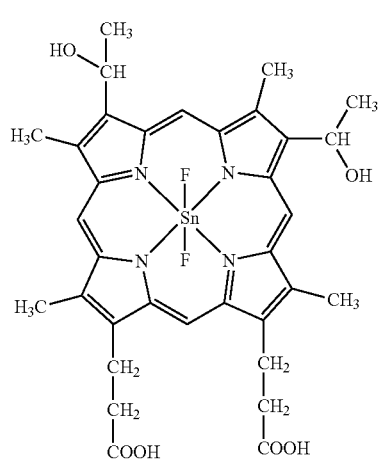
SnF₂(Hemato IX)
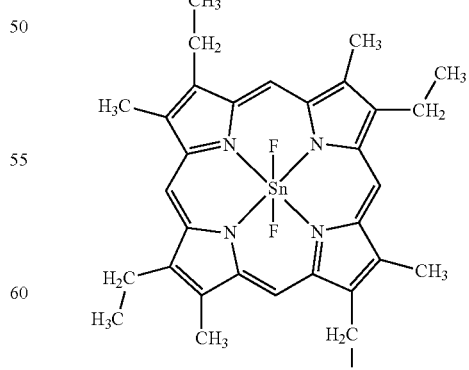
SnF₂(Etio I)

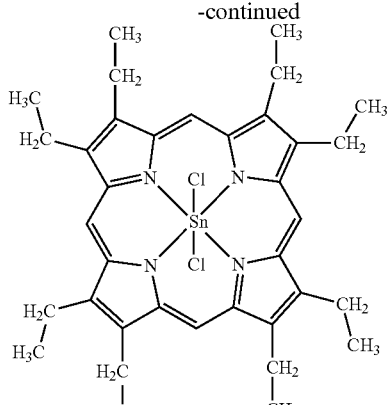

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) shown in the following structural formulae, can be used as the thermally activated delayed fluorescent substance composed of one kind of material. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excitation energy and the level of the triplet excitation energy becomes small.

[Chemical Formulae 2]

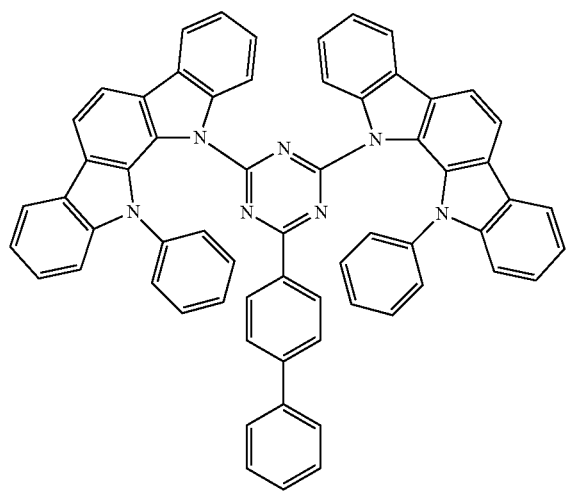

PIC—TRZ

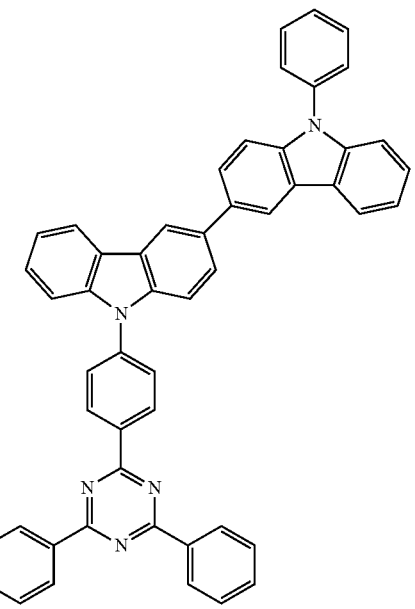

PCCzPTzn

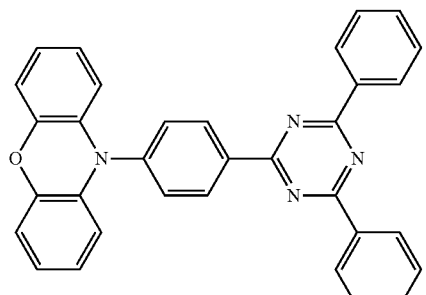

PXZ—TRZ

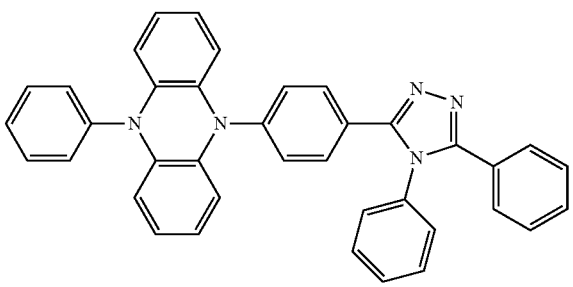

PPZ—3TPT

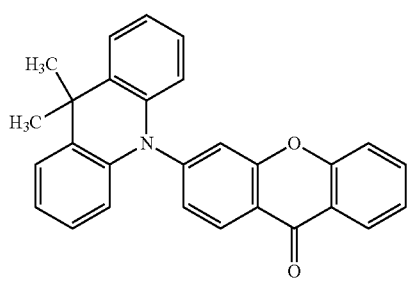

ACRXTN

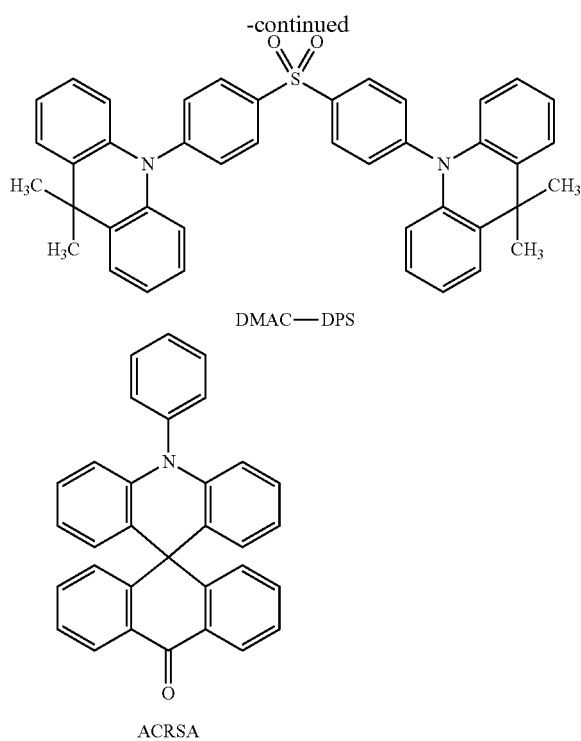

DMAC—DPS

ACRSA

In the case where the thermally activated delayed fluorescent substance is used as the host material, it is preferable to use a combination of two kinds of compounds which form an exciplex. In this case, it is particularly preferable to use the above-described combination of a compound which easily accepts electrons and a compound which easily accepts holes, which forms an exciplex.

«Hole-injection Layer»

The hole-injection layers 111 and 116 each inject holes from the anode to the EL layer and contain a substance having a high hole-injection property. For example, a transition metal oxide such as molybdenum oxide, vanadium oxide, ruthenium oxide, tungsten oxide, or manganese oxide can be used. Alternatively, the hole-injection layer can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecule such as poly(3,4-ethylenedioxythiophene)/poly(styrenesulfonic acid) (abbreviation: PEDOT/PSS), or the like.

Alternatively, for the hole-injection layer, a composite material containing a hole-transport material and an acceptor substance can be used. When the hole-injection layer contains a hole-transport material and an acceptor substance, electrons are extracted from the hole-transport material by the acceptor substance to generate holes and the holes are injected to the light-emitting layer through the hole-transport layer.

Examples of the hole-transport material used for the hole-injection layers 111 and 116 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, any of the following carbazole derivatives can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). The substances described here are mainly substances having a hole mobility of $1 \times 10^{-6}$ cm$^2$/Vs or higher. However, besides the above materials, others may be used as long as the material has a higher hole transport property than an electron transport property.

Further alternatively, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

Other examples of the acceptor material used for the hole-injection layers 111 and 116 include compounds having an electron-withdrawing group (a halogen group or a cyano group), such as 7,7,8,8-tetracyano-2,3,5,6-tetrafluoroquinodimethane (abbreviation: $F_4$-TCNQ), chloranil, and 2,3,6,7,10,11-hexacyano-1,4,5,8,9,12-hexaazatriphenylene (abbreviation: HAT-CN). In addition, transition metal oxides can be given. Moreover, oxides of metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. Among these, molybdenum oxide is particularly preferable because it is stable in the air and is easily treated because of its low hygroscopic property. The hole-injection layers 111 and 116 may also be formed using the above-described acceptor material alone or using the above-described acceptor material and another material in combination.

«Hole-transport Layer»

The hole-transport layers 112 and 117 each contain a hole-transport material and can be formed using any of the materials given as examples of the materials of the hole-injection layers 111 and 116. In order that the hole-transport layer 112 has a function of transporting holes injected to the hole-injection layer 111 to the light-emitting layer 121, the highest occupied molecular orbital (HOMO) level of the hole-transport layer 112 is preferably equal or close to the HOMO level of the hole-injection layer 111.

Examples of the material having a hole-transport property include compounds having aromatic amine skeletons, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)

triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having thiophene skeletons, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage. Hole-transport materials can be selected from a variety of substances as well as from the hole-transport materials given above.

Furthermore, examples of the substance having a high hole-transport property include compounds having aromatic amine skeletons, such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), 3,3'-bis(9-phenyl-9H-carbazole) (abbreviation: PCCP), N-[4-(9H-carbazol-9-yl)phenyl]-N-(4-phenyl)phenylaniline (abbreviation: YGA1BP), 1,3,5-tri(dibenzothiophen-4-yl)-benzene (abbreviation: DBT3P-II), 4,4',4''-(benzene-1,3,5-triyl)tri(dibenzofuran) (abbreviation: DBF3P-II), 4-phenyl-4'-(9-phenylfluoren-9-yl)triphenylamine (abbreviation: BPAFLP), 4-[3-(triphenylen-2-yl)phenyl]dibenzothiophene (abbreviation: mDBTPTp-II), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1; 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Other examples include carbazole compounds such as 4,4'-di(N-carbazolyl)biphenyl (abbreviation: CBP) and 1,3,5-tris[4-(N-carbazolyl)phenyl]benzene (abbreviation: TCPB); amine compounds; dibenzothiophene compounds; dibenzofuran compounds; fluorene compounds; triphenylene compounds; phenanthrene compounds; and the like.

Note that any of these compounds that can be used for the hole-transport layer can also be used for the hole-injection layer.

«Electron-transport Layer»

The electron-transport layers 113 and 118 each contain a substance having a high electron-transport property. Examples of the substance having a high-electron transport property used for the electron-transport layers 113 and 118 include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. Specific examples include metal complexes such as Alq, Almq$_3$, BeBq$_2$, BAlq, ZnPBO, and ZnBTZ. Other examples include heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)](abbreviation: PF-BPy) can be used. The substances described here are mainly substances having an electron mobility of $1 \times 10^{-6}$ cm$^2$/Vs or higher. Note that other substances may also be used for the electron-transport layers 113 and 118 as long as their electron-transport properties are higher than their hole-transport properties.

The electron-transport layers 113 and 118 are each not limited to a single layer, and may be a stack of two or more layers each containing any of the above-described substances.

«Electron-injection Layer»

The electron-injection layers 114 and 119 each contain a substance having a high electron-injection property. For the electron-injection layer 114, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layers 114 and 119. Examples of the electrode include a substance in which electrons are added at a high concentration to calcium oxide-aluminum oxide. The electron-injection layers 114 and 119 can be formed using the substance that can be used for the electron-transport layers 113 and 118.

Alternatively, the electron-injection layers 114 and 119 may be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, the substances for forming the electron-transport layers 113 and 118 (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Further, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

«Charge-generation Layer»

The charge-generation layer 115 has a function of injecting electrons to one of the light-emitting layers (the light-emitting layer 121 or 122) and injecting holes to the other light-emitting layer (the light-emitting layer 121 or 122), when a voltage is applied between the pair of electrodes (the electrodes 101 and 102).

For example, in the tandem light-emitting elements 156 and 158 illustrated in FIGS. 3A and 3B, when a voltage is applied such that the potential of the electrode 101 is higher than that of the electrode 102, the charge-generation layer 115 injects electrons to the light-emitting layer 121 and injects holes to the light-emitting layer 122.

Note that in terms of light extraction efficiency, the charge-generation layer 115 preferably transmits visible light (specifically, the charge-generation layer 115 has a visible light transmittance higher than or equal to 40%). The charge-generation layer 115 functions even if it has lower conductivity than the pair of electrodes (the electrodes 101 and 102).

The charge-generation layer 115 may have either a structure in which an electron acceptor (acceptor) is added to a hole-transport material or a structure in which an electron donor (donor) is added to an electron-transport material. Alternatively, both of these structures may be stacked. Further alternatively, a material that can be used for the hole-injection layer 111 described above may be used.

Note that forming the charge-generation layer 115 by using any of the above materials can suppress an increase in drive voltage caused by the stack of the light-emitting layers.

The above-described light-emitting layer, hole-transport layer, hole-injection layer, electron-transport layer, electron-injection layer, and charge-generation layer can each be formed by any of the following methods: an evaporation method (including a vacuum evaporation method), an ink-jet method, a coating method, gravure printing, and the like. Besides the above-mentioned materials, an inorganic compound or a high molecular compound (e.g., an oligomer, a dendrimer, or a polymer) may be used for the above-described light-emitting layer, hole-transport layer, hole-injection layer, electron-transport layer, electron-injection layer, and charge-generation layer.

«Optical Element»

The optical elements 224R, 224G, and 224B each selectively transmit light of a particular color out of incident light. For example, a coloring layer (also referred to as color filter), a band pass filter, a multilayer filter, or the like can be used, for example. Alternatively, color conversion elements can be used as the optical elements. A color conversion element is an optical element that converts incident light into light having a longer wavelength than the incident light. As the color conversion elements, quantum-dot elements are favorably used. The usage of the quantum-dot type can increase color reproducibility of the display device.

A plurality of optical elements may also be stacked over each of the optical elements 224R, 224G, and 224B. As another optical element, a circularly polarizing plate, an anti-reflective film, or the like can be provided, for example.

A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. Accordingly, light emitted from the display device can be observed clearly.

«Light-blocking Layer»

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

«Partition Wall»

The partition wall 140 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

<8. Method for Manufacturing Light-emitting Element>

Next, a method for manufacturing a light-emitting element of one embodiment of the present invention is described below with reference to FIGS. 7A to 7D and FIGS. 8A to 8C. Here, a method for manufacturing the light-emitting element 252 illustrated in FIG. 5A is described.

FIGS. 7A to 7D and FIGS. 8A to 8C are cross-sectional views illustrating a method for manufacturing the light-emitting element of one embodiment of the present invention.

The method for manufacturing the light-emitting element 252 described below includes first to eighth steps.

«First Step»

Figure 7A:
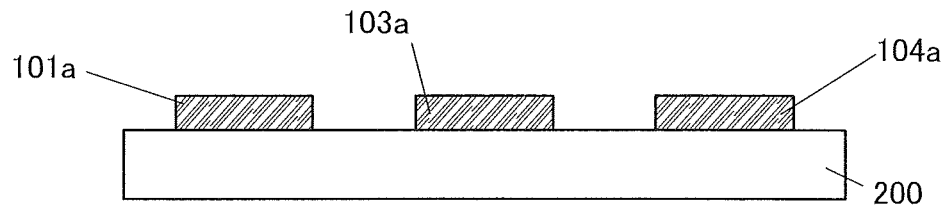
FIGS. 7A to 7D are schematic cross-sectional views illustrating a method for manufacturing a light-emitting element of one embodiment of the present invention.

In the first step, the electrodes (specifically the conductive layer 101a of the electrode 101, the conductive layer 103a of the electrode 103, and the conductive layer 104a of the electrode 104) of the light-emitting elements are formed over the substrate 200 (see FIG. 7A).

In this embodiment, a reflective conductive layer is formed over the substrate 200 and processed into a desired shape; in this way, the conductive layers 101a, 103a, and 104a are formed. As the reflective conductive film, an alloy film of aluminum, nickel, and lanthanum (Al—Ni—La film) is used. The conductive layers 101a, 103a, and 104a are preferably formed through a step of processing the same conductive layer, because the manufacturing cost can be reduced.

Note that a plurality of transistors may be formed over the substrate 200 before the first step. The plurality of transistors may be electrically connected to the conductive layers 101a, 103a, and 104a.

«Second Step»

Figure 7B:
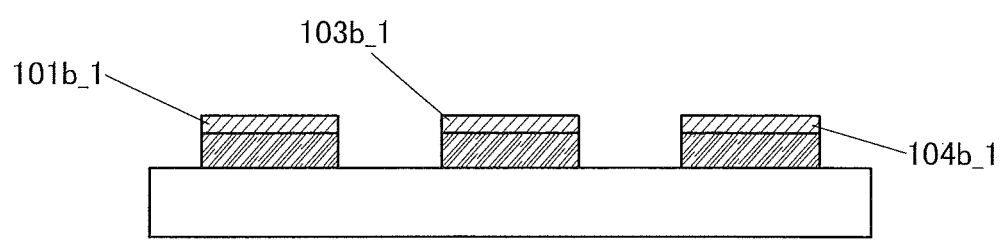

In the second step, the transparent conductive layer 101b_1 is formed over the conductive layer 101a of the electrode 101, the transparent conductive layer 103b_1 is formed over the conductive layer 103a of the electrode 103, and the transparent conductive layer 104b_1 is formed over the conductive layer 104a of the electrode 104 (see FIG. 7B).

In this embodiment, the transparent conductive layers 101b_1, 103b_1, and 104b_1 each are formed using an In—Ga—Zn oxide, whose composition is In:Ga:Zn=1:3:6. When the content of Ga is thus set to be higher than that of In, donation and acceptance of electrons and oxygen between the conductive layer 101a and the transparent conductive layers 101b_1, the conductive layer 103a and the transparent conductive layers 103b_1, and the conductive layer 104a and the transparent conductive layers 104b_1 can be suppressed, so that the electrodes 101, 103, and 104 can be stable.

Note that the transparent conductive layer 101b_1, 103b_1, or 104b_1 may be formed using the same material as that for the oxide semiconductor layer used for the channel region of the transistor formed first. As a result, the transparent conductive layer 101b_1, 103b_1, or 104b_1 can be formed without increasing the kinds of deposition materials; thus, the manufacturing cost can be reduced. In such a case, different film formation processes are favorably used for the transparent conductive layer 101b_1, 103b_1, or 104b_1 and the oxide semiconductor layer used for the channel region of the transistor.

«Third Step»

Figure 7C:
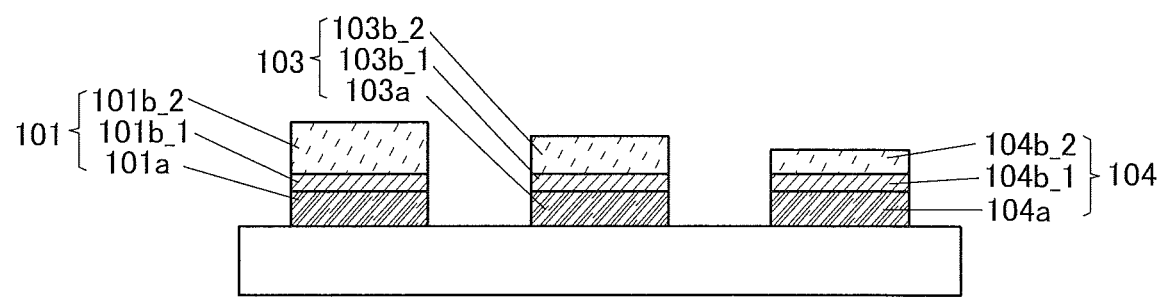

In the third step, the transparent conductive layers (e.g., the transparent conductive layer 101b_2 of the electrode 101, the transparent conductive layer 103b_2 of the electrode 103, and the transparent conductive layer 104b_2 of the electrode 104) of the light-emitting element are formed (see FIG. 7C).

In this embodiment, the transparent conductive layers 101b_2, 103b2, and 104b_2 are formed over the transparent conductive layers 101b_1, 103b_1, and 104b_1, respectively, and the transparent conductive layers and the transparent conductive layers formed in the second step are processed into desired shapes; in this way, the electrodes 101, 103, and 104 are formed. As the transparent conductive layers 101b_2, 103b 2, and 104b 2, an ITSO film is used.

The transparent conductive layers 101b_2, 103b_2, and 104b_2 may be formed through a plurality of steps. When the transparent conductive layers 101b_2, 103b_2, and 104b_2 are formed through a plurality of steps, they can be formed to have thicknesses which enable microcavity structures appropriate in the respective regions.

«Fourth Step»

Figure 7D:
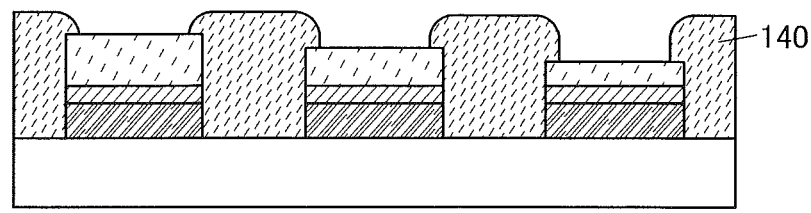

In the fourth step, the partition wall 140 that covers end portions of the electrodes of the light-emitting element is formed (see FIG. 7D).

The partition wall 140 includes an opening overlapping with the electrode. The transparent conductive film or the oxide layer exposed by the opening functions as the anode of the light-emitting element. As the partition wall 140, a polyimide-based resin is used in this embodiment.

In the first to fourth steps, since there is no possibility of damaging the EL layer (a layer containing an organic compound), a variety of film formation methods and micromachining technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101a of the electrode 101, the conductive layer 103a of the electrode 103, and the conductive layer 104a of the electrode 104. Then, an oxide layer and a transparent conductive film are formed by a sputtering method, a pattern is formed over the oxide layer and the transparent conductive film by a lithography method, and then the oxide layer and the transparent conductive film are processed into island shapes by a wet etching method to form the electrodes 101, 103, and 104.

«Fifth Step»

Figure 8A:
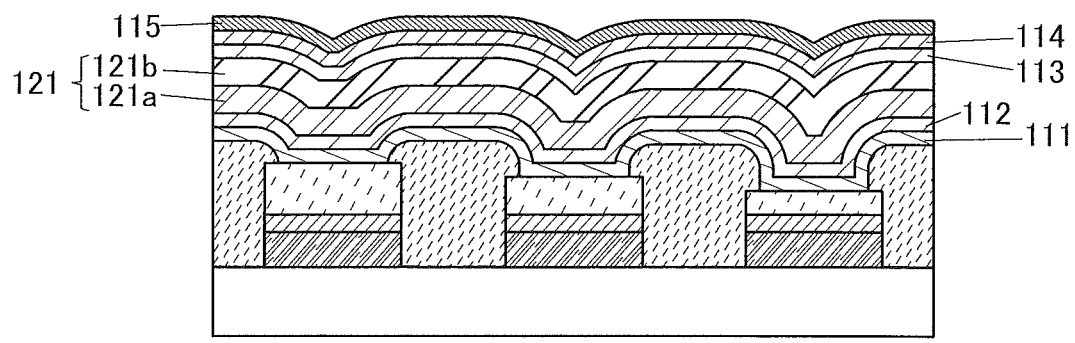
FIGS. 8A to 8C are schematic cross-sectional views illustrating a method for manufacturing a light-emitting element of one embodiment of the present invention.

In the fifth step, the hole-injection layer 111, the hole-transport layer 112, the light-emitting layer 121, the electron-transport layer 113, the electron-injection layer 114, and the charge-generation layer 115 are formed (see FIG. 8A).

The hole-injection layer 111 can be formed by co-evaporating a hole-transport material and a material containing an acceptor substance. Note that co-evaporation is an evaporation method in which a plurality of different substances are concurrently vaporized from their respective evaporation sources. The hole-transport layer 112 can be formed by evaporating a hole-transport material.

The light-emitting layer 121 can be formed by evaporating the second compound (light-emitting material) that emits light of at least one of green, yellow green, yellow, orange, and red. As the second compound, a phosphorescent organic compound can be used. The phosphorescent organic compound may be evaporated alone or the phosphorescent organic compound mixed with another material may be evaporated. For example, the phosphorescent organic compound may be used as a guest material, and the guest material may be dispersed into a host material having higher excitation energy than the guest material. The light-emitting layer 121 preferably has a two-layer structure of the light-emitting layer 121a and the light-emitting layer 121b. In that case, the light-emitting layers 121a and 121b each preferably contain a light-emitting substance that emits light of a different color.

The electron-transport layer 113 can be formed by evaporating a substance having a high electron-transport property. The electron-injection layer 114 can be formed by evaporating a substance having a high electron-injection property.

The charge-generation layer 115 can be formed by evaporating a material obtained by adding an electron acceptor (acceptor) to a hole-transport material or a material obtained by adding an electron donor (donor) to an electron-transport material.

«Sixth Step»

Figure 8B:
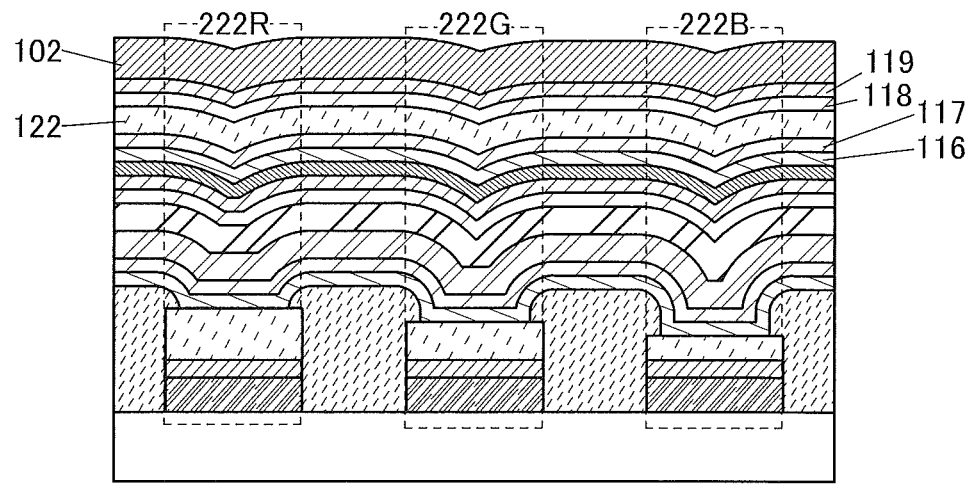

In the sixth step, the hole-injection layer 116, the hole-transport layer 117, the light-emitting layer 122, the electron-transport layer 118, the electron-injection layer 119, and the electrode 102 are formed (see FIG. 8B).

The hole-injection layer 116 can be formed by using a material and a method which are similar to those of the hole-injection layer 111. The hole-transport layer 117 can be formed by using a material and a method which are similar to those of the hole-transport layer 112.

The light-emitting layer 122 can be formed by evaporating the first compound (light-emitting material) that emits light of at least one of violet, blue, and blue green. As the first compound, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having higher excitation energy than the guest material.

The electron-transport layer 118 can be formed by evaporating a substance with a high electron-transport property. The electron-injection layer 119 can be formed by evaporating a substance with a high electron-injection property.

The electrode 102 can be formed by stacking a reflective conductive film and a light-transmitting conductive film. The electrode 102 may have a single-layer structure or a stacked-layer structure.

Through the above-described steps, the light-emitting element including the region 222R, the region 222G, and the region 222B over the electrode 101, the electrode 103, and the electrode 104, respectively, are formed over the substrate 200.

«Seventh Step»

Figure 8C:
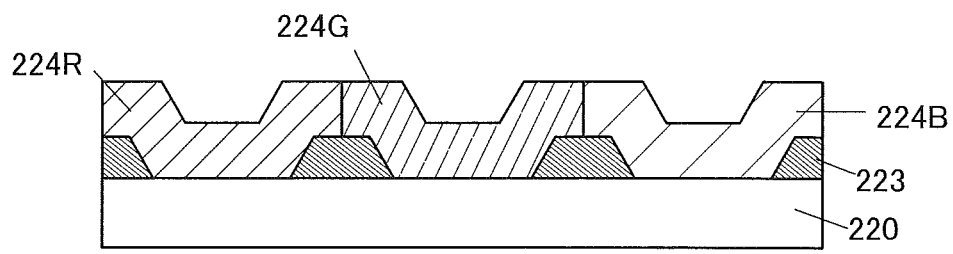

In the seventh step, the light-blocking layer 223, the optical element 224R, the optical element 224G, and the optical element 224B are formed over the substrate 220 (see FIG. 8C).

As the light-blocking layer 223, a resin film containing black pigment is formed in a desired region. Then, the optical element 224R, the optical element 224G, and the optical element 224B are formed over the substrate 220 and the light-blocking layer 223. As the optical element 224R, a resin film containing red pigment is formed in a desired region. As the optical element 224G, a resin film containing green pigment is formed in a desired region. As the optical element 224B, a resin film containing blue pigment is formed in a desired region.

«Eighth Step»

In the eighth step, the light-emitting element formed over the substrate 200 is attached to the light-blocking layer 223, the optical element 224R, the optical element 224G, and the optical element 224B formed over the substrate 220, and sealed with a sealant (not illustrated).

Through the above-described steps, the light-emitting element 252 illustrated in FIG. 5A can be formed.

In this embodiment, one embodiment of the present invention has been described. Other embodiments of the present invention are described in Embodiments 2 to 7. Note that one embodiment of the present invention is not limited to the above examples. Although an example in which the transparent conductive layer 101b_1 over and in contact with the conductive layer 101a in the electrode 101 includes In and the stabilizer M (M represents Al, Si, Ti, Ga, Y, Zr, La, Ce, Nd, or Hf) is shown as one embodiment of the present invention, one embodiment of the present invention is not limited thereto. For example, depending on the case or situation, the transparent conductive layer 101b_1 does not necessarily include In or the stabilizer M (M represents Al, Si, Ti, Ga, Y, Zr, La, Ce, Nd, or Hf) in one embodiment of the present invention. Although another example in which the transparent conductive layer 101b_2 of the electrode 101 includes In is shown as one embodiment of the present invention, one embodiment of the present invention is not limited thereto. For example, depending on the case or situation, the transparent conductive layer 101b_2 does not necessarily include In in one embodiment of the present invention. Although the example in which the resistivity of the transparent conductive layer 101b_2 is lower than that of the transparent conductive layer 101b_1 and the thickness of the transparent conductive layer 101b_2 is larger than or equal to that of the transparent conductive layer 101b_1 is shown as another embodiment of the present invention, one embodiment of the present invention is not limited thereto. Depending on the case or situation, in one embodiment of the present invention, the resistivity of the transparent conductive layer 101b_2 is not necessarily lower than that of the transparent conductive layer 101b_1. Furthermore, the thickness of the transparent conductive layer 101b_2 is not necessarily larger than or equal to that of the transparent conductive layer 101b_1. Although another example is shown in which the oxide semiconductor layer used for a channel region of a switching transistor includes In and the stabilizer M (M represents Al, Si, Ti, Ga, Y, Zr, La, Ce, Nd, or Hf) in one embodiment of the present invention, one embodiment of the present invention is not limited thereto. For example, depending on the case or situation, the oxide semiconductor layer does not necessarily include In or the stabilizer M (M represents Al, Si, Ti, Ga, Y, Zr, La, Ce, Nd, or Hf) in one embodiment of the present invention. Although another example in which the conductive layer 101a of the electrode 101 has a function of reflecting light in one embodiment of the present invention, the conductive layer 101a does not necessarily has a function of reflecting light in one embodiment of the present invention, for example. For example, depending on the case or situation, the electrode 101 does not necessarily include the transparent conductive layer 101b_1 in one embodiment of the present invention.

This embodiment can be combined as appropriate with any of the other embodiments and examples.

(Embodiment 2)

In this embodiment, a light emission mechanism in a light-emitting element that can be used for a light-emitting element of one embodiment of the present invention or a display device of one embodiment of the present invention will be described with reference to FIG. 9, FIGS. 10A and 10B, and FIG. 11.

Figure 9:
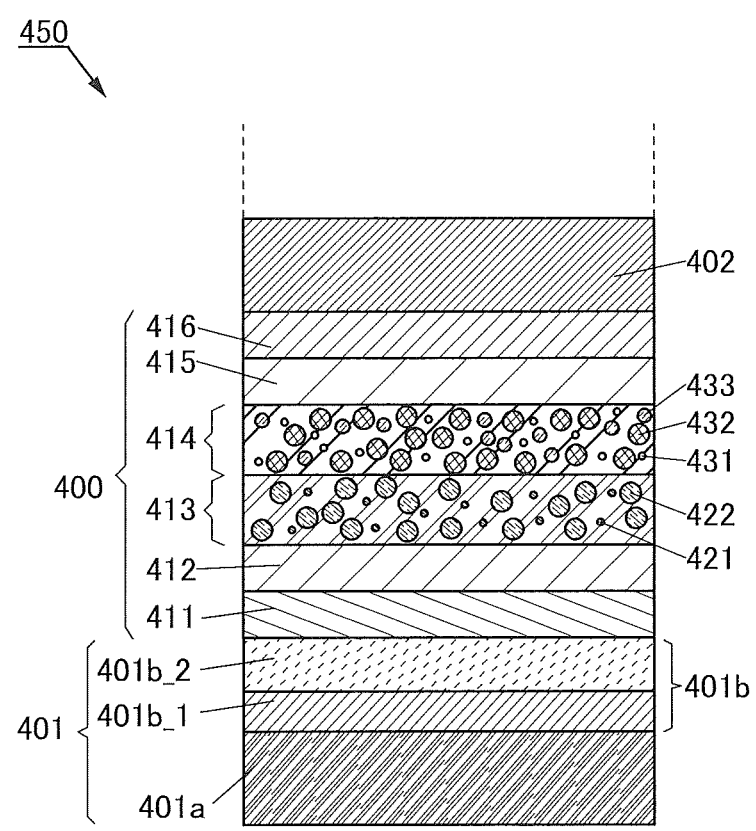
FIG. 9 is a schematic cross-sectional view illustrating a light-emitting element of one embodiment of the present invention.

FIG. 9 is a schematic cross-sectional view of a light-emitting element 450.

In the light-emitting element 450 in FIG. 9, an EL layer 400 is interposed between a pair of electrodes (an electrode 401 and an electrode 402). Note that although the electrode 401 functions as an anode and the electrode 402 functions as a cathode in the light-emitting element 450, one embodiment of the present invention is not limited thereto.

The EL layer 400 includes a light-emitting layer 413 and a light-emitting layer 414. In the light-emitting element 450, as the EL layer 400, a hole-injection layer 411, a hole-transport layer 412, an electron-transport layer 415, and an electron-injection layer 416 are illustrated in addition to the light-emitting layers 413 and 414. However, this stacked-layer structure is an example, and the structure of the EL layer 400 in the light-emitting element 450 is not limited thereto. For example, the stacking order of the above layers of the EL layer 400 may be changed. Alternatively, in the EL layer 400, another functional layer other than the above layers may be provided. The functional layer may have a function of injecting a carrier (an electron or a hole), a function of transporting a carrier, a function of inhibiting a carrier, or a function of generating a carrier, for example.

The light-emitting layer 413 includes a guest material 421 and a host material 422. The light-emitting layer 414 includes a guest material 431, an organic compound 432, and an organic compound 433. Note that in the following description, the guest material 421 is a fluorescent material and the guest material 431 is a phosphorescent material.

<Light Emission Mechanism of Light-emitting Layer 413>

First, the light emission mechanism of the light-emitting layer 413 is described below.

In the light-emitting layer 413, recombination of carriers forms an excited state. Because the amount of the host material 422 is large as compared with the guest material 421, the excited states are formed mostly as the excited states of the host material 422. The ratio of singlet excited states to triplet excited states caused by carrier recombination (hereinafter referred to as exciton generation probability) is approximately 1:3.

First, a case where a $T_1$ level of the host material 422 is higher than a $T_1$ level of the guest material 421 is described below.

The triplet excitation energy level of the host material 422 is transferred to the triplet excitation energy level of the guest material 421 (triplet energy transfer). However, the guest material 421 in the triplet excitation energy state does not provide light emission in a visible light region because the guest material 421 is the fluorescent material. Thus, it is difficult to use the triplet excitation energy of the host material 422 for light emission. Therefore, when the $T_1$ level of the host material 422 is higher than the $T_1$ level of the guest material 421, it is difficult to use more than approximately 25% of injected carriers for light emission.

Figure 10A:
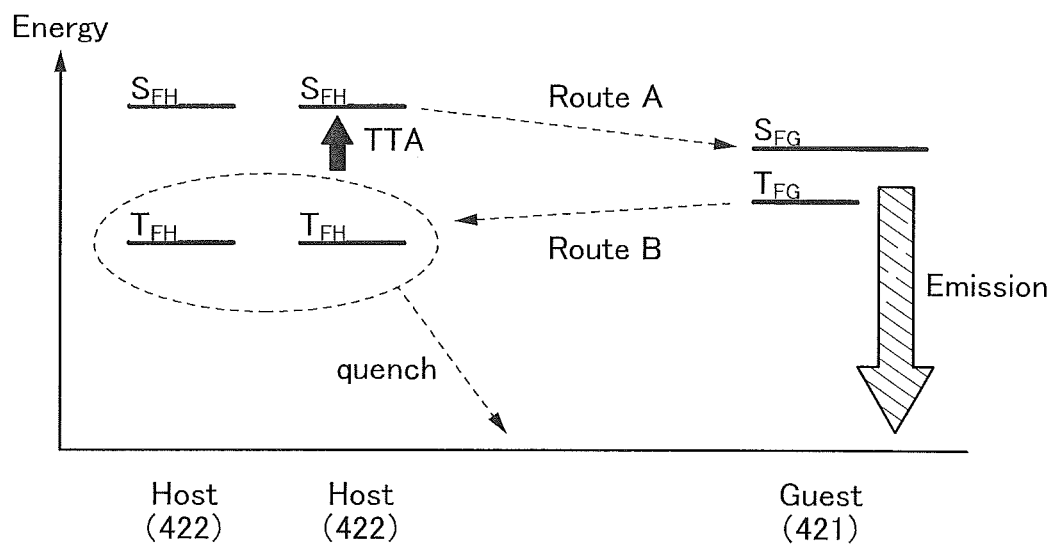
FIGS. 10A and 10B show correlations of energy levels in light-emitting layers of one embodiment of the present invention.

Next, FIG. 10A shows a correlation of energy levels between the host material 422 and the guest material 421 of the light-emitting layer 413. The following explains what terms and signs in FIG. 10A represent:

Host (422): the host material 422;

Guest (421): the guest material 421 (the fluorescent material);

$S_{FH}$: the level of the lowest singlet excited state of the host material 422;

$T_{FH}$: the level of the lowest triplet excited state of the host material 422;

$S_{FG}$: the level of the lowest singlet excited state of the guest material 421 (the fluorescent material); and $T_{FG}$: the level of the lowest triplet excited state of the guest material 421 (the fluorescent material).

As shown in FIG. 10A, the $T_1$ level of the guest material ($T_{FG}$ in FIG. 10A) is higher than the $T_1$ level of the host material ($T_{FH}$ in FIG. 10 A).

In addition, as shown in FIG. 10A, triplet excitons collide with each other by triplet-triplet annihilation (TTA), and their excitation energies are partly converted into singlet excitons having an energy at the level of the lowest singlet excited state of the host material ($S_{FH}$). Energy is transferred from the level of the lowest singlet excited state of the host material ($S_{FH}$) to the level of the lowest singlet excited state of the guest material (the fluorescent material) ($S_{FG}$) that is the level lower than $S_{FH}$ (see Route A in FIG. 10A); and thus the guest material (the fluorescent material) emits light.

Because the $T_1$ level of the host material is lower than the $T_1$ level of the guest material, energy is transferred from $T_{FG}$ to $T_{FH}$ without deactivation of $T_{FG}$ (see Route B in FIG. 10A) and is utilized for TTA.

When the light-emitting layer 413 has the above structure, light emission from the guest material 421 of the light-emitting layer 413 can be efficiently obtained.

<Light Emission Mechanism of Light-emitting Layer 414>

Next, the light emission mechanism of the light-emitting layer 414 is described below.

The organic compounds 432 and 433 of the light-emitting layer 414 form an exciplex. One of the organic compounds 432 and 433 functions as a host material for the light-emitting layer 414, and the other of the organic compounds 432 and 433 functions as an assist material for the light-emitting layer 414. Note that the organic compound 432 serves as the host material and the organic compound 433 serves as the assist material in the following description.

Although it is acceptable as long as the combination of the organic compound 432 and the organic compound 433 can form exciplexes in the light-emitting layer 414, it is preferable that one organic compound be a material having a hole-transport property and the other organic compound be a material having an electron-transport property. In that case, a donor-acceptor excited state is formed easily, which allows an exciplex to be formed efficiently. In the case where the combination of the organic compounds 432 and 433 is a combination of the material having a hole-transport property and the material having an electron-transport property, the carrier balance can be easily controlled depending on the mixture ratio. Specifically, the weight ratio of the material having a hole-transport property to the material having an electron-transport property is preferably within a range of 1:9 to 9:1. Since the carrier balance can be easily controlled with the structure, a recombination region can also be easily controlled.

Figure 10B:
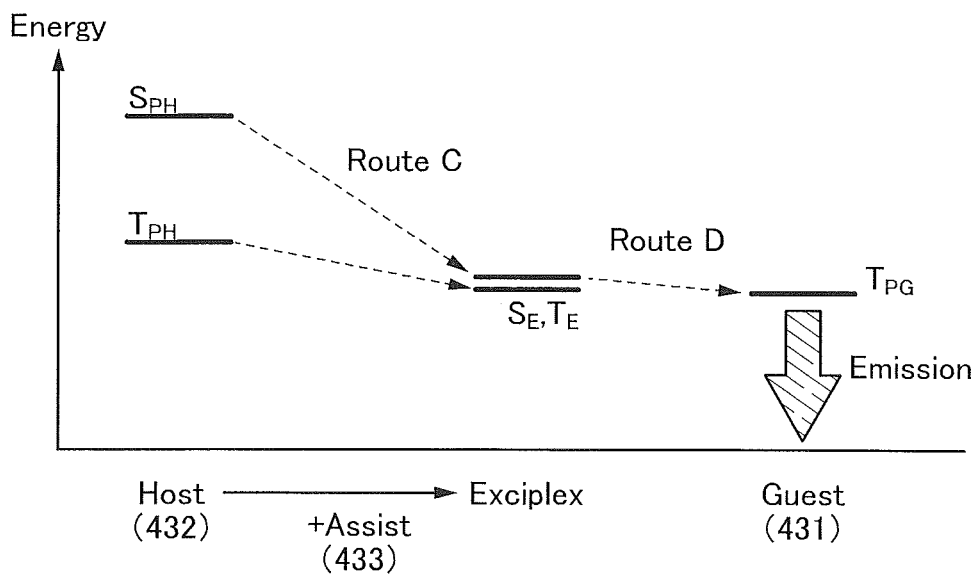

FIG. 10B shows a correlation of energy levels between the organic compound 432, the organic compound 433, and the guest material 431 of the light-emitting layer 414. The following explains what terms and signs in FIG. 10B represent:

Host (432): the host material (the organic compound 432);

Assist (433): the assist material (the organic compound 433);

Guest (431): the guest material 431 (the phosphorescent material);

Exciplex: the exciplex (the organic compounds 432 and 433);

$S_{PH}$: the level of the lowest singlet excited state of the host material (the organic compound 432);

$T_{PH}$: the level of the lowest triplet excited state of the host material (the organic compound 432);

$T_{PG}$: the level of the lowest triplet excited state of the guest material 431 (the phosphorescent material);

$S_E$: the level of the lowest singlet excited state of the exciplex; and $T_E$: the level of the lowest triplet excited state of the exciplex.

In the light-emitting element of one embodiment of the present invention, the organic compounds 432 and 433 of the light-emitting layer 414 form the exciplex. The level of the lowest singlet excited state of the exciplex ($S_E$) and the level of the lowest triplet excited state of the exciplex ($T_E$) are adjacent to each other (see Route C in FIG. 10B).

An exciplex is an excited state formed from two kinds of substances. In the case of photoexcitation, the exciplex is formed by interaction between one substance in an excited state and the other substance in a ground state. The two kinds of substances that have formed the exciplex return to a ground state by emitting light and serve as the original two kinds of substances. In the case of electrical excitation, the exciplex can be formed when a cationic substance comes close to an anionic substance. That is, the exciplex can be formed without formation of excitation state of either substance in the electrical excitation; thus, drive voltage can be lowered. Both energies of $S_E$ and $T_E$ of the exciplex then move to the level of the lowest triplet excited state of the guest material 431 (the phosphorescent material) to obtain light emission (see Route D in FIG. 10B).

The above-described process of Route C and Route D is in some cases referred to as exciplex-triplet energy transfer (ExTET) in this specification and the like. In other words, in the light-emitting element 450, energy can be given from the exciplex to the guest material 431 (the phosphorescent material).

When one of the organic compounds 432 and 433 receiving a hole and the other of the organic compounds 432 and 433 receiving an electron come close to each other, the exciplex is formed at once. Alternatively, when one compound becomes in an excited state, the one immediately interacts with the other compound to form the exciplex. Therefore, most excitons in the light-emitting layer 414 exist as the exciplexes. A band gap of the exciplex is smaller than those of the organic compounds 432 and 433; therefore, the drive voltage can be lowered when the exciplex is formed by recombination of a hole and an electron.

When the light-emitting layer 414 has the above-described structure, light emission from the guest material 431 (the phosphorescent material) of the light-emitting layer 414 can be obtained efficiently.

<Light Emission Mechanism of Light-emitting Layers 413 and 414>

Each light emission mechanism of the light-emitting layers 413 and 414 is described above. As in the light-emitting element 450, in the case where the light-emitting layers 413 and 414 are in contact with each other, even when energy is transferred from the exciplex to the host material 422 of the light-emitting layer 413 (in particular, when energy of the triplet excited level is transferred) at an interface between the light-emitting layer 413 and the light-emitting layer 414, triplet excitation energy can be converted into light emission in the light-emitting layer 413.

The $T_1$ level of the host material 422 of the light-emitting layer 413 is preferably lower than $T_1$ levels of the organic compounds 432 and 433 of the light-emitting layer 414. In the light-emitting layer 413, an $S_1$ level of the host material 422 is preferably higher than an $S_1$ level of the guest material 421 (the fluorescent material) while the $T_1$ level of the host material 422 is preferably lower than the $T_1$ level of the guest material 421 (the fluorescent material).

Figure 11:
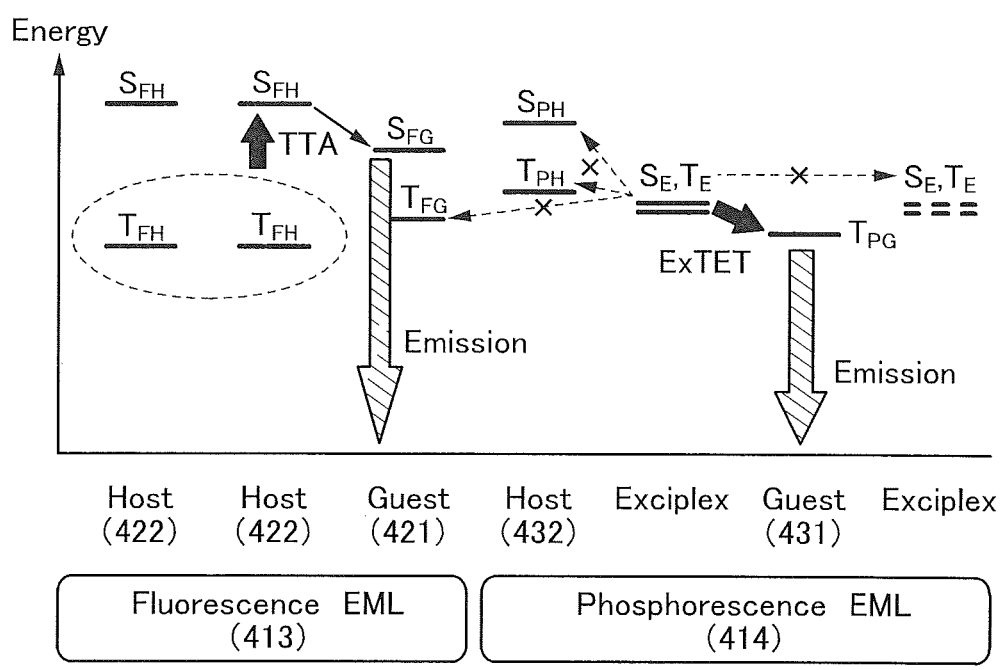
FIG. 11 shows a correlation of energy levels in light-emitting layers of one embodiment the present invention.

FIG. 11 shows a correlation of energy levels in the case where TTA is utilized in the light-emitting layer 413 and ExTET is utilized in the light-emitting layer 414. The following explains what terms and signs in FIG. 11 represent:

Fluorescence EML: the fluorescent light-emitting layer (the light-emitting layer 413);

Phosphorescence EML: the phosphorescent light-emitting layer (the light-emitting layer 414);

$S_{FH}$: the level of the lowest singlet excited state of the host material 422;

$T_{FH}$: the level of the lowest triplet excited state of the host material 422;

$S_{FG}$: the level of the lowest singlet excited state of the guest material 421 (the fluorescent material);

$T_{FG}$: the level of the lowest triplet excited state of the guest material 421 (the fluorescent material);

$S_{PH}$: the level of the lowest singlet excited state of the host material (the organic compound 432);

$T_{PH}$: the level of the lowest triplet excited state of the host material (the organic compound 432);

$T_{PG}$: the level of the lowest triplet excited state of the guest material 431 (the phosphorescent material);

$S_E$: the level of the lowest singlet excited state of the exciplex; and $T_E$: the level of the lowest triplet excited state of the exciplex.

As shown in FIG. 11, the exciplex exists only in an excited state; thus, exciton diffusion between the exciplexes is less likely to occur. In addition, because the excited levels of the exciplex ($S_E$ and $T_E$) are lower than the excited levels of the organic compound 432 (the host material of the phosphorescent material) of the light-emitting layer 414 ($S_{PH}$ and $T_{PH}$), energy diffusion from the exciplex to the organic compound 432 does not occur. That is, emission efficiency of the phosphorescent light-emitting layer (the light-emitting layer 414) can be maintained because an exciton diffusion distance of the exciplex is short in the phosphorescent light-emitting layer (the light-emitting layer 414). In addition, even when part of the triplet excitation energy of the exciplex of the phosphorescent light-emitting layer (the light-emitting layer 414) diffuses into the fluorescent light-emitting layer (the light-emitting layer 413) through the interface between the fluorescent light-emitting layer (the light-emitting layer 413) and the phosphorescent light-emitting layer (the light-emitting layer 414), energy loss can be reduced because the triplet excitation energy in the fluorescent light-emitting layer (the light-emitting layer 413) caused by the diffusion is used for light emission through TTA.

The light-emitting element 450 can have high emission efficiency because ExTET is utilized in the light-emitting layer 414 and TTA is utilized in the light-emitting layer 413 as described above so that energy loss is reduced. As in the light-emitting element 450, in the case where the light-emitting layer 413 and the light-emitting layer 414 are in contact with each other, the number of EL layers 400 as well as the energy loss can be reduced. Therefore, a light-emitting element with low manufacturing cost can be obtained.

Note that the light-emitting layer 413 and the light-emitting layer 414 are not necessarily in contact with each other. In that case, it is possible to prevent energy transfer by the Dexter mechanism (particularly triplet energy transfer) from the organic compound 432 in an excited state or the guest material 431 (the phosphorescent material) in an excited state which is generated in the light-emitting layer 414 to the host material 422 or the guest material 421 (the fluorescent material) in the light-emitting layer 413. Therefore, the thickness of a layer provided between the light-emitting layer 413 and the light-emitting layer 414 may be several nanometers.

The layer provided between the light-emitting layer 413 and the light-emitting layer 414 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials contained in the layer may be the same as the host material (the organic compound 432) of the light-emitting layer 414. This facilitates the manufacture of the light-emitting element and reduces the drive voltage. Furthermore, the hole-transport material and the electron-transport material may form an exciplex, which effectively prevents exciton diffusion. Specifically, it is possible to prevent energy transfer from the host material (the organic compound 432) in an excited state or the guest material 431 (the phosphorescent material) in an excited state of the light-emitting layer 414 to the host material 422 or the guest material 421 (the fluorescent material) in the light-emitting layer 413.

Note that in the light-emitting element 450, a carrier recombination region is preferably distributed to some extent. Therefore, it is preferable that the light-emitting layer 413 or 414 have an appropriate degree of carrier-trapping property. It is particularly preferable that the guest material 431 (the phosphorescent material) in the light-emitting layer 414 have an electron-trapping property. Alternatively, the guest material 421 (the fluorescent material) in the light-emitting layer 413 preferably has a hole-trapping property.

Note that light emitted from the light-emitting layer 413 preferably has a peak on the shorter wavelength side than light emitted from the light-emitting layer 414. The luminance of a light-emitting element using the phosphorescent material emitting light with a short wavelength tends to degrade quickly. In view of the above, fluorescence is used for light emission with a short wavelength, so that a light-emitting element with less degradation of luminance can be provided.

Furthermore, the light-emitting layers 413 and 414 are made to emit light with different emission wavelengths, so that the light-emitting element can be a multicolor light-emitting element. In that case, the emission spectrum is formed by combining light having different emission peaks, and thus has at least two peaks.

The above-described structure is suitable for obtaining white light emission. When the light-emitting layers 413 and 414 emit light of complementary colors, white light emission can be obtained.

In addition, white light emission with a high color rendering property that is formed of three primary colors or four or more colors can be obtained by using a plurality of light-emitting substances emitting light with different wavelengths for the light-emitting layer 413. In that case, the light-emitting layer 413 may be divided into layers and each of the divided layers may contain a different light-emitting material from the others.

Therefore, the combination of the above structure with the structure of the electrodes shown in Embodiment 1 can provide a light-emitting element having high emission efficiency. In other words, the electrode 401 that includes the conductive layer 401a and the conductive layer 401b including a transparent conductive layer 401b_1 and a transparent conductive layer 401b_2 has high reflectance and conductivity and is stable. Thus, a light-emitting element having high emission efficiency can be formed.

When the above-described structure is used for the light-emitting element shown in Embodiment 1, which includes a plurality of different electrode structures in a subpixel, the emission intensity of one of the light-emitting layers 413 and 414 can be high in the light-emitting element including the electrodes 401 and 402, and the emission intensity of the other of the light-emitting layers 413 and 414 can be high in the light-emitting element including the electrode 402 and an electrode whose structure is different from that of the electrode 401. In other words, with the use of the electrode of one embodiment of the present invention, light of different emission colors can be extracted from each subpixel without depositing the EL layers side by side. Thus, a display device having high light use efficiency can be manufactured without reducing yield. That is, a display device with low power consumption can be manufactured. In addition, the manufacturing cost of the display device can be reduced.

Next, materials that can be used for the light-emitting layers 413 and 414 will be described.

<Material that can be Used for Light-emitting Layer 413>

In the light-emitting layer 413, the host material 422 is present in the highest proportion by weight, and the guest material 421 (the fluorescent material) is dispersed in the host material 422. The $S_1$ level of the host material 422 is preferably higher than the $S_1$ level of the guest material 421 (the fluorescent material) while the $T_1$ level of the host material 422 is preferably lower than the $T_1$ level of the guest material 421 (the fluorescent material).

An anthracene derivative, a benzanthracene derivative, or a tetracene derivative is preferably used as the host material 422. This is because these derivatives each have a high $S_1$ level and a low $T_1$ level. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-[4-(7-benzo[a]anthracene)phenyl]-9H-carbazole (abbreviation: 7CzPaBA). Besides, 5,12-diphenyltetracene, 5,12-bis(biphenyl-2-yl)tetracene, and the like can be given.

Examples of the guest material 421 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), and the like.

<Material that can be Used for Light-emitting Layer 414>

In the light-emitting layer 414, the host material (the organic compound 432) is present in the highest proportion in mass ratio, and the guest material 431 (the phosphorescent material) is dispersed in the host material (the organic compound 432). The $T_1$ level of the host material (the organic compound 432) of the light-emitting layer 414 is preferably higher than the $T_1$ level of the guest material 421 (the fluorescent material) of the light-emitting layer 413 and higher than the $T_1$ level of the guest material 431 (the phosphorescent material) of the light-emitting layer 414.

Examples of the host material (the organic compound 432) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like.

As the guest material 431 (the phosphorescent material), an iridium-, rhodium-, or platinum-based organometallic complex or a metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

As the organic compound 433 (the assist material), a substance which can form an exciplex together with the organic compound 432 is used. In that case, it is preferable that the organic compound 432, the organic compound 433, and the guest material 431 (the phosphorescent material) be selected such that the emission peak of the exciplex overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency.

However, if a material exhibiting thermally activated delayed fluorescence (TADF) is used instead of the phosphorescent material, it is preferable that an adsorption band on the longest wavelength side be an absorption band of a singlet.

As the light-emitting material included in the light-emitting layer 414, any material can be used as long as the material can convert the triplet excitation energy into light emission. As an example of the material that can convert the triplet excitation energy into light emission, a TADF material is given in addition to a phosphorescent material. Therefore, it is acceptable that the "phosphorescent material" in the description is replaced with the "TADF material". Note that the TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is preferably greater than or equal to 0 eV and less than or equal to 0.2 eV, further preferably greater than or equal to 0 eV and less than or equal to 0.1 eV.

There is no limitation on the emission colors of the light-emitting material included in the light-emitting layer 413 and the light-emitting material included in the light-emitting layer 414, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material included in the light-emitting layer 413 is preferably shorter than that of the light-emitting material included in the light-emitting layer 414.

Note that the light-emitting layers 413 and 414 can be formed by an evaporation method (including a vacuum evaporation method), an ink-jet method, a coating method, gravure printing, or the like.

Note that the structure described in this embodiment can be combined as appropriate with any of the structures described in the other embodiments and the examples.

(Embodiment 3)

In this embodiment, a display device of one embodiment of the present invention will be described below with reference to FIGS. 12A and 12B, FIGS. 13A and 13B, FIG. 14, FIG. 15, and FIG. 16.

<Structure Example 1 of Display Device>

Figure 12A:
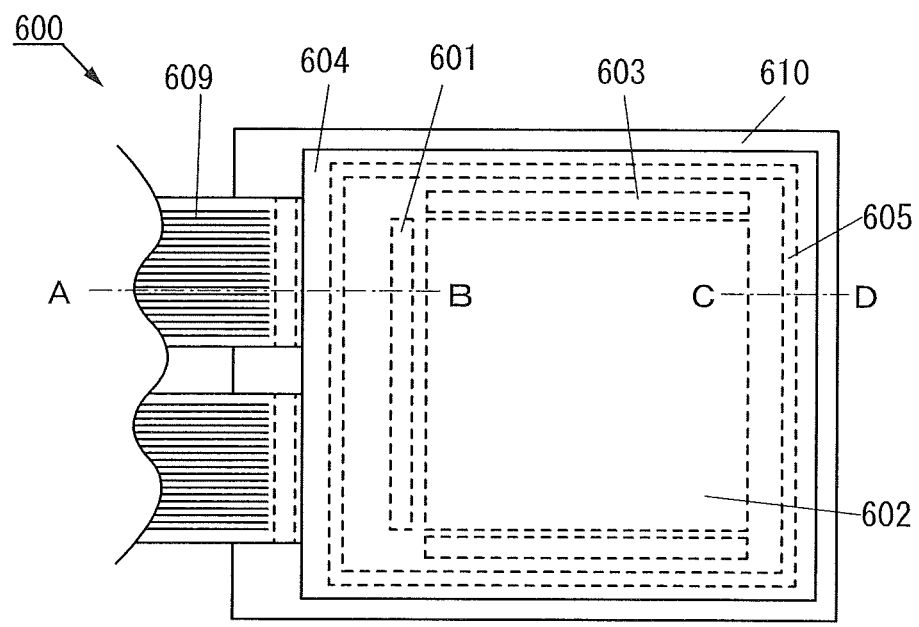
FIGS. 12A and 12B are a top view and a schematic cross-sectional view illustrating a display device of one embodiment of the present invention.
Figure 12B:
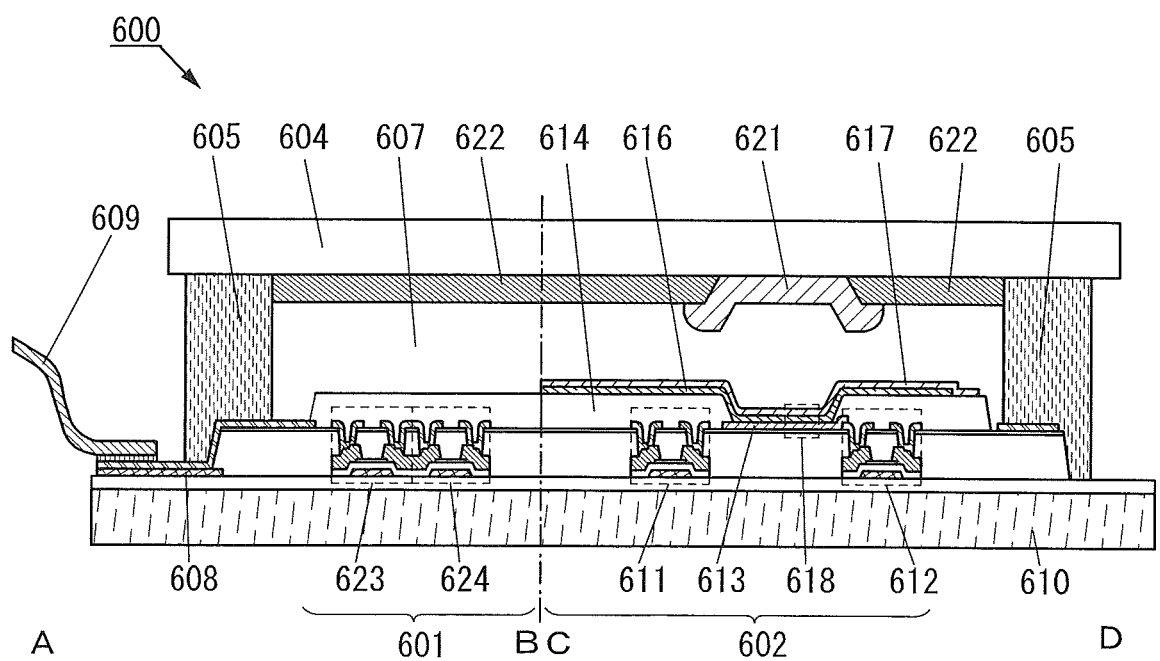

FIG. 12A is a top view illustrating a display device 600 and FIG. 12B is a cross-sectional view taken along the dashed-dotted line A-B and the dashed-dotted line C-D in FIG. 12A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission of a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage by a film which is formed over the partition wall 614, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M represents Al, Ga, Y, Zr, La, Ce, Sn, Hf, or Nd).

Note that in the above-described transistors, an oxide semiconductor layer including a channel region of the transistor and the transparent conductive layer of the lower electrode 613 are favorably formed with oxides including the same elements. In other words, the oxide semiconductor layer used for the channel region of the transistor preferably includes In and the stabilizer M (M represents Al, Si, Ti, Ga, Y, Zr, La, Ce, Nd, or Hf). In addition, it is particularly preferable to use the same materials for the oxide semiconductor layer and the transparent conductive layer.

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an ink-jet method, or a spin coating method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 has the structure described in Embodiment 1. In the case where the pixel portion includes a plurality of light-emitting elements, the pixel portion may include both the light-emitting element described in Embodiment 1 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and the desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 1, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, the display device including the light-emitting element and the optical element which are described in Embodiment 1 can be obtained.

<Structure Example 2 of Display Device>

Figure 14:
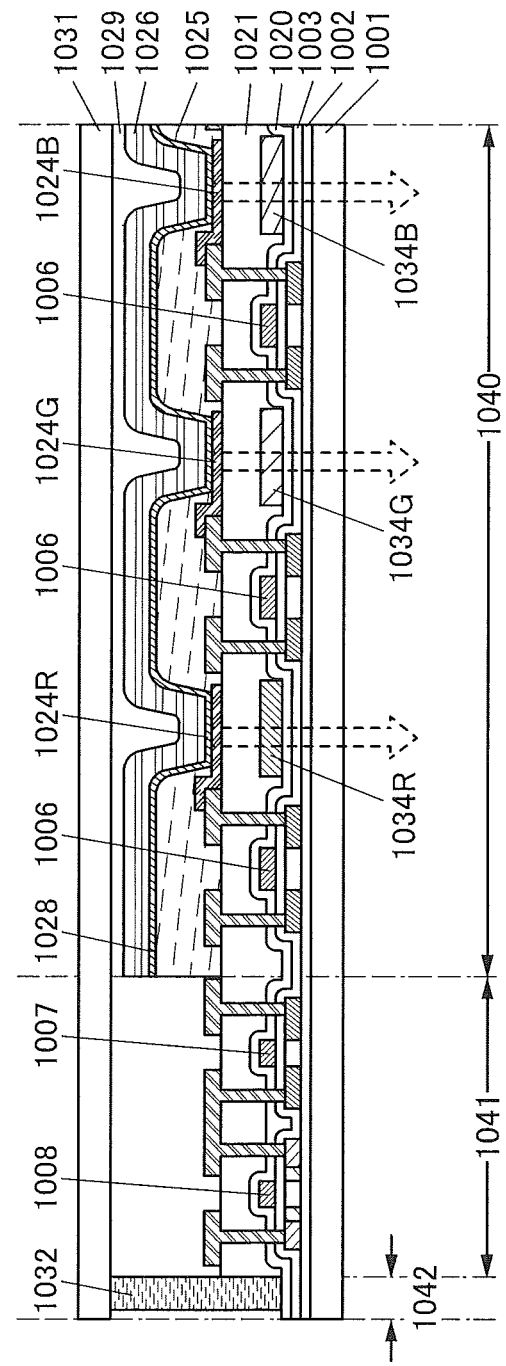
FIG. 14 is a schematic cross-sectional view illustrating a display device of one embodiment of the present invention.

Next, another example of the display device is described with reference to FIGS. 13A and 13B and FIG. 14. Note that FIGS. 13A and 13B and FIG. 14 are each a cross-sectional view of a display device of one embodiment of the present invention.

In FIG. 13A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 13A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 13A, red light, green light, and blue light transmit the coloring layers, and thus an image can be displayed with the use of pixels of three colors.

FIG. 13B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 14 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 15:
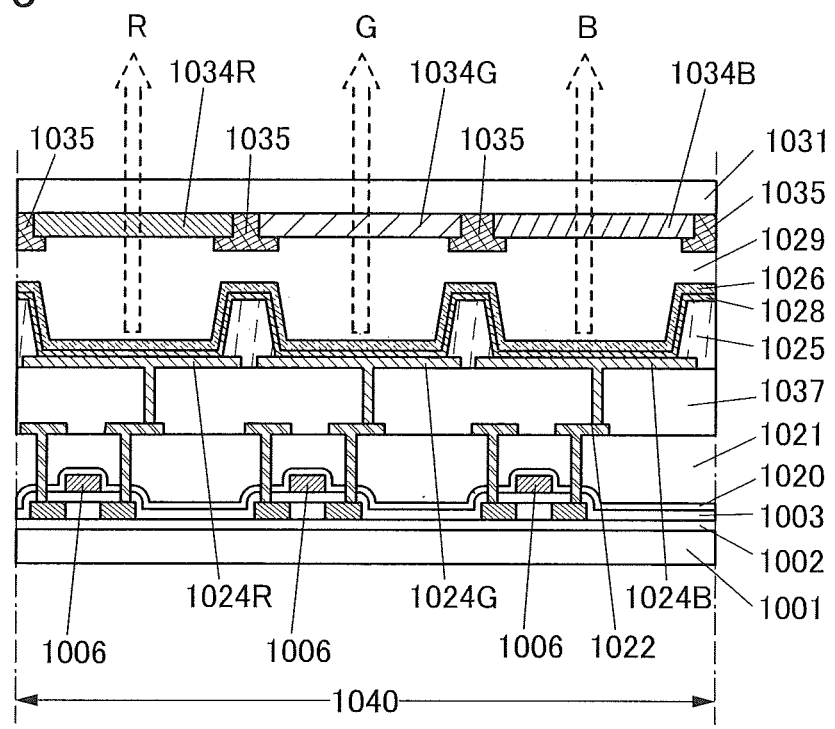
FIG. 15 is a schematic cross-sectional view illustrating a display device of one embodiment of the present invention.
Figure 16:
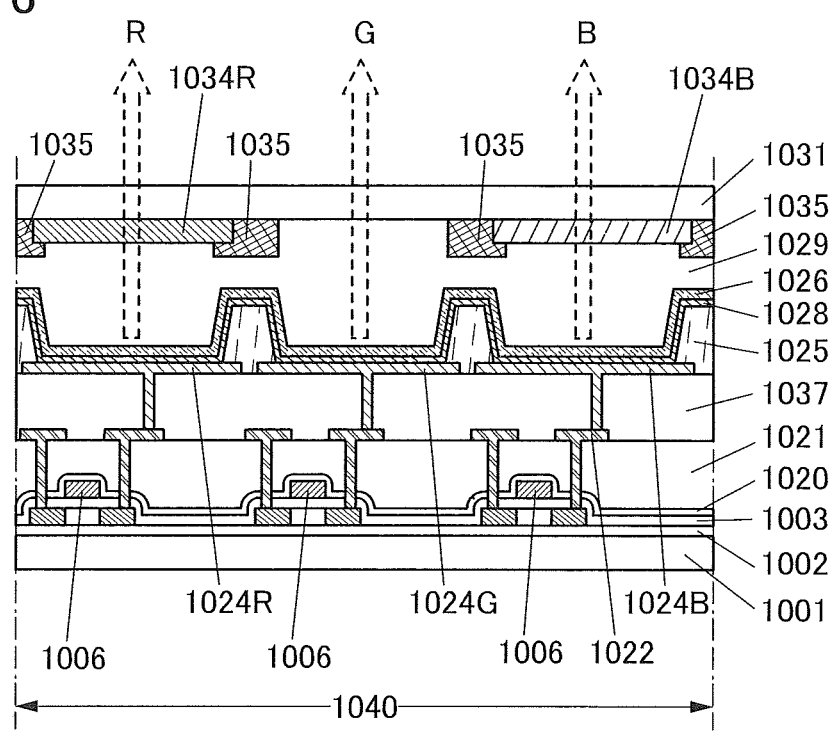
FIG. 16 is a schematic cross-sectional view illustrating a display device of one embodiment of the present invention.

FIG. 15 and FIG. 16 are each an example of a cross-sectional view of a display device having a top emission structure. Note that FIG. 15 and FIG. 16 are each a cross-sectional view illustrating the display device of one embodiment of the present invention, and the driver circuit portion 1041, the peripheral portion 1042, and the like, which are illustrated in FIGS. 13A and 13B and FIG. 14, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed by using a material similar to that of the second interlayer insulating film, or can be formed by using any other known materials.

The lower electrodes 1024R, 1024G, and 1024B of the light-emitting elements each function as an anode here, but may function as a cathode. Further, in the case of a display device having a top-emission structure as illustrated in FIG. 15, the lower electrodes 1024R, 1024G, and 1024B are preferably reflective electrodes. The lower electrodes 1024R, 1024G, and 1024B and the EL layer 1028 can have structures similar to those of the electrodes 101, 103, and 104 and the EL layer 100 in Embodiment 1, respectively. In other words, the lower electrodes 1024R, 1024G, and 1024B each favorably include a first conductive layer having a function of reflecting light and a second conductive layer over the first conductive layer, and the second conductive layer favorably includes a first transparent conductive layer over the first conductive layer and a second transparent conductive layer over the first transparent conductive layer. The upper electrode 1026 is provided over the EL layer 1028. The upper electrode 1026, which serves as a semi-transmissive and semi-reflective electrode, preferably forms a microcavity structure between the upper electrode 1026 and the lower electrodes 1024R, 1024G, and 1024B, in which case the intensity of light having a specific wavelength is increased.

In the case of a top-emission structure as illustrated in FIG. 15, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 15 illustrates the structure provided with the light-emitting elements and the coloring layers for the light-emitting elements as an example; however, the structure is not limited thereto. For example, as shown in FIG. 16, a structure including the red coloring layer 1034R and the blue coloring layer 1034B but not including a green coloring layer may be employed to achieve full color display with the three colors of red, green, and blue. The structure as illustrated in FIG. 15 where the light-emitting elements are provided with the coloring layers is effective to suppress reflection of external light. In contrast, the structure as illustrated in FIG. 16 where the light-emitting elements are provided with the red coloring layer and the blue coloring layer and without the green coloring layer is effective to reduce power consumption because of small energy loss of light emitted from the green light-emitting element.

Note that the structure described in this embodiment can be combined as appropriate with any of the structures described in this embodiment, the other embodiments, and the examples.

(Embodiment 4)

In this embodiment, a display device including a light-emitting element of one embodiment of the present invention will be described with reference to FIGS. 17A and 17B, FIGS. 18A and 18B, and FIGS. 19A and 19B.

Figure 17A:
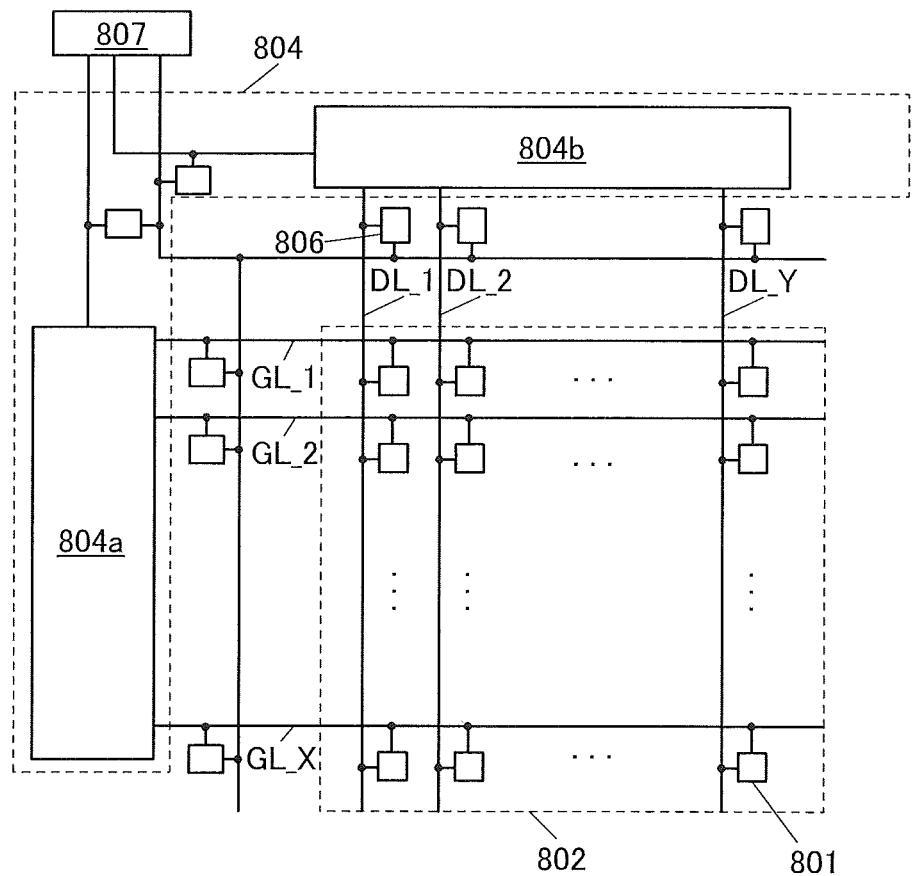
FIGS. 17A and 17B are a block diagram and a circuit diagram illustrating a display device of one embodiment of the present invention.
Figure 17B:
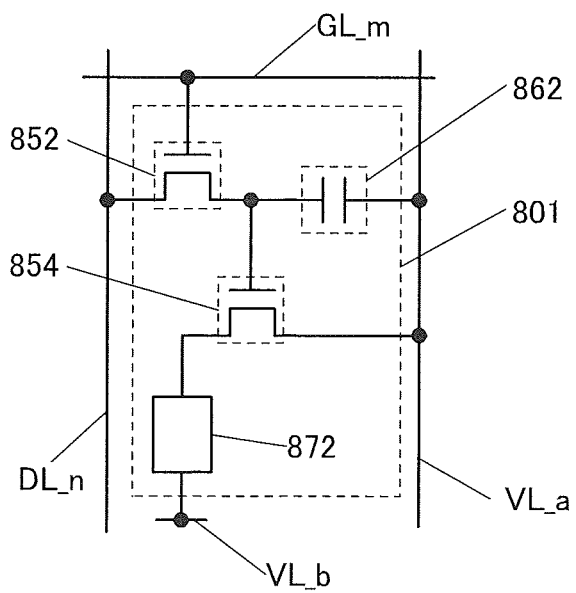

FIG. 17A is a block diagram illustrating the display device of one embodiment of the present invention, and FIG. 17B is a circuit diagram illustrating a pixel circuit of the display device of one embodiment of the present invention.

<Description of Display Device>

The display device illustrated in FIG. 17A includes a region including pixels of display elements (hereinafter the region is referred to as a pixel portion 802), a circuit portion provided outside the pixel portion 802 and including a circuit for driving the pixels (hereinafter the portion is referred to as a driver circuit portion 804), circuits having a function of protecting elements (hereinafter the circuits are referred to as protection circuits 806), and a terminal portion 807. Note that the protection circuits 806 are not necessarily provided.

Part or the whole of the driver circuit portion 804 is preferably formed over a substrate over which the pixel portion 802 is formed. Thus, the number of components and the number of terminals can be reduced. When part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes circuits for driving a plurality of display elements arranged in X rows (X is a natural number of 2 or more) and Y columns (Y is a natural number of 2 or more) (hereinafter such circuits are referred to as pixel circuits 801). The driver circuit portion 804 includes driver circuits such as a circuit for supplying a signal (scan signal) to select a pixel (hereinafter the circuit is referred to as a scan line driver circuit 804*a*) and a circuit for supplying a signal (data signal) to drive a display element in a pixel (hereinafter the circuit is referred to as a signal line driver circuit 804*b*).

The scan line driver circuit 804*a* includes a shift register or the like. The scan line driver circuit 804*a* receives a signal for driving the shift register through the terminal portion 807 and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (hereinafter such wirings are referred to as scan lines GL_1 to GL_X). Note that a plurality of scan line driver circuits 804*a* may be provided to control the scan lines GL_1 to GL_X separately. Alternatively, the scan line driver circuit 804*a* has a function of supplying an initialization signal. Not limited thereto, the scan line driver circuit 804*a* can supply another signal.

The signal line driver circuit 804*b* includes a shift register or the like. The signal line driver circuit 804*b* receives a signal (video signal) from which a data signal is derived, as well as a signal for driving the shift register, through the terminal portion 807. The signal line driver circuit 804*b* has a function of generating a data signal to be written in the pixel circuits 801 based on the video signal. In addition, the signal line driver circuit 804*b* has a function of controlling output of a data signal in response to a pulse signal produced by input of a start pulse signal, a clock signal, or the like. Further, the signal line driver circuit 804*b* has a function of controlling the potentials of wirings supplied with data signals (hereinafter such wirings are referred to as data lines DL_1 to DL_Y). Alternatively, the signal line driver circuit 804*b* has a function of supplying an initialization signal. Not limited thereto, the signal line driver circuit 804*b* can supply another signal.

Alternatively, the signal line driver circuit 804*b* is formed using a plurality of analog switches or the like, for example. The signal line driver circuit 804*b* can output, as the data signals, signals obtained by time-dividing the video signal by sequentially turning on the plurality of analog switches. The signal line driver circuit 804*b* may include a shift register or the like.

A pulse signal and a data signal are input, through one of the plurality of scan lines GL supplied with scan signals and one of the plurality of data lines DL supplied with data signals, respectively, to each of the plurality of the pixel circuits 801. Writing and holding of the data signal in each of the plurality of pixel circuits 801 are controlled by the scan line driver circuit 804*a*. For example, to the pixel circuit 801 in the m-th row and the n-th column (m is a natural number of less than or equal to X, and n is a natural number of less than or equal to Y), a pulse signal is input from the scan line driver circuit 804*a* through the scan line GL_nm, and a data signal is input from the signal line driver circuit 804*b* through the data line DL_n in accordance with the potential of the scan line GL_m.

The protection circuit 806 shown in FIG. 17A is connected to, for example, the scan line GL between the scan line driver circuit 804*a* and the pixel circuits 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be electrically connected to a wiring between the signal line driver circuit 804*b* and the terminal portion 807. Note that the terminal portion 807 means a portion having terminals for inputting power, control signals, and video signals to the display device from external circuits.

The protection circuit 806 is a circuit which electrically conducts a wiring connected to the protection circuit to another wiring when a potential out of a certain range is supplied to the wiring connected to the protection circuit.

As illustrated in FIG. 17A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, the protection circuit 806 may be configured to be connected to the scan line driver circuit 804a or the protection circuit 806 may be configured to be connected to the signal line driver circuit 804b. Alternatively, the protection circuit 806 may be configured to be connected to the terminal portion 807.

In FIG. 17A, an example in which the driver circuit portion 804 includes the scan line driver circuit 804a and the signal line driver circuit 804b is illustrated; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 17A can have the structure illustrated in FIG. 17B, for example.

The pixel circuit 801 illustrated in FIG. 17B includes transistors 852 and 854, a capacitor 862, and a light-emitting element 872.

One of a source electrode and a drain electrode of the transistor 852 is electrically connected to a wiring to which a data signal is supplied (hereinafter referred to as a data line DL_n). A gate electrode of the transistor 852 is electrically connected to a wiring to which a gate signal is supplied (hereinafter referred to as a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Further, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 and 2 can be used.

A high power supply potential VDD is supplied to one of the potential supply line VL_a and the potential supply line VL_b, and a low power supply potential VSS is supplied to the other.

For example, in the display device including the pixel circuit 801 in FIG. 17B, the pixel circuits 801 are sequentially selected row by row by the scan line driver circuit 804a illustrated in FIG. 17A, whereby the transistor 852 is turned on and a data signal is written.

When the transistor 852 is turned off, the pixel circuits 801 in which the data has been written are brought into a holding state. Further, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 18A and 18B and FIGS. 19A and 19B illustrate examples of the pixel circuit.

Figure 18A:
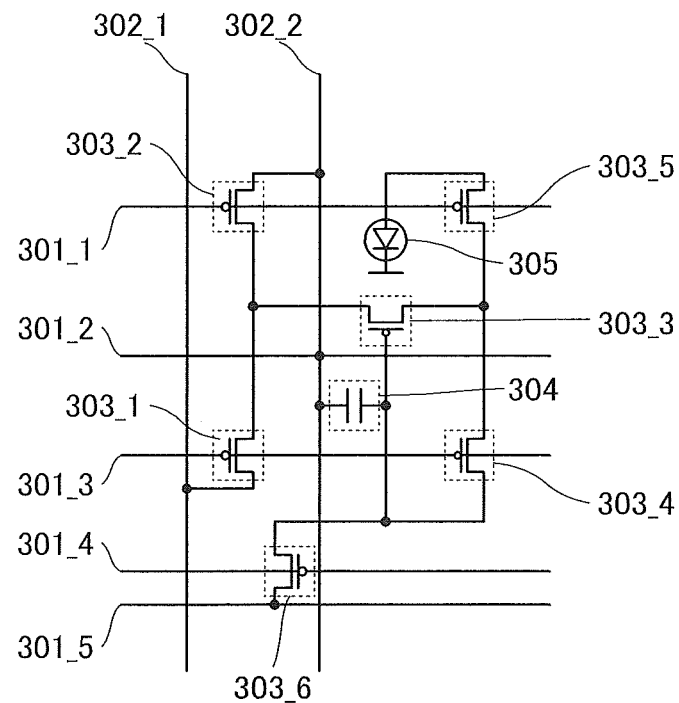
FIGS. 18A and 18B are circuit diagrams each illustrating a pixel circuit of a display device of one embodiment of the present invention.

The pixel circuit illustrated in FIG. 18A includes six transistors (transistors 303_1 to 303_6), a capacitor 304, and a light-emitting element 305. The pixel circuit illustrated in FIG. 18A is electrically connected to wirings 301_1 to 301_5 and wirings 302_1 and 302_2. Note that as the transistors 303_1 to 303_6, for example, p-channel transistors can be used.

Figure 18B:
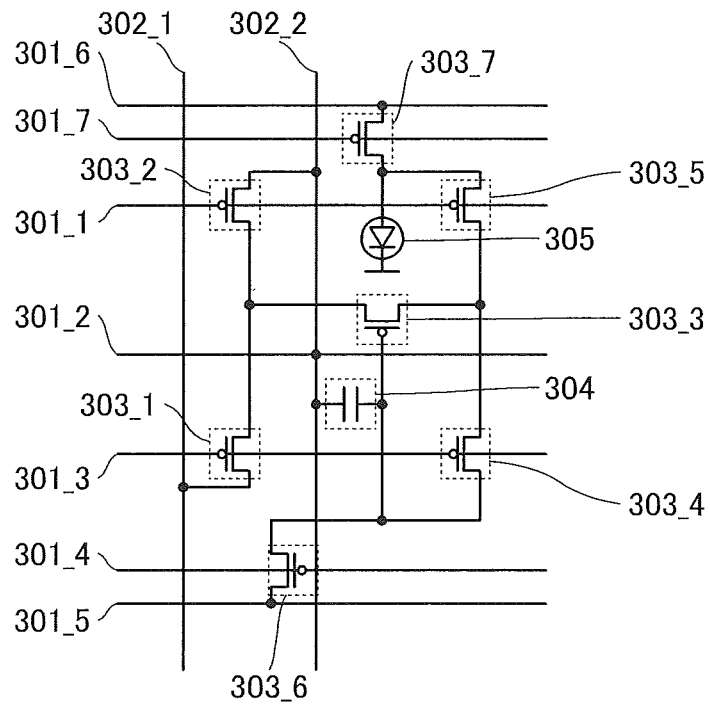

The pixel circuit shown in FIG. 18B has a configuration in which a transistor 303_7 is added to the pixel circuit shown in FIG. 18A. The pixel circuit illustrated in FIG. 18B is electrically connected to wirings 301_6 and 301_7. The wirings 301_5 and 301_6 may be electrically connected to each other. Note that as the transistor 303_7, for example, a p-channel transistor can be used.

Figure 19A:
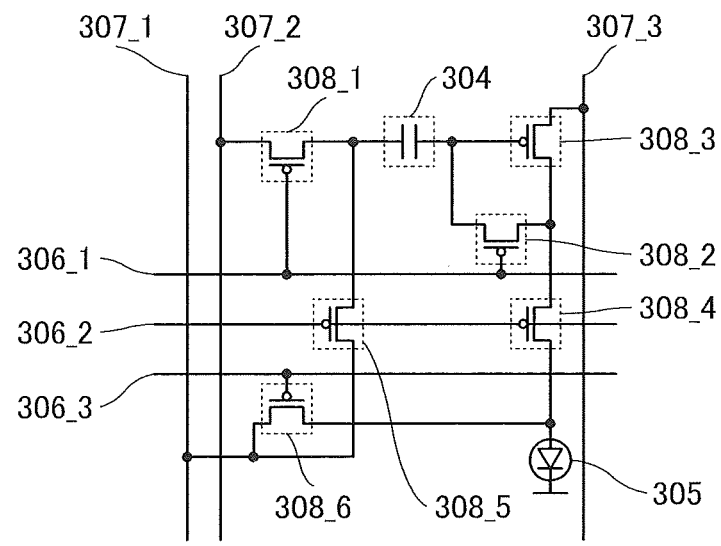
FIGS. 19A and 19B are circuit diagrams each illustrating a pixel circuit of a display device of one embodiment of the present invention.

The pixel circuit shown in FIG. 19A includes six transistors (transistors 308_1 to 308_6), the capacitor 304, and the light-emitting element 305. The pixel circuit illustrated in FIG. 19A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 19B:
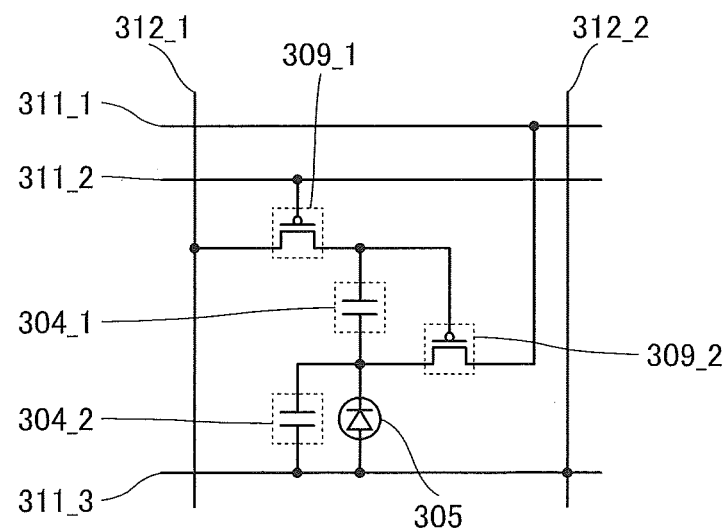

The pixel circuit illustrated in FIG. 19B includes two transistors (transistors 309_1 and 309_2), two capacitors (capacitors 304_1 and 304_2), and the light-emitting element 305. The pixel circuit illustrated in FIG. 19B is electrically connected to wirings 311_1 to 311_3 and wirings 312_1 and 312_2. With the configuration of the pixel circuit illustrated in FIG. 19B, the pixel circuit illustrated in FIG. 19B can be driven by a voltage inputting current driving method (also referred to as CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also various active elements (non-linear elements) can be used. For example, a metal insulator metal (MIM) or a thin film diode (TFD) can also be used. Since these elements can be formed with a smaller number of manufacturing steps, manufacturing costs can be reduced or yield can be improved. Alternatively, since the size of the element is small, the aperture ratio can be improved, leading to lower power consumption or higher luminance.

As a method other than the active matrix method, the passive matrix method in which an active element (a non-linear element) is not used can also be used. Since an active element (a non-linear element) is not used, the number of manufacturing steps is small, so that manufacturing costs can be reduced or yield can be improved. Alternatively, since an active element (a non-linear element) is not used, the aperture ratio can be improved, leading to lower power consumption, higher luminance, or the like.

Note that the structure described in this embodiment can be combined as appropriate with any of the structures described in the other embodiments and the examples.

(Embodiment 5)

In this embodiment, a display device including a light-emitting element of one embodiment of the present invention and an electronic device in which the display device is provided with an input device will be described with reference to FIGS. 20A and 20B, FIGS. 21A to 21C, FIGS. 22A and 22B, FIGS. 23A and 23B, and FIG. 24.

<Description 1 of Touch Panel>

In this embodiment, a touch panel 2000 including a display device and an input device will be described as an example of an electronic device. In addition, an example in which a touch sensor is used as an input device will be described.

Figure 20A:
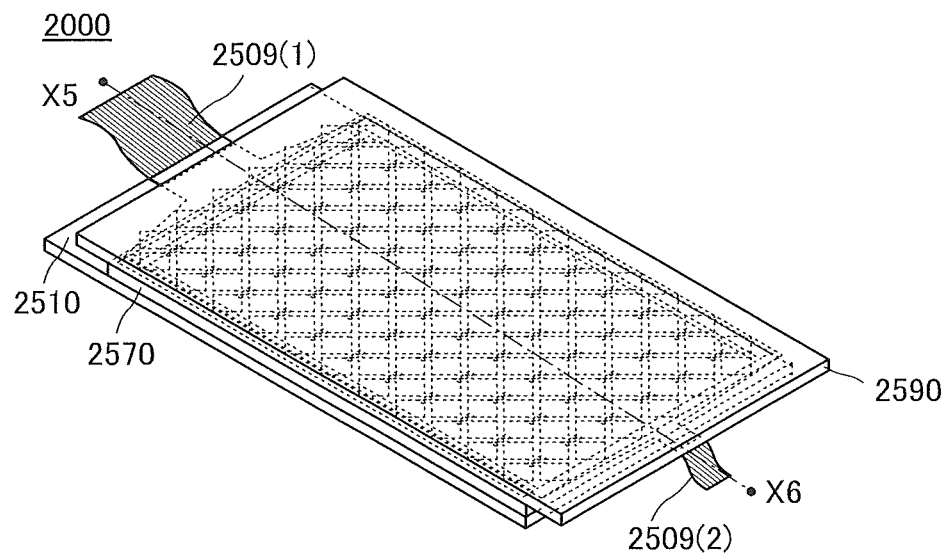
FIGS. 20A and 20B are perspective views of an example of a touch panel of one embodiment of the present invention.
Figure 20B:
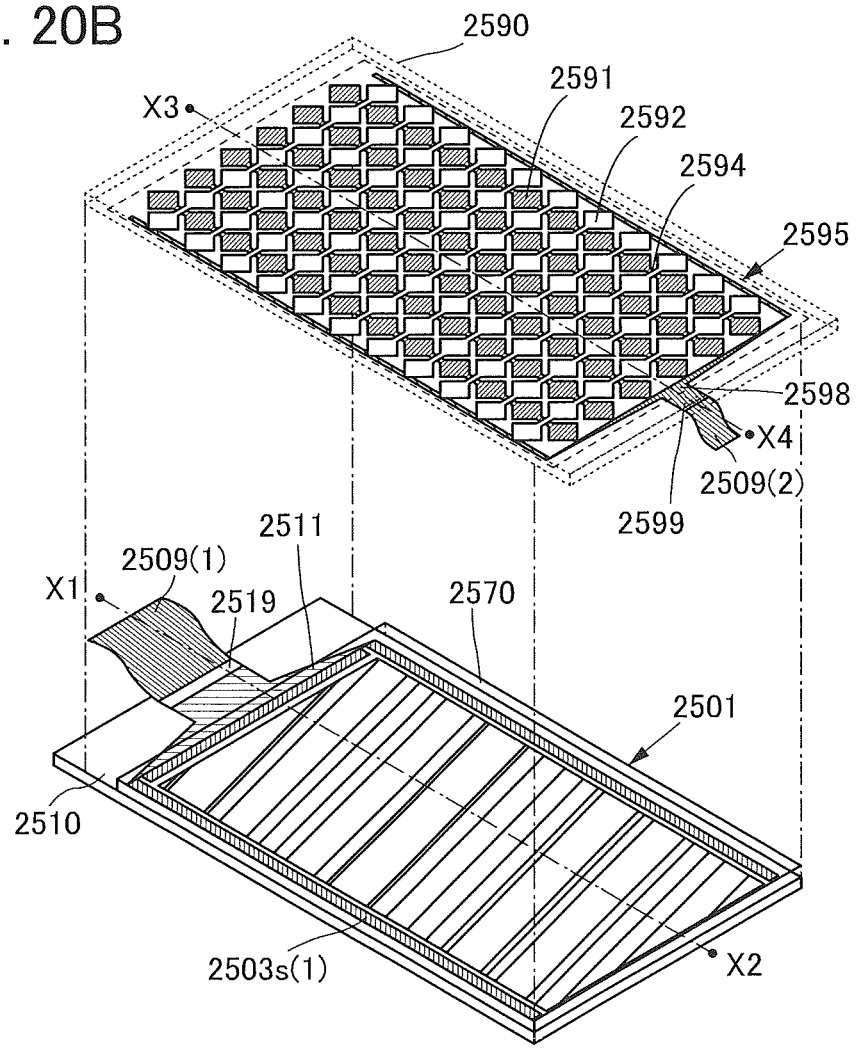

FIGS. 20A and 20B are perspective views of the touch panel 2000. Note that FIGS. 20A and 20B illustrate only main components of the touch panel 2000 for simplicity.

The touch panel 2000 includes a display device 2501 and a touch sensor 2595 (see FIG. 20B). The touch panel 2000 also includes a substrate 2510, a substrate 2570, and a substrate 2590. The substrates 2510, 2570, and 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 form a terminal 2519. The terminal 2519 is electrically connected to an FPC 2509(1). The plurality of wirings 2511 can supply signals from a signal line driver circuit 2503s(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and part of the plurality of wirings 2598 form a terminal. The terminal is electrically connected to an FPC 2509(2). Note that in FIG. 20B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 20B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 20A and 20B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region in which the electrodes are not provided, reducing variation in transmittance. As a result, variation in luminance of light passing through the touch sensor 2595 can be reduced.

Note that the shapes of the electrodes 2591 and 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 21A:
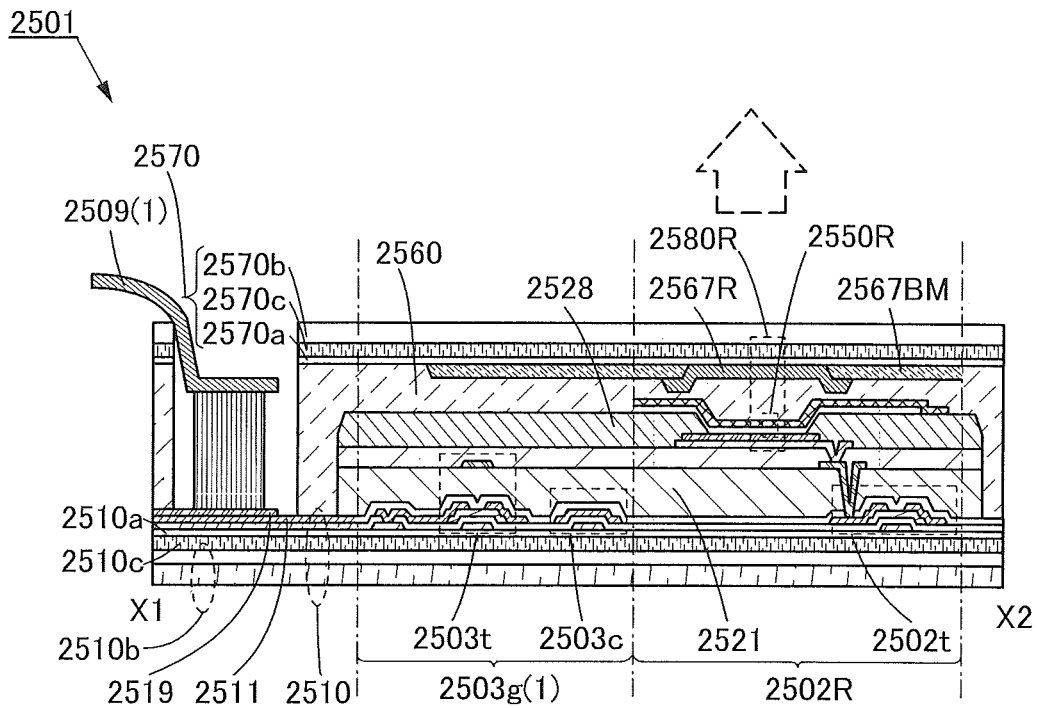
FIGS. 21A to 21C are cross-sectional views of examples of a display device and a touch sensor of one embodiment of the present invention.

Next, the display device 2501 is described in detail with reference to FIG. 21A. FIG. 21A corresponds to a cross-sectional view taken along dashed-dotted line X1-X2 in FIG. 20B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrates 2510 and 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrates 2510 and 2570. For example, the coefficients of linear expansion of the materials are favorably lower than or equal to $1\times10^{-3}$/K, preferably lower than or equal to $5\times10^{-5}$/K and further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510e for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layers 2510c and 2570c, for example, materials that include polyester, polyolefin, polyamide (e.g., nylon, aramid), polyimide, polycarbonate, an acrylic resin, polyurethane, an epoxy resin, or a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 21A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrates 2510 and 2570, the sealing layer 2560, and the sealant. Note that an inert gas (such as nitrogen or argon) may be used instead of the sealing layer 2560. A drying agent may be provided in the inert gas so as to adsorb moisture or the like. An ultraviolet curable resin or a heat curable resin may be used. For example, an epoxy-based resin or a glass frit is preferably used as the sealant. As a material used for the sealant, a material which is impermeable to moisture or oxygen is favorably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 and 2 can be used, for example.

A microcavity structure may be formed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 21A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an ink-jet method, an etching method using a photolithography technique, or the like.

An insulating layer 2521 is provided in the display device 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition wall 2528 is provided so as to overlap with an end portion of the lower electrode of the light-emitting element 2550R. Note that a spacer for controlling the distance between the substrate 2510 and the substrate 2570 may be formed over the partition wall 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 21B:
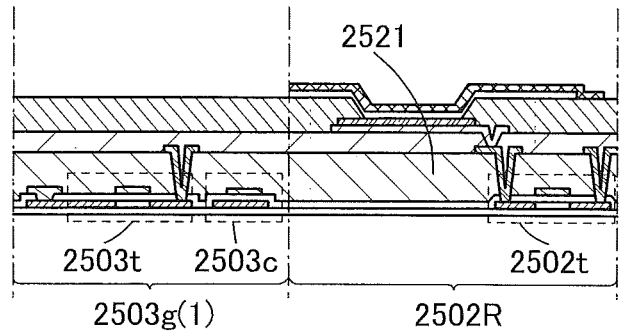

In the display device 2501, transistors with any of a variety of structures can be used. FIG. 21A illustrates an example of using bottom-gate transistors; however, the present invention is not limited to this example, and top-gate transistors may be used in the display device 2501 as illustrated in FIG. 21B.

In addition, there is no particular limitation on the polarity of the transistors 2502t and 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. It is preferable to use an oxide semiconductor that has an energy gap of 2 eV or more, preferably 2.5 eV or more and further preferably 3 eV or more, for one of the transistors 2502t and 2503t, so that the off-state current of the transistors can be reduced. Examples of the oxide semiconductor include an In—Ga oxide and an In-M-Zn oxide (M represents Al, Ga, Y, Zr, La, Ce, Sn, Hf, or Nd).

<Description of Touch Sensor>

Figure 21C:
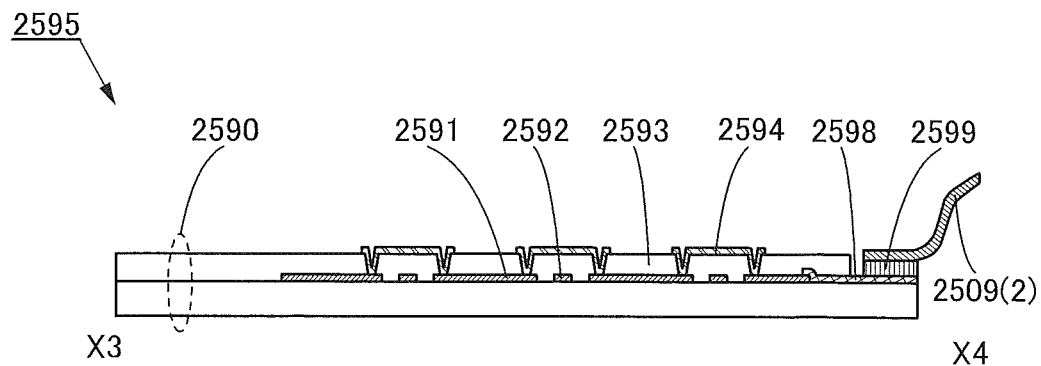

Next, the touch sensor 2595 is described in detail with reference to FIG. 21C. FIG. 21C corresponds to a cross-sectional view taken along dashed-dotted line X3-X4 in FIG. 20B.

The touch sensor 2595 includes the electrodes 2591 and 2592 provided in a staggered arrangement on the substrate 2590, an insulating layer 2593 covering the electrodes 2591 and 2592, and the wiring 2594 that electrically connects the adjacent electrodes 2591 to each other.

The electrodes 2591 and 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The electrodes 2591 and 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 22A:
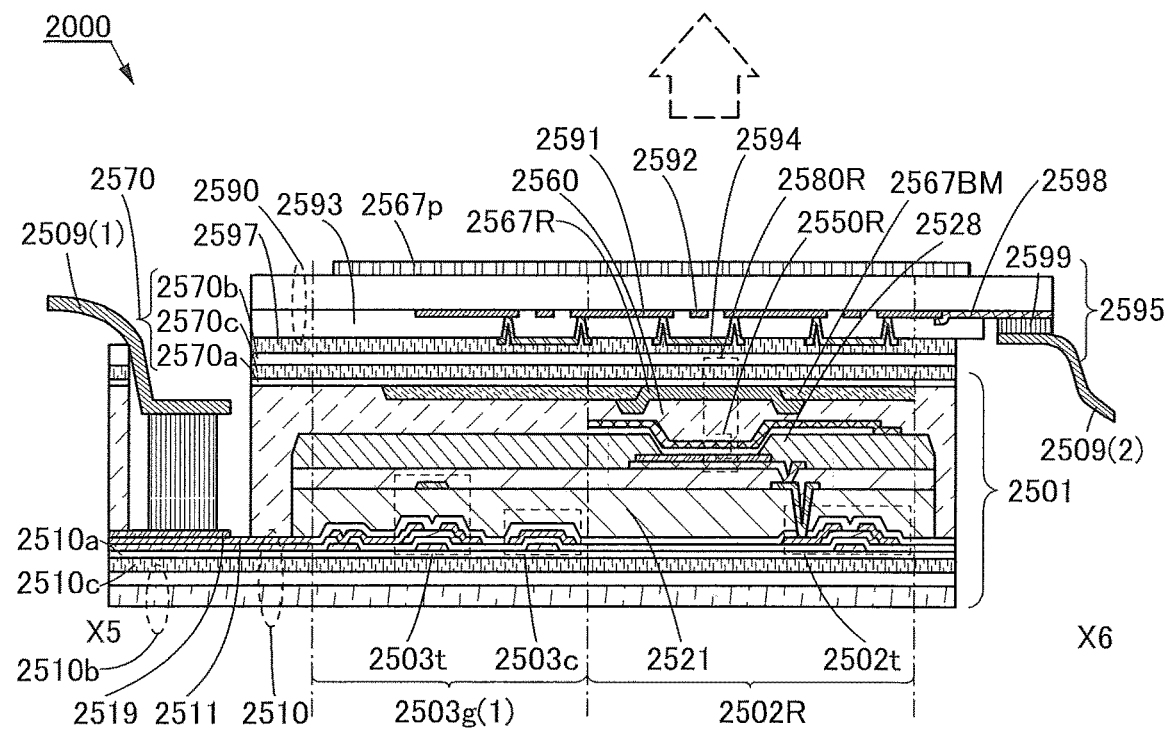
FIGS. 22A and 22B illustrate examples of a touch panel of one embodiment of the present invention.

Next, the touch panel 2000 is described in detail with reference to FIG. 22A. FIG. 22A corresponds to a cross-sectional view taken along dashed-dotted line X5-X6 in FIG. 20A.

In the touch panel 2000 illustrated in FIG. 22A, the display device 2501 described with reference to FIG. 21A and the touch sensor 2595 described with reference to FIG. 21C are attached to each other.

The touch panel 2000 illustrated in FIG. 22A includes an adhesive layer 2597 and an anti-reflective layer 2567p in addition to the components described with reference to FIGS. 21A and 21C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 22A is described with reference to FIG. 22B.

Figure 22B:
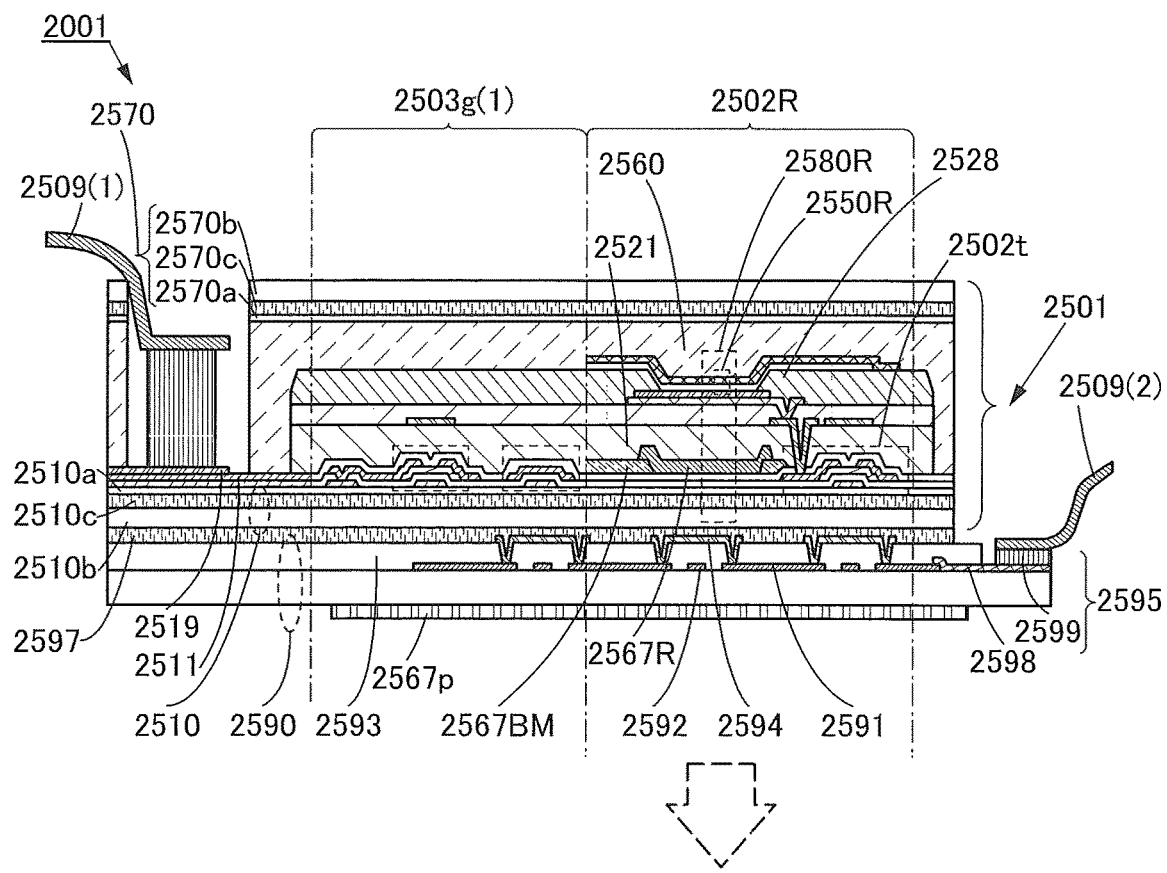

FIG. 22B is a cross-sectional view of a touch panel 2001. The touch panel 2001 illustrated in FIG. 22B differs from the touch panel 2000 illustrated in FIG. 22A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 22B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 22B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 22A or 22B, light may be emitted from the light-emitting element to one of upper and lower sides, or both, of the substrate.

<Description of Method for Driving Touch Panel>

Next, an example of a method for driving a touch panel is described with reference to FIGS. 23A and 23B.

Figure 23A:
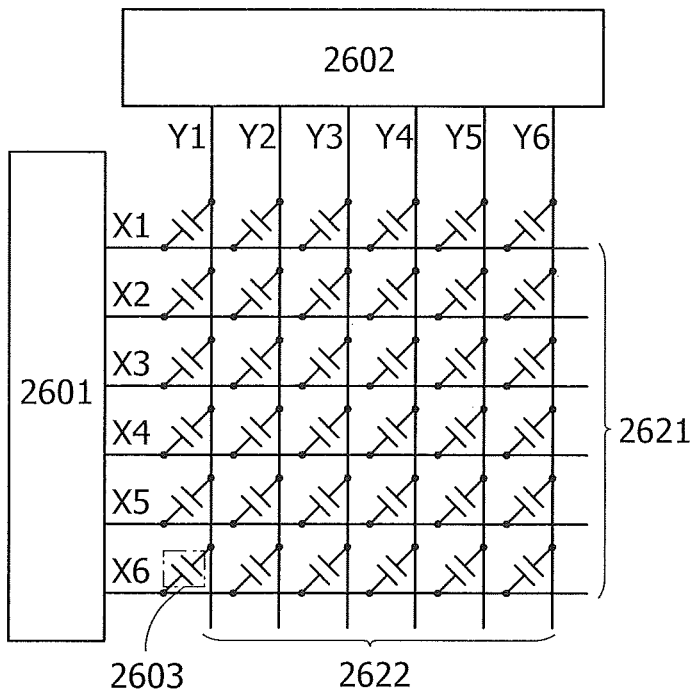
FIGS. 23A and 23B are a block diagram and a timing chart of a touch sensor of one embodiment of the present invention.

FIG. 23A is a block diagram illustrating the structure of a mutual capacitive touch sensor. FIG. 23A illustrates a pulse voltage output circuit 2601 and a current sensing circuit 2602. Note that in FIG. 23A, six wirings X1 to X6 represent the electrodes 2621 to which a pulse voltage is applied, and six wirings Y1 to Y6 represent the electrodes 2622 that detect changes in current. FIG. 23A also illustrates capacitors 2603 that are each formed in a region in which the electrodes 2621 and 2622 overlap with each other. Note that functional replacement between the electrodes 2621 and the electrodes 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and the electrodes 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 23B:
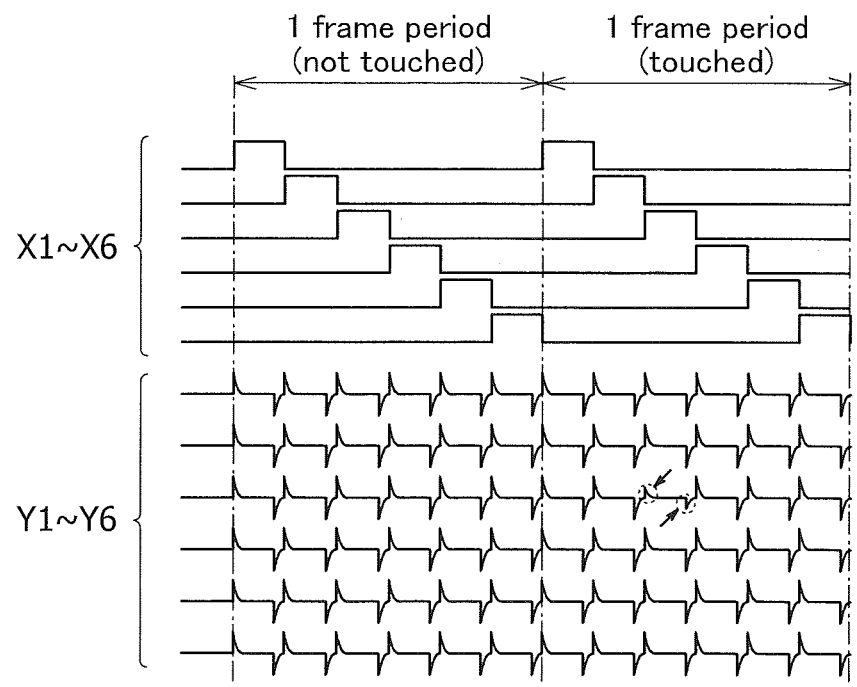

FIG. 23B is a timing chart showing input and output waveforms in the mutual capacitive touch sensor illustrated in FIG. 23A. In FIG. 23B, sensing of a sensing target is performed in all the rows and columns in one frame period. FIG. 23B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 24:
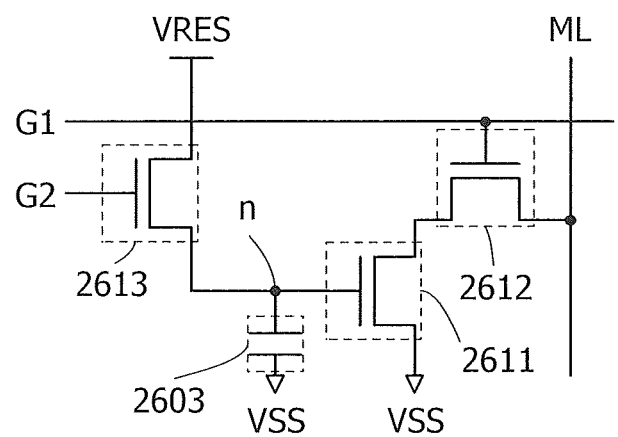
FIG. 24 is a circuit diagram of a touch sensor of one embodiment of the present invention.

Although FIG. 23A illustrates a passive matrix type touch sensor in which only the capacitor 2603 is provided at the intersection of wirings as a touch sensor, an active matrix type touch sensor including a transistor and a capacitor may be used. FIG. 24 illustrates an example of a sensor circuit included in an active matrix type touch sensor.

The sensor circuit in FIG. 24 includes the capacitor 2603 and a transistor 2611, a transistor 2612, and a transistor 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 24 is described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

Note that the structure described in this embodiment can be combined as appropriate with any of the structures described in the other embodiments and the examples.

(Embodiment 6)

In this embodiment, a display module and electronic devices including a light-emitting element of one embodiment of the present invention will be described with reference to FIG. 25 and FIGS. 26A to 26G.

<Description of Display Module>

Figure 25:
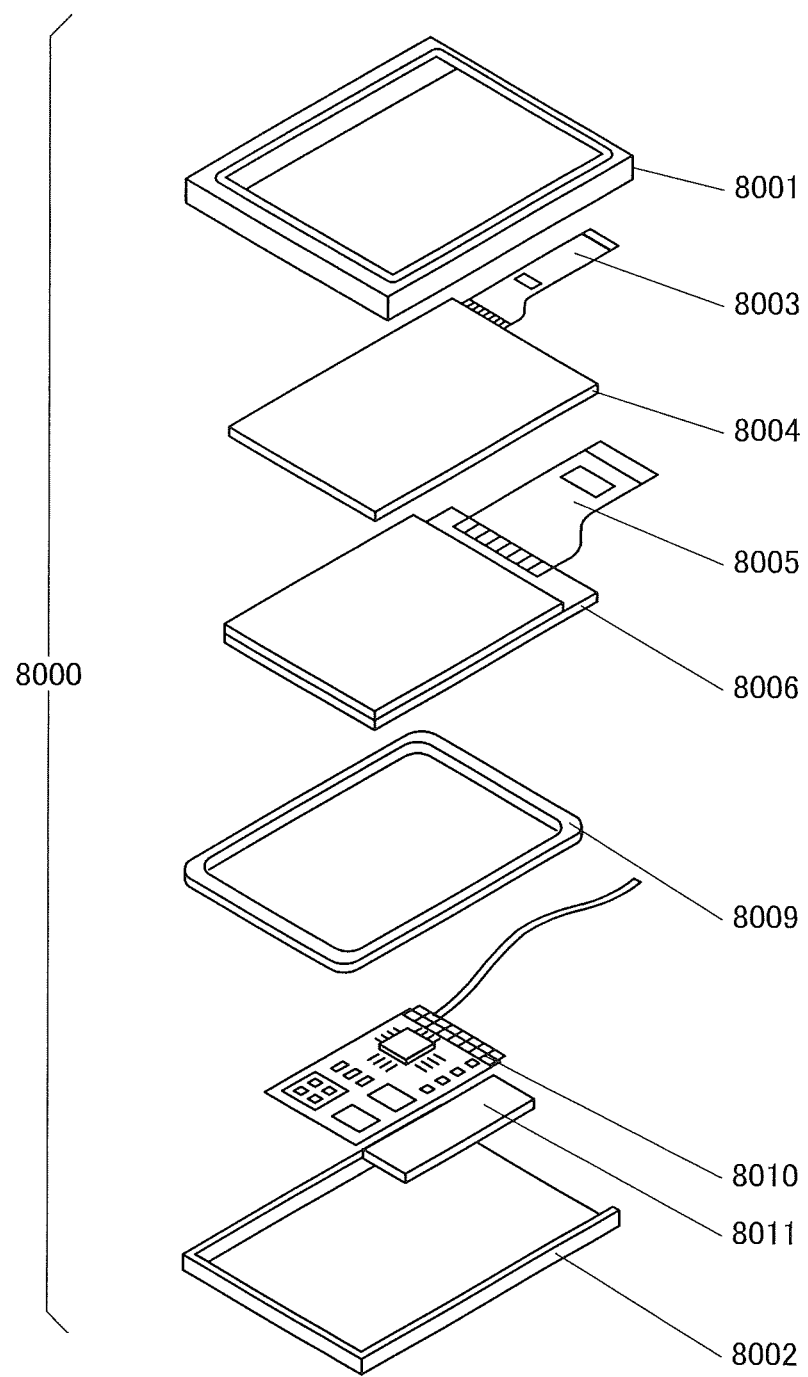
FIG. 25 is a perspective view of a display module of one embodiment of the present invention.

In a display module 8000 in FIG. 25, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Description of Electronic Device>

FIGS. 26A to 26G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 26A to 26G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 26A to 26G are not limited to those described above, and the electronic devices can have a variety of functions. Although not illustrated in FIGS. 26A to 26G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 26A to 26G is described in detail below.

Figure 26A:
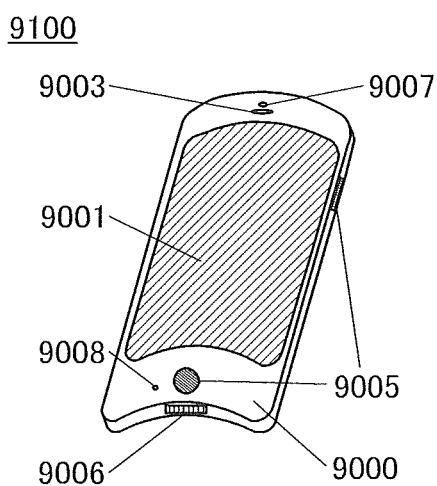
FIGS. 26A to 26G illustrate electronic devices of one embodiment of the present invention.

FIG. 26A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 26D:
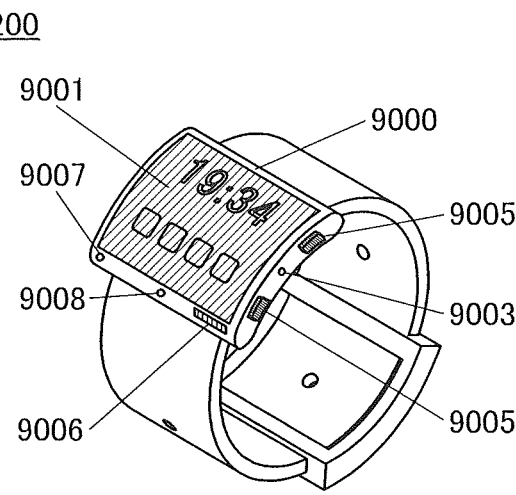
Figure 26B:
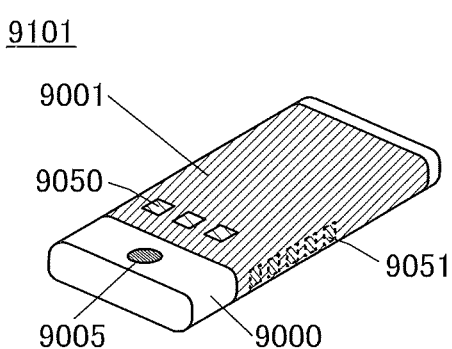

FIG. 26B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in FIG. 26B, can be positioned in the portable information terminal 9101 as in the portable information terminal 9100 illustrated in FIG. 26A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 26E:
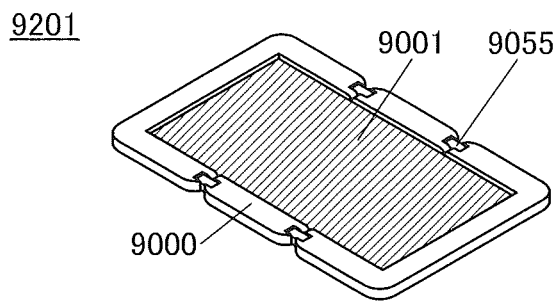
Figure 26C:
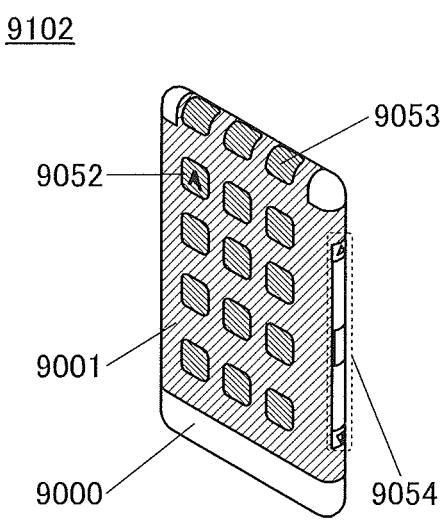

FIG. 26C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 26D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 26F:
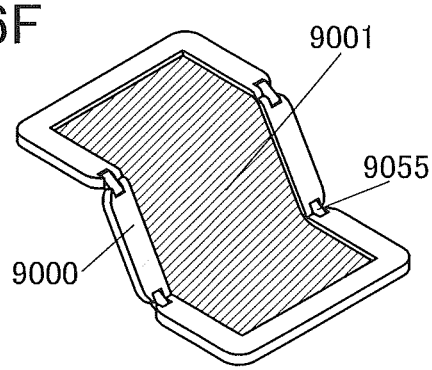
Figure 26G:
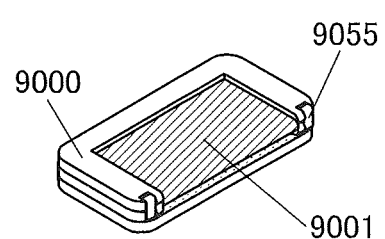

FIGS. 26E, 26F, and 26G are perspective views of a foldable portable information terminal 9201. FIG. 26E is a perspective view illustrating the portable information terminal 9201 that is opened. FIG. 26F is a perspective view illustrating the portable information terminal 9201 that is being opened or being folded. FIG. 26G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

Note that the structure described in this embodiment can be combined as appropriate with any of the structures described in the other embodiments and the examples.

(Embodiment 7)

In this embodiment, the light-emitting device of one embodiment of the present invention will be described with reference to FIGS. 27A to 27C.

Figure 27A:
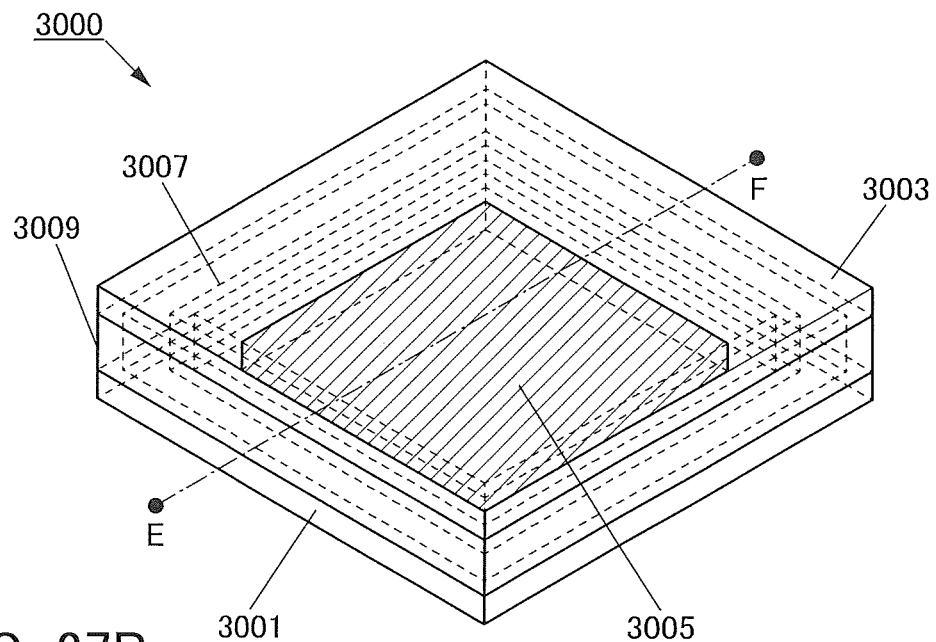
FIGS. 27A to 27C are a perspective view and schematic cross-sectional views illustrating light-emitting devices of one embodiment of the present invention.
Figure 27B:
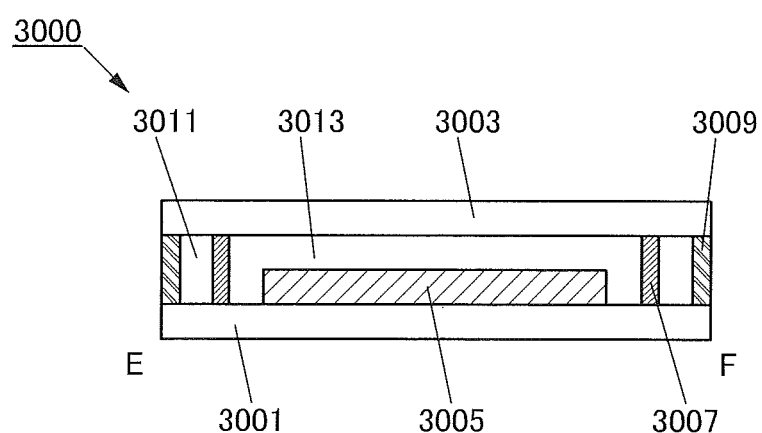

FIG. 27A is a perspective view of a light-emitting device 3000 shown in this embodiment, and FIG. 27B is a cross-sectional view along dashed-dotted line E-F in FIG. 27A. Note that in FIG. 27A, some components are illustrated by broken lines in order to avoid complexity of the drawing.

The light-emitting device 3000 illustrated in FIGS. 27A and 27B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 27A and 27B, a structure in which light is emitted from the light-emitting element 3005 to the lower side (the substrate 3001 side) is illustrated.

As illustrated in FIGS. 27A and 27B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 27B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in Embodiment 1, respectively. The light-emitting element 3005 can have a structure similar to that of any of the light-emitting elements having electrode structures described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon, aramid), polyimide, polycarbonate, an acrylic resin, polyurethane, an epoxy resin, or a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 27B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 27C:
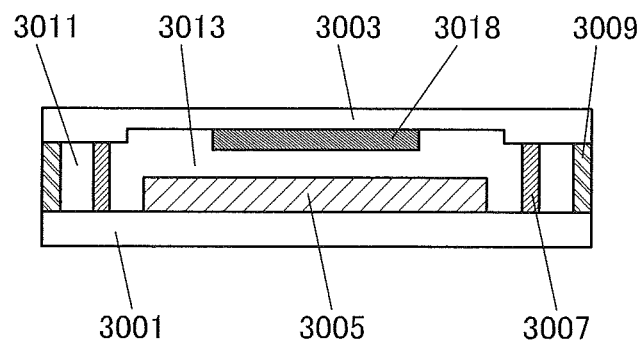

FIG. 27C illustrates a modification example of the structure in FIG. 27B. FIG. 27C is a cross-sectional view illustrating the modification example of the light-emitting device 3000.

FIG. 27C illustrates a structure in which a desiccant 3018 is provided in a recessed portion provided in part of the substrate 3003. The other components are the same as those of the structure illustrated in FIG. 27B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 27B are described with reference to FIGS. 28A to 28D. Note that FIGS. 28A to 28D are cross-sectional views illustrating the modification examples of the light-emitting device 3000 illustrated in FIG. 27B.

In each of the light-emitting devices illustrated in FIGS. 28A to 28D, the second sealing region 3009 is not provided but only the first sealing region 3007 is provided. Moreover, in each of the light-emitting devices illustrated in FIGS. 28A to 28D, a region 3014 is provided instead of the second region 3013 illustrated in FIG. 27B.

For the region 3014, for example, materials that include polyester, polyolefin, polyamide (e.g., nylon or aramid), polyimide, polycarbonate, polyurethane, an acrylic resin, an epoxy resin, or a resin having a siloxane bond can be used.

When the above-described material is used for the region 3014, what is called a solid-sealing light-emitting device can be obtained.

Figure 28A:
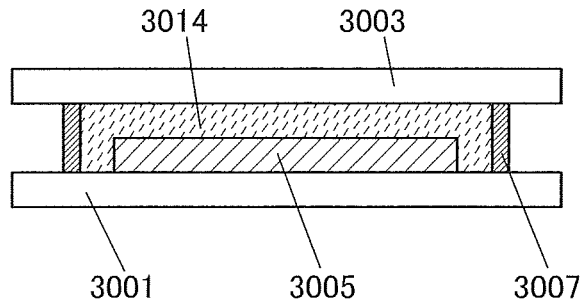
FIGS. 28A to 28D are schematic cross-sectional views each illustrating a light-emitting device of one embodiment of the present invention.
Figure 28B:
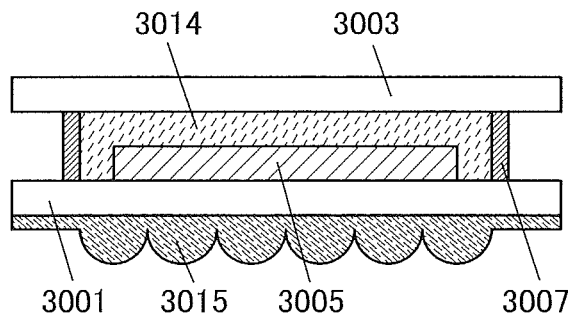

In the light-emitting device illustrated in FIG. 28B, a substrate 3015 is provided on the substrate 3001 side of the light-emitting device illustrated in FIG. 28A.

The substrate 3015 has unevenness as illustrated in FIG. 28B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 28B, a substrate having a function as a diffusion plate may be provided.

Figure 28C:
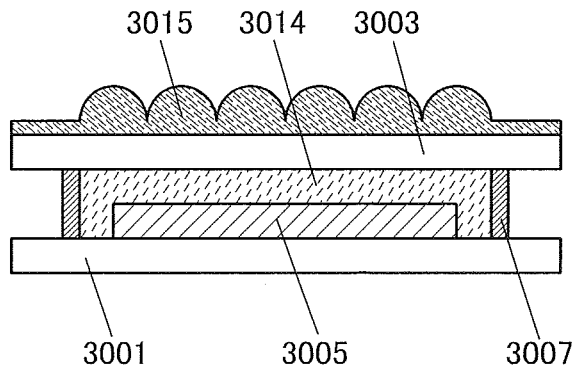

In the light-emitting device illustrated in FIG. 28C, light is extracted through the substrate 3003 side, unlike in the light-emitting device illustrated in FIG. 28A, in which light is extracted through the substrate 3001 side.

The light-emitting device illustrated in FIG. 28C includes the substrate 3015 on the substrate 3003 side. The other components are the same as those of the light-emitting device illustrated in FIG. 28B.

Figure 28D:
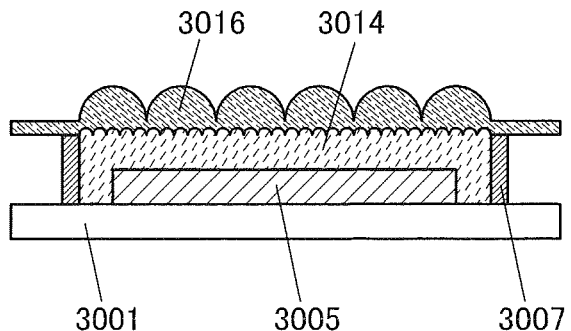

In the light-emitting device illustrated in FIG. 28D, the substrate 3003 and the substrate 3015 included in the light-emitting device illustrated in FIG. 28C are not provided but a substrate 3016 is provided.

The substrate 3016 includes first unevenness positioned closer to the light-emitting element 3005 and second unevenness positioned farther from the light-emitting element 3005. With the structure illustrated in FIG. 28D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments and the examples.

(Embodiment 8)

In this embodiment, examples in which the light-emitting device of one embodiment of the present invention is applied to various lighting devices and electronic devices will be described with reference to FIGS. 29A to 29C and FIG. 30.

An electronic device or a lighting device that has a light-emitting region with a curved surface can be obtained with the use of the light-emitting device of one embodiment of the present invention which is manufactured over a substrate having flexibility.

Furthermore, a light-emitting device to which one embodiment of the present invention is applied can also be applied to lighting for motor vehicles, examples of which are lighting for a dashboard, a windshield, a ceiling, and the like.

Figure 29A:
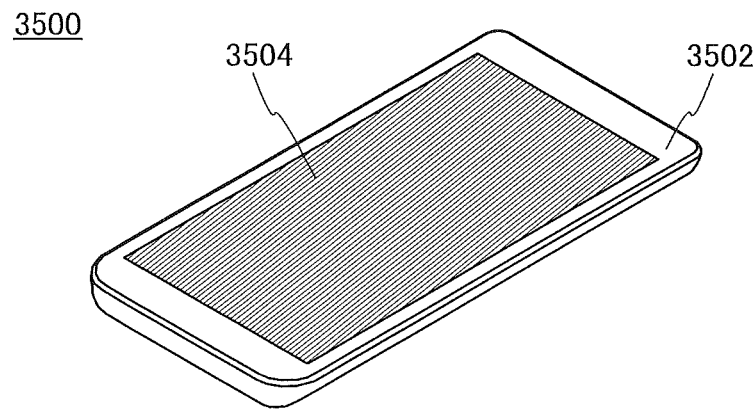
FIGS. 29A to 29C illustrate an electronic device and a lighting device of one embodiment of the present invention.
Figure 29B:
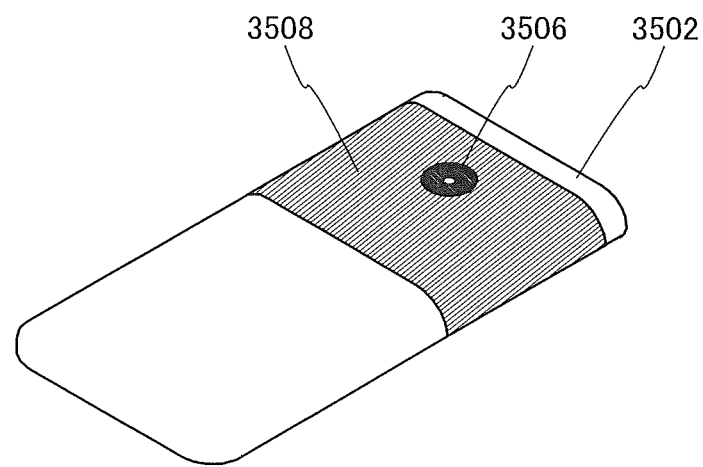

FIG. 29A is a perspective view illustrating one surface of a multifunction terminal 3500, and FIG. 29B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 29A and 29B can have a variety of functions as in the electronic devices illustrated in FIGS. 26A to 26G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 29C:
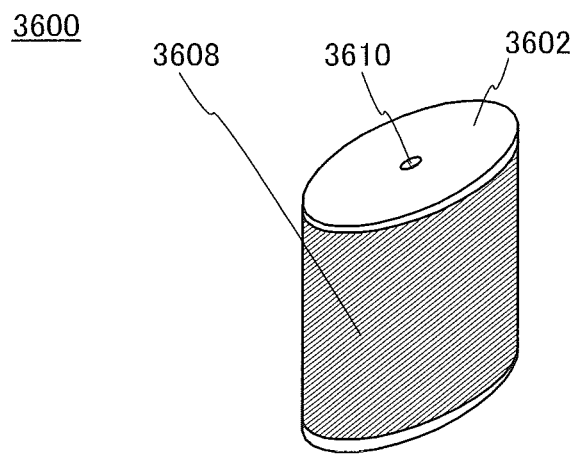

FIG. 29C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 30:
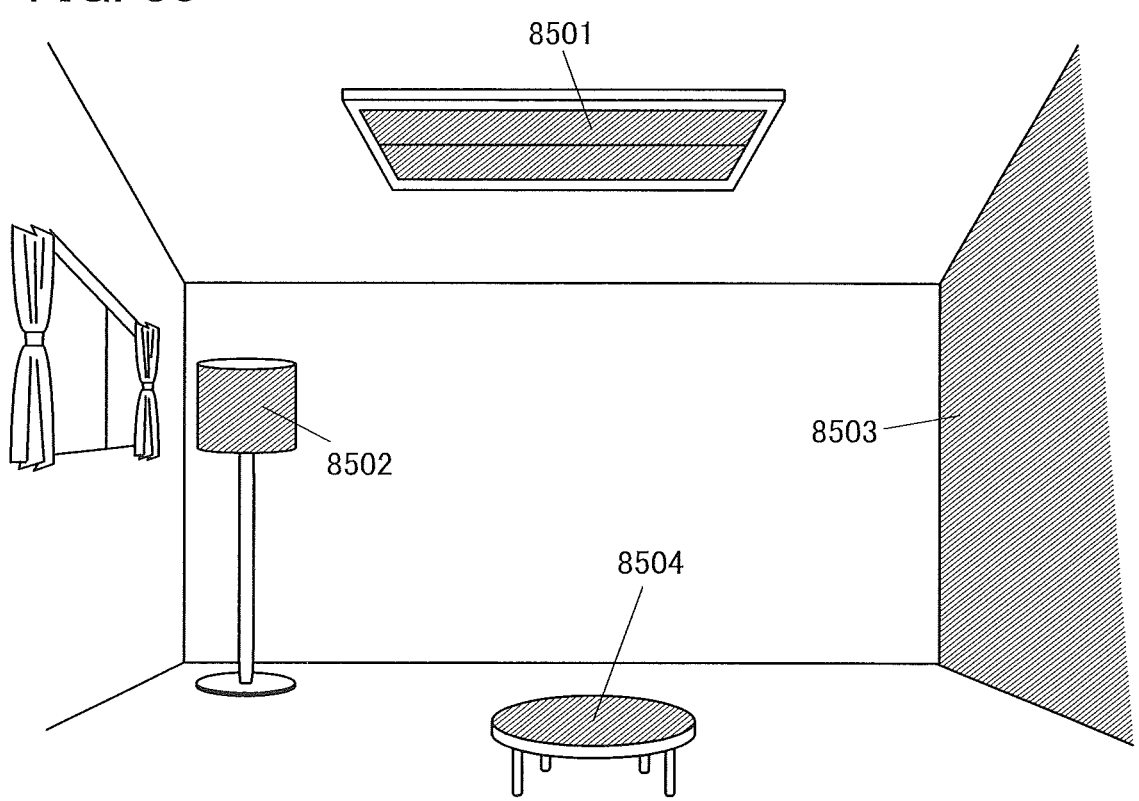
FIG. 30 illustrates lighting devices of one embodiment of the present invention.

FIG. 30 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for electronic devices in a variety of fields without being limited to the lighting devices and the electronic devices described in this embodiment.

Note that the structure described in this embodiment can be combined as appropriate with any of the structures described in the other embodiments and the examples.

EXAMPLE 1

In Example 1, an example of fabricating electrodes (an electrode 1 to an electrode 3) of one embodiment of the present invention and a comparative electrode 1 will be described. Note that the reference numerals and the like used in the light-emitting element 150 of Embodiment 1 in FIGS. 1A and 1B are used as those in Example 1, for example.

<1-1. Fabrication of Electrode 1>

As the conductive layer 101*a* of the electrode 101, an Al—Ni—La film was formed to a thickness of 200 nm over the substrate 200. Next, an In—Ga—Zn oxide film was formed to a thickness of 10 nm as the transparent conductive layer 101*b*_1, and an ITSO film was formed to a thickness of 10 nm as the transparent conductive layer 101*b*_2 to form the conductive layer 101*b* over and in contact with the conductive layer 101*a*. At this time, the In—Ga—Zn oxide film was formed using a sputtering target in which the atomic ratio of metal elements was In:Ga:Zn=1:1:1 and the deposition conditions were as follows: a flow rate of argon (Ar) of 45 sccm; a pressure of 0.4 Pa; a power of 0.5 kW; and a substrate temperature of 300° C. After the ITSO film was formed, bake treatment was performed at 250° C. and 300° C. for one hour. Through the above steps, the electrode 1 was fabricated.

<1-2. Fabrication of Electrode 2>

The fabrication method for the electrode 2 differs from the above-described fabrication method for the electrode 1 only in the step of forming the transparent conductive layer 101*b*_1, and other steps are the same as those of the electrode 1. Specifically, as the transparent conductive layer 101*b*_1, an In—Ga—Zn oxide film was formed using a sputtering target in which the atomic ratio of metal elements was In:Ga:Zn=1:3:6 and the deposition conditions were as follows: a flow rate of Ar of 45 sccm; a pressure of 0.4 Pa; a power of 0.5 kW; and a substrate temperature of 300° C.

<1-3. Fabrication of Electrode 3>

The fabrication method for the electrode 3 differs from the above-described fabrication method for the electrode 1 only in the step of forming the transparent conductive layer 101*b*_1, and other steps are the same as those of the electrode 1. Specifically, as the transparent conductive layer 101*b*_1, an In—Ga—Zn oxide film was formed using a sputtering target in which the atomic ratio of metal elements was In:Ga:Zn=3:1:2 and the deposition conditions were as follows: a flow rate of oxygen of 45 sccm; a pressure of 0.4 Pa; a power of 0.5 kW; and a substrate temperature of 300° C.

<1-4. Fabrication of Comparative Electrode 1>

The fabrication method for the comparative electrode 1 is the same as the above-described fabrication method for the electrode 1 except for the step of forming the transparent conductive layer 101*b*_1. Specifically, instead of the transparent conductive layer 101*b*_1, a Ti film was formed to a thickness of 6 nm and was then subjected to bake treatment at 300° C. for one hour to be oxidized; accordingly, a titanium oxide film was formed.

<1-5. Characteristics of Electrodes>

Figure 31:
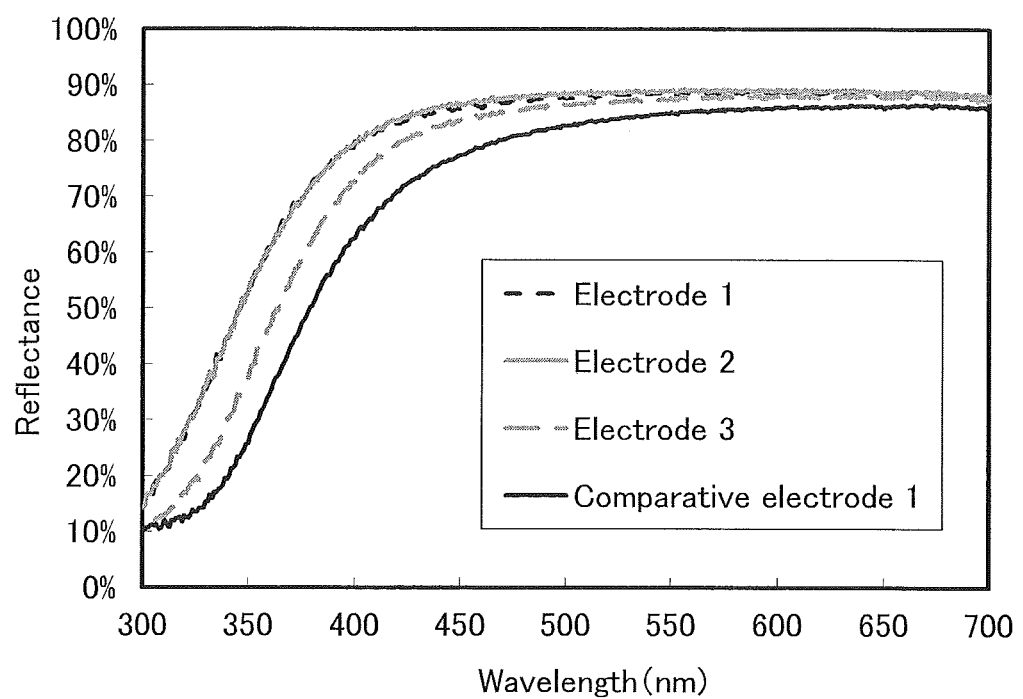
FIG. 31 is a graph showing reflectance of an electrode of Example.

The reflectance of each of the electrodes 1 to 3 and the comparative electrode 1 is shown in FIG. 31.

The electrodes 1 to 3 each have higher reflectance than the comparative electrode 1 and show excellent reflectance. Accordingly, an electrode having excellent reflectance can be formed by using one embodiment of the present invention for the electrode 101.

In the electrodes 1 to 3, neither electrolytic corrosion nor film separation occurred. Thus, it was found that the electrodes are stable electrodes which are suitable for electrodes of a light-emitting element.

The resistivity of the In—Ga—Zn oxide (1:1:1) fabricated as the transparent conductive layer 101*b*_1 using the electrode 1 was measured to be $5.5 \times 10^{-3}$ Ωm. Furthermore, the resistance of the In—Ga—Zn oxide (3:1:2) fabricated using the electrode 3 was too high to measure the resistivity. Furthermore, the resistivity of ITSO fabricated as the transparent conductive layer 101*b*_2 was $2.6 \times 10^{-3}$ Ωm.

Therefore, as in the electrodes 1 to 3, the transparent conductive layer 101*b*_1 is formed using In—Ga—Zn oxide and the transparent conductive layer 101*b*_2 is formed using ITSO, whereby the resistivity of the transparent conductive layer 101*b*_2 can be lower than that of the transparent conductive layer 101*b*_1. Moreover, it was found that the thickness of the transparent conductive layer 101*b*_2 is preferably larger than or equal to that of the transparent conductive layer 101*b*_1 to obtain favorable conductivity of the electrode 101. In addition, it can be said that the thickness of the transparent conductive layer 101*b*_1 is preferably 5 nm or more and 20 nm or less in consideration of the structures of the electrodes 1 to 3.

As described above, since the electrode including two transparent conductive layers of one embodiment of the present invention can have a structure with high reflectance and high conductivity, it is suitable for an electrode of a light-emitting element.

The structures described in Example 1 can be combined as appropriate with any of the structures described in the other examples and the embodiments.

EXAMPLE 2

Figure 32A:
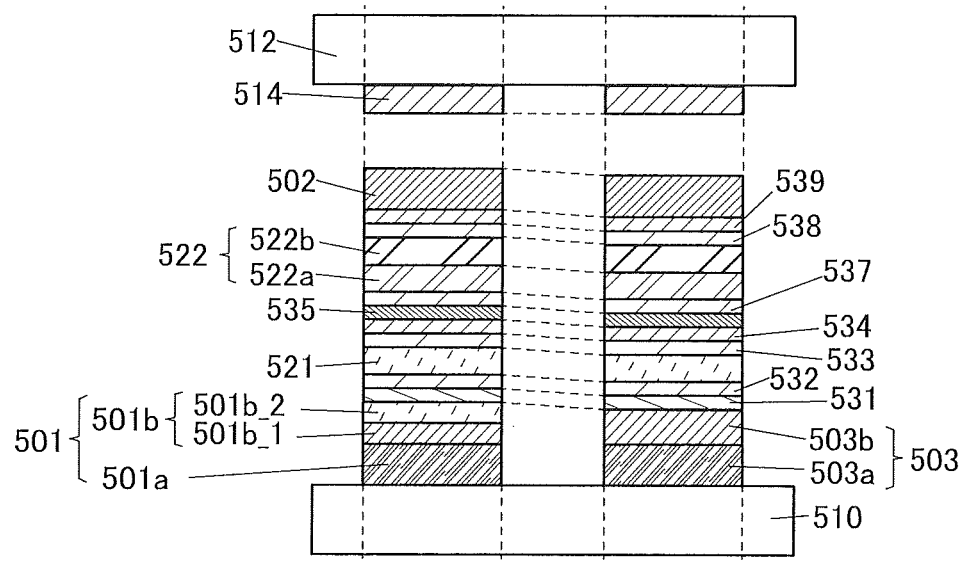
FIGS. 32A and 32B are schematic cross-sectional views illustrating light-emitting elements of Examples.

In Example 2, an example of fabricating light-emitting elements of one embodiment of the present invention (a light-emitting element 1 and a light-emitting element 2) will be described. A schematic cross-sectional view of the light-emitting elements fabricated in Example 2 is shown in FIG. 32A, the detailed structures of the light-emitting elements are shown in Table 4, and structures and abbreviations of the compounds used here are given below.

[Chemical Formulae 3]
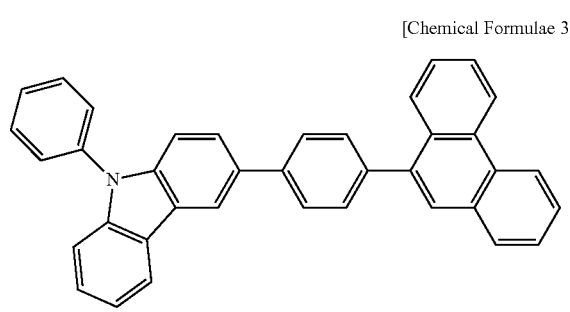
PCPPn
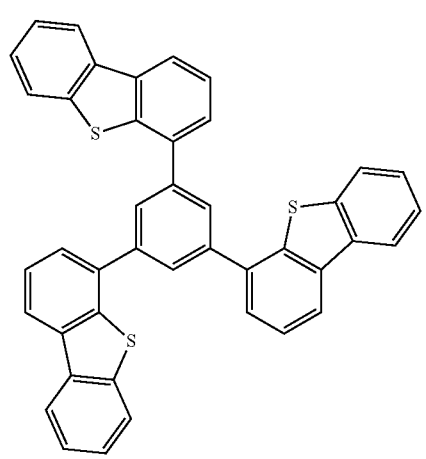
DBT3P-II
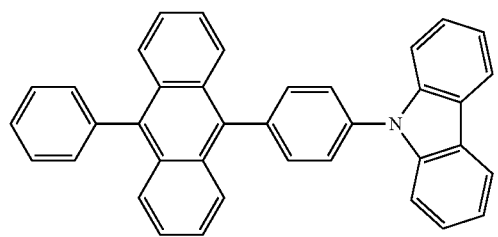
CzPA
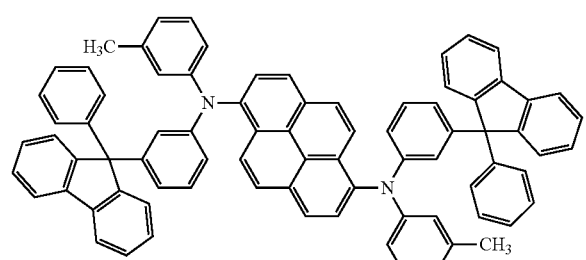
1,6mMemFLPAPrn
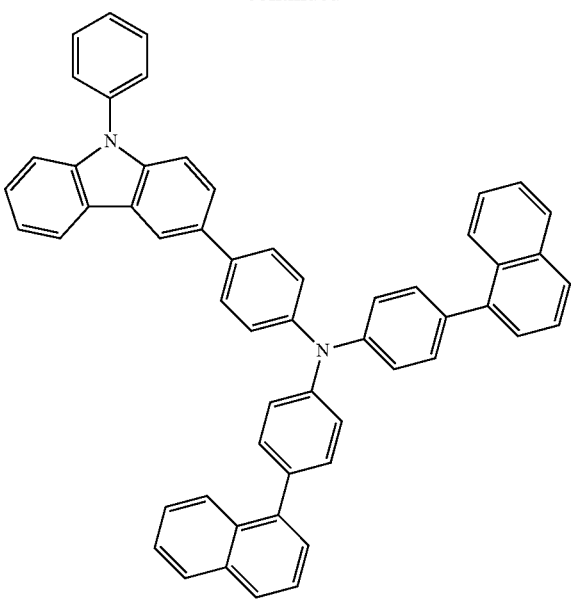
PCBNBB
BPAFLP
[Chemical Formulae 4]
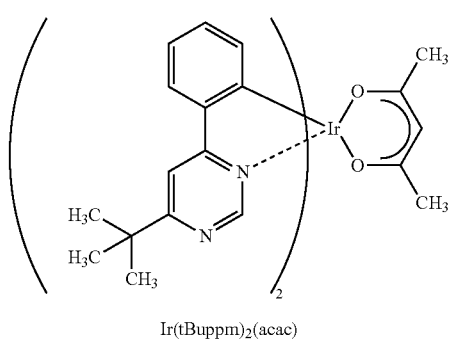
Ir(tBuppm)$_2$(acac)

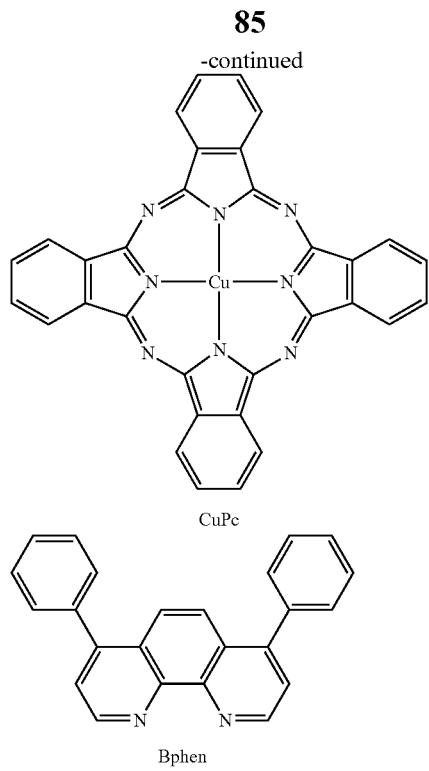

CuPc

Bphen

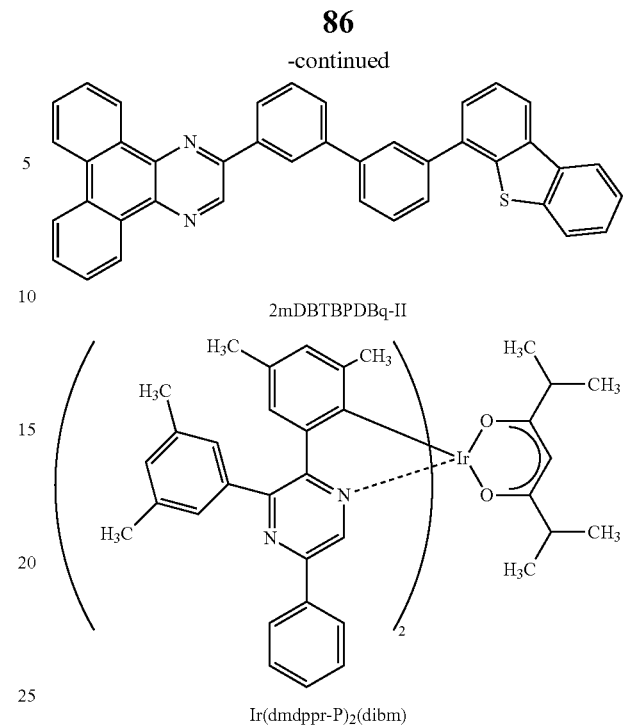

2mDBTBPDBq-II

Ir(dmdppr-P)₂(dibm)

TABLE 4

| | Layer | | Reference numeral | Thickness (nm) | Material | Weight ratio |
|---|---|---|---|---|---|---|
| Light-emitting element 1 | Optical element | | 514 | — | CF (Green) | — |
| | Electrode | | 502(2) | 70 | ITO | — |
| | | | 502(1) | 15 | Ag:Mg | 1:0.1*1) |
| | Electron-injection layer | | 539 | 1 | LiF | — |
| | Electron-transport layer | | 538(2) | 15 | Bphen | — |
| | | | 538(1) | 30 | 2mDBTBPDBq-II | — |
| | Light-emitting layer | | 522(2) | 20 | 2mDBTBPDBq-II:Ir(dmdppr-P)₂(dibm) | 1:0.04 |
| | | | 522(1) | 20 | 2mDBTBPDBq-II:PCBNBB:Ir(tBuppm)₂(acac) | 0.7:0.3:0.06 |
| | Hole-transport layer | | 537 | 20 | BPAFLP | — |
| | Charge-generation layer | | 535 | 12.5 | DBT3P-II:MoO₃ | 1:0.5 |
| | Electron-injection layer | | 534(2) | 2 | CuPc | — |
| | | | 534(1) | 0.1 | Li₂O | — |
| | Electron-transport layer | | 533(2) | 15 | Bphen | — |
| | | | 533(1) | 5 | CzPA | — |
| | Light-emitting layer | | 521 | 25 | CzPA:1,6mMemFLPAPm | 1:0.05 |
| | Hole-transport layer | | 532 | 10 | PCPPn | — |
| | Hole-injection layer | | 531 | 20 | PCPPn:MoO₃ | 1:0.5 |
| | Electrode | Conductive layer | Transparent conductive layer | 501b_2 | 40 | ITSO | — |
| | | | Transparent conductive layer | 501b_1 | 10 | IGZO (136) | — |
| | | Conductive layer | | 501a | 200 | Al—Ni—La | — |
| Light-emitting element 2 | Optical element | | 514 | — | CF (Green) | — |
| | Electrode | | 502(2) | 70 | ITO | — |
| | | | 502(1) | 15 | Ag:Mg | 1:0.1*1) |
| | Electron-injection layer | | 539 | 1 | LiF | — |
| | Electron-transport layer | | 538(2) | 15 | Bphen | — |
| | | | 538(1) | 30 | 2mDBTBPDBq-II | — |
| | Light-emitting layer | | 522(2) | 20 | 2mDBTBPDBq-II:Ir(dmdppr-P)₂(dibm) | 1:0.04 |
| | | | 522(1) | 20 | 2mDBTBPDBq-II:PCBNBB:Ir(tBuppm)₂(acac) | 0.7:0.3:0.06 |
| | Hole-transport layer | | 537 | 20 | BPAFLP | — |
| | Charge-generation layer | | 535 | 12.5 | DBT3P-II:MoO₃ | 1:0.5 |
| | Electron-injection layer | | 534(2) | 2 | CuPc | — |
| | | | 534(1) | 0.1 | Li₂O | — |
| | Electron-transport layer | | 533(2) | 15 | Bphen | — |
| | | | 533(1) | 5 | CzPA | — |
| | Light-emitting layer | | 521 | 25 | CzPA:1,6mMemFLPAPm | 1:0.05 |
| | Hole-transport layer | | 532 | 10 | PCPPn | — |

TABLE 4-continued

| Layer | | Reference numeral | Thickness (nm) | Material | Weight ratio |
|---|---|---|---|---|---|
| Hole-injection layer | | 531 | 37.5 | PCPPn:MoO$_3$ | 1:0.5 |
| Electrode | Conductive layer | 503b | 40 | IGZO (134) | — |
| | Conductive layer | 503a | 200 | Al-Ni-La | — |

*[1])volume ratio

<2-1. Fabrication of Light-Emitting Element 1>

As a conductive layer 501a of an electrode 501, an Al—Ni—La film was formed to a thickness of 200 nm over a substrate 510.

Next, an In—Ga—Zn oxide film was formed to a thickness of 10 nm as a transparent conductive layer 501b_1 to form a conductive layer 501b over and in contact with the conductive layer 501a. At this time, the In—Ga—Zn oxide film was formed using a sputtering target in which the atomic ratio of metal elements was In:Ga:Zn=1:3:6. The deposition conditions were as follows: a flow rate of Ar of 45 sccm; a pressure of 0.4 Pa; a power of 0.5 kW; and a substrate temperature of 300° C.

After that, as a transparent conductive layer 501b_2, an ITSO film was formed to a thickness of 40 nm over the transparent conductive layer 501b_1. Through the above steps, the electrode 501 was formed. Note that the area of the electrode 501 was 4 mm$^2$ (2 mm×2 mm).

As a hole-injection layer 531, 3-[4-(9-phenanthryl)-phenyl]-9-phenyl-9H-carbazole (abbreviation: PCPPn) and molybdenum oxide (MoO$_3$) were deposited by co-evaporation over the electrode 501 such that the deposited layer has a weight ratio of PCPPn:MoO$_3$=1:0.5 and a thickness of 20 nm.

As a hole-transport layer 532, PCPPn was deposited by evaporation to a thickness of 10 nm over the hole-injection layer 531.

As alight-emitting layer 521, 9-[4-(10-phenyl-9-anthracenyl)phenyl]-9H-Carbazole (abbreviation: CzPA) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) were deposited by co-evaporation over the hole-transport layer 532 such that the deposited layer has a weight ratio of CzPA:1,6mMemFLPAPrn=1:0.05 and a thickness of 25 nm. Note that CzPA served as a host material and 1,6mMemFLPAPrn served as a guest material (a fluorescent material) in the light-emitting layer 521.

As an electron-transport layer 533, CzPA and bathophenanthroline (abbreviation: Bphen) were sequentially deposited over the light-emitting layer 521 by evaporation to thicknesses of 5 nm and 15 nm respectively.

As an electron-injection layer 534, Li$_2$O and copper phthalocyanine (abbreviation: CuPc) were deposited by evaporation to thicknesses of 0.1 nm and 2 nm, respectively.

As a charge-generation layer 535 serving as the hole-injection layer, 4,4',4''-(benzene-1,3,5-triyl)tri(dibenzothiophen) (abbreviation: DBT3P-II) and MoO$_3$ were deposited by co-evaporation such that the deposited layer has a weight ratio of DBT3P-II:MoO$_3$=1:0.5 and a thickness of 12.5 nm.

Then, as a hole-transport layer 537, 4-phenyl-4'-(9-phenylfluoren-9-yl)triphenylamine (abbreviation: BPAFLP) was deposited over the charge-generation layer 535 by evaporation to a thickness of 20 nm.

Then, as a light-emitting layer 522, 2-[3'-(dibenzothiophen-4-yl)biphenyl-3-yl]dibenzo[f,h]quinoxaline (abbreviation: 2mDBTBPDBq-II), 4,4'-di(1-naphthyl)-4''-(9-phenyl-9H-carbazol-3-yl)triphenylamine (abbreviation: PCBNBB), and (acetylacetonato)bis(6-tert-butyl-4-phenylpyrimidinato)iridium(III) (abbreviation: Ir(tBuppm)$_2$(acac)) were deposited over the hole-transport layer 537 by co-evaporation such that the deposited layer has a weight ratio of 2mDBTBPDBq-II:PCBNBB:Ir(tBuppm)$_2$(acac)=0.7:0.3:0.06 and a thickness of 20 nm. Furthermore, 2mDBTBPDBq-II and bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: Ir(dmdppr-P)$_2$(dibm)) were deposited by co-evaporation such that the deposited layer has a weight ratio of 2mDBTBPDBq-II:Ir(dmdppr-P)$_2$(dibm)=1:0.04 and a thickness of 20 nm. Note that 2mDBTBPDBq-II served as a host material, PCBNBB served as an assist material, and Ir(tBuppm)$_2$(acac) and Ir(dmdppr-P)$_2$(dibm) each served as a guest material (a phosphorescent material) in the light-emitting layer 522.

Next, as an electron-transport layer 538, 2mDBTBPDBq-II and Bphen were sequentially deposited over the light-emitting layer 522 by evaporation to thicknesses of 30 nm and 15 nm, respectively, and as an electron-injection layer 539, lithium fluoride (LiF) was deposited over the electron-transport layer 538 by evaporation to a thickness of 1 nm.

As an electrode 502, an alloy film of silver (Ag) and magnesium (Mg) and an ITO film were formed over the electron-injection layer 539 to thicknesses of 15 nm and 70 nm, respectively. The alloy film of Ag and Mg was deposited by evaporation in a volume ratio of Ag:Mg=1:0.1.

Through the above steps, the components over the substrate 510 were formed. Note that in the above-described process, evaporation was all performed by a resistance heating method. The ITO film used for the electrode 502 was formed by a sputtering method.

As an optical element 514, a green (Green) color filter was provided for a sealing substrate 512 of the light-emitting element 1.

Next, the light-emitting element 1 was sealed by fixing the sealing substrate 512 to the substrate 510 using a sealant for an organic EL device in a glove box containing a nitrogen atmosphere. Specifically, the sealant was applied to surround the light-emitting element, the substrate 510 and the sealing substrate 512 were bonded to each other, irradiation with ultraviolet light having a wavelength of 365 nm at 6 J/cm$^2$ was performed, and heat treatment was performed at 80° C. for one hour. Through the above steps, the light-emitting element 1 was obtained.

<2-2. Fabrication of Light-emitting Element 2>

The light-emitting element 2 was fabricated through the same steps as those for the above-described light-emitting element 1 except steps described below.

As a conductive layer 503b over and in contact with a conductive layer 503a of an electrode 503, an In—Ga—Zn oxide film was formed to a thickness of 40 nm. At this time, the In—Ga—Zn oxide film was formed using a sputtering target in which the atomic ratio of metal elements was In:Ga:Zn=1:3:4. The deposition conditions were as follows: a flow rate of Ar of 45 sccm; a pressure of 0.4 Pa; a power of 0.5 kW; and a substrate temperature of 300° C.

Next, as the hole-injection layer 531, PCPPn and MoO$_3$ were deposited over the electrode 503 by co-evaporation such that the deposited layer has a weight ratio of PCPPn:MoO$_3$=1:0.5 and a thickness of 37.5 nm.

<2-3. Characteristics of Light-emitting Elements>

Figure 33:
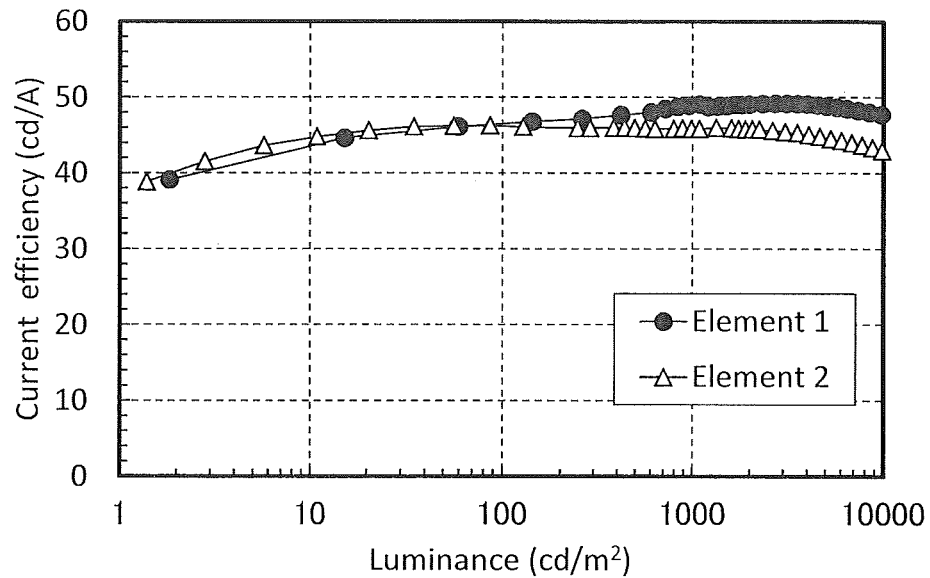
FIG. 33 shows current efficiency-luminance characteristics of light-emitting elements in Example.
Figure 34:
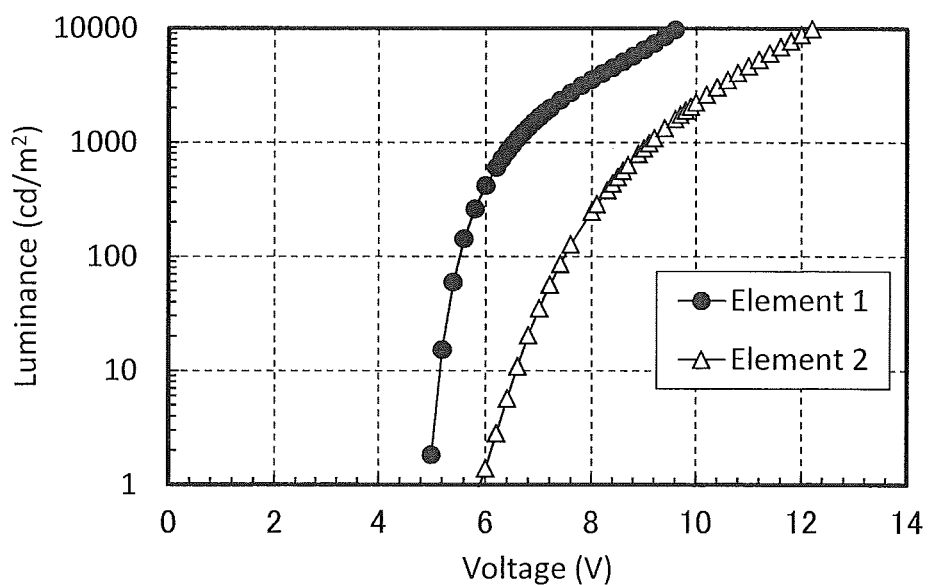
FIG. 34 shows luminance-voltage characteristics of light-emitting elements in Example.

Next, the current efficiency-luminance characteristics of the fabricated light-emitting elements 1 and 2 are shown in FIG. 33. Moreover, the luminance-voltage characteristics thereof are shown in FIG. 34. The measurements of the light-emitting elements were performed at room temperature (in an atmosphere kept at 23° C.).

Table 5 shows element characteristics of the light-emitting elements 1 and 2 at around 1000 cd/m$^2$.

TABLE 5

| | Voltage (V) | Current density (mA/cm$^2$) | Chromaticity (x,y) | Luminance (cd/m$^2$) | Current efficiency (cd/A) |
|---|---|---|---|---|---|
| Light-emitting element 1 | 6.5 | 2.0 | (0.27, 0.71) | 959 | 48.9 |
| Light-emitting element 2 | 9.1 | 2.2 | (0.24, 0.74) | 988 | 45.8 |

Figure 35:
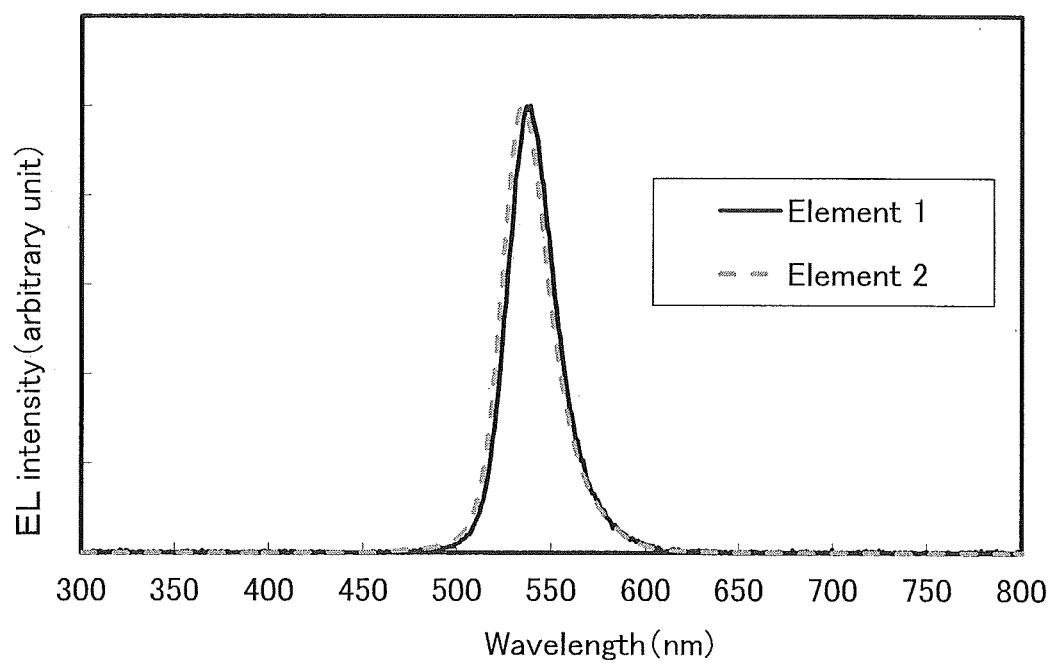
FIG. 35 shows electroluminescence spectra of light-emitting elements in Example.

FIG. 35 shows electroluminescence spectra when a current at a current density of 2.5 mA/cm$^2$ was supplied to the light-emitting elements 1 and 2.

As shown in FIG. 33, FIG. 34, FIG. 35, and Table 5, the light-emitting elements 1 and 2 emitted green light having high current efficiency and high color purity. Therefore, with the electrodes 501 and 503 formed with the transparent conductive layer including In and Ga serving as a stabilizer, it was possible to obtain a light-emitting element that emitted light having high current efficiency.

Furthermore, since the light-emitting element 2 is driven with higher current efficiency and lower drive voltage than the light-emitting element 1, it is preferable that the electrode 501 include the transparent conductive layer 501b_1 that contains In and Ga serving as a stabilizer over and in contact with the conductive layer 501a and the transparent conductive layer 501b_2 containing In over the transparent conductive layer 501b_1, and the thickness of the transparent conductive layer 501b_2 be larger than or equal to that of the transparent conductive layer 501b_1. In addition, it was found that the thickness of the transparent conductive layer 501b_1 is preferably 5 nm or more and 20 nm or less.

As described above, with a component of one embodiment of the present invention, a light-emitting element which has high current efficiency and is driven at a low drive voltage was able to be manufactured.

The structures described in Example 2 can be combined as appropriate with any of the structures described in the other examples and the embodiments.

EXAMPLE 3

Figure 32B:
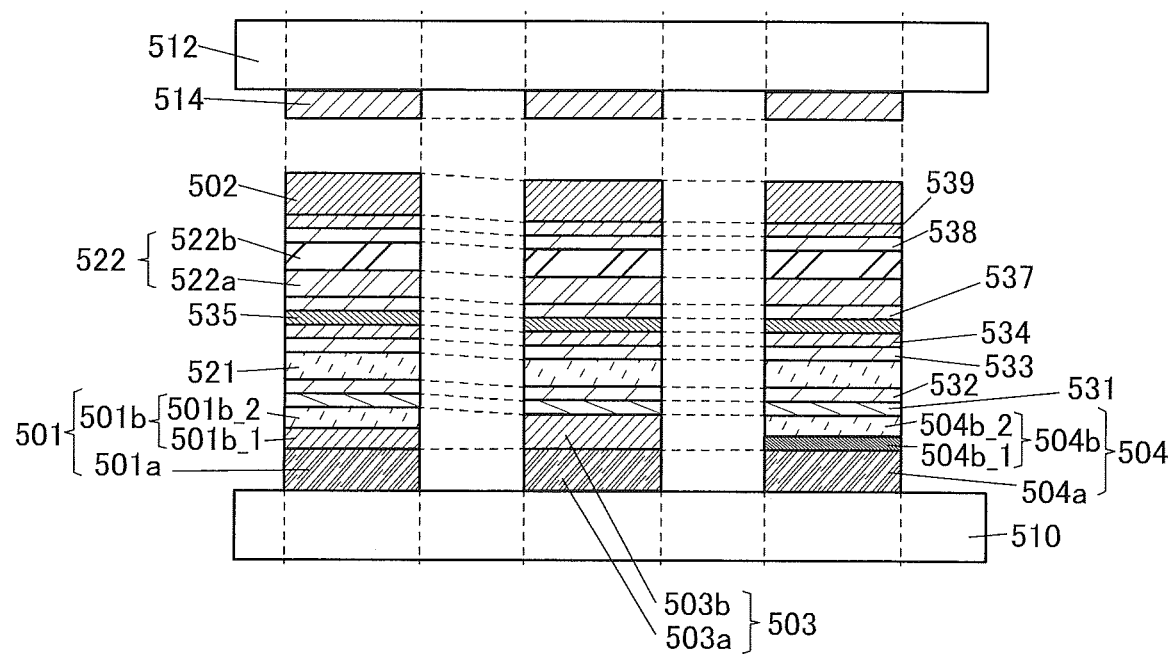

In Example 3, an example of fabricating light-emitting elements of one embodiment of the present invention (a light-emitting element 3, a light-emitting element 4, and a light-emitting element 5) will be described. A schematic cross-sectional view of the light-emitting elements fabricated in Example 3 is shown in FIG. 32B, the detailed structures of the light-emitting elements are shown in Tables 6 and 7, and the compounds used here are the same as those in Example 2.

TABLE 6

| | Layer | | Reference numeral | Thickness (nm) | Material | Weight ratio |
|---|---|---|---|---|---|---|
| Light-emitting element 3 | Optical element | | 514 | — | CF (Blue) | — |
| | Electrode | | 502(2) | 70 | ITO | — |
| | | | 502(1) | 15 | Ag:Mg | 1:0.1*[1] |
| | Electron-injection layer | | 539 | 1 | LiF | — |
| | Electron-transport layer | | 538(2) | 15 | Bphen | — |
| | | | 538(1) | 30 | 2mDBTBPDBq-II | — |
| | Light-emitting layer | | 522(2) | 20 | 2mDBTBPDBq-II:Ir(dmdppr-P)$_2$(dibm) | 1:0.04 |
| | | | 522(1) | 20 | 2mDBTBPDBq-II:PCBNBB:Ir(tBuppm)$_2$(acac) | 0.7:0.3:0.06 |
| | Hole-transport layer | | 537 | 20 | BPAFLP | — |
| | Charge-generation layer | | 535 | 12.5 | DBT3P-II:MoO$_3$ | 1:0.5 |
| | Electron-injection layer | | 534(2) | 2 | CuPc | — |
| | | | 534(1) | 0.1 | Li$_2$O | — |
| | Electron-transport layer | | 533(2) | 15 | Bphen | — |
| | | | 533(1) | 5 | CzPA | — |
| | Light-emitting layer | | 521 | 25 | CzPA:1,6mMemFLPAPm | 1:0.05 |
| | Hole-transport layer | | 532 | 10 | PCPPn | — |
| | Hole-injection layer | | 531 | 9 | PCPPn:MoO$_3$ | 1:0.5 |
| | Electrode | Conductive layer | Transparent conductive layer | 501b_2 | 10 | ITSO | — |
| | | | Transparent conductive layer | 501b_1 | 10 | IGZO (136) | — |
| | | Conductive layer | | 501a | 200 | Al—Ni—La | — |
| Light-emitting element 4 | Optical element | | 514 | — | CF (Blue) | — |
| | Electrode | | 502(2) | 70 | ITO | — |
| | | | 502(1) | 15 | Ag:Mg | 1:0.1*[1] |
| | Electron-injection layer | | 539 | 1 | LiF | — |
| | Electron-transport layer | | 538(2) | 15 | Bphen | — |
| | | | 538(1) | 30 | 2mDBTBPDBq-II | — |
| | Light-emitting layer | | 522(2) | 20 | 2mDBTBPDBq-II:Ir(dmdppr-P)$_2$(dibm) | 1:0.04 |
| | | | 522(1) | 20 | 2mDBTBPDBq-II:PCBNBB:Ir(tBuppm)$_2$(acac) | 0.7:0.3:0.06 |
| | Hole-transport layer | | 537 | 20 | BPAFLP | — |
| | Charge-generation layer | | 535 | 12.5 | DBT3P-II:MoO$_3$ | 1:0.5 |
| | Electron-injection layer | | 534(2) | 2 | CuPc | — |

TABLE 6-continued

| Layer | | Reference numeral | Thickness (nm) | Material | Weight ratio |
|---|---|---|---|---|---|
| | | 534(1) | 0.1 | Li$_2$O | — |
| Electron-transport layer | | 533(2) | 15 | Bphen | — |
| | | 533(1) | 5 | CzPA | — |
| Light-emitting layer | | 521 | 25 | CzPA:1,6mMemFLPAPm | 1:0.05 |
| Hole-transport layer | | 532 | 10 | PCPPn | — |
| Hole-injection layer | | 531 | 22.5 | PCPPn:MoO$_3$ | 1:0.5 |
| Electrode | Conductive layer | 503b | 10 | IGZO(134) | — |
| | Conductive layer | 503a | 200 | Al-Ni-La | — |

*1)volume ratio

TABLE 7

| Layer | | | Reference numeral | Thickness (nm) | Material | Weight ratio |
|---|---|---|---|---|---|---|
| Light-emitting element 5 | Optical element | | 514 | — | CF (Blue) | — |
| | Electrode | | 502(2) | 70 | ITO | — |
| | | | 502(1) | 15 | Ag:Mg | 1:0.1*1) |
| | Electron-injection layer | | 539 | 1 | LiF | — |
| | Electron-transport layer | | 538(2) | 15 | Bphen | — |
| | | | 538(1) | 30 | 2mDBTBPDBq-II | — |
| | Light-emitting layer | | 522(2) | 20 | 2mDBTBPDBq-II:Ir(dmdppr-P)$_2$(dibm) | 1:0.04 |
| | | | 522(1) | 20 | 2mDBTBPDBq-II:PCBNBB:Ir(tBuppm)$_2$(acac) | 0.7:0.3:0.06 |
| | Hole-transport layer | | 537 | 20 | BPAFLP | — |
| | Charge-generation layer | | 535 | 12.5 | DBT3P-II:MoO$_3$ | 1:0.5 |
| | Electron-injection layer | | 534(2) | 2 | CuPc | — |
| | | | 534(1) | 0.1 | Li$_2$O | — |
| | Electron-transport layer | | 533(2) | 15 | Bphen | — |
| | | | 533(1) | 5 | CzPA | — |
| | Light-emitting layer | | 521 | 25 | CzPA:1,6mMemFLPAPm | 1:0.05 |
| | Hole-transport layer | | 532 | 10 | PCPPn | — |
| | Hole-injection layer | | 531 | 5 | PCPPn:MoO$_3$ | 1:0.5 |
| | Electrode | Conductive layer | Transparent conductive layer | 504b_2 | 10 | ITSO | — |
| | | | Transparent conductive layer | 504b_1 | 6 | Ti | — |
| | | Conductive layer | | 504a | 200 | Al-Ni-La | — |

*1)volume ratio

<3-1. Fabrication of Light-emitting Element 3>

The light-emitting element 3 was fabricated through the same steps as those for the light-emitting element 1 described in Example 2 except steps described below.

Next, an In—Ga—Zn oxide film was formed to a thickness of 10 nm as the transparent conductive layer 501b_1 to form the conductive layer 501b over and in contact with the conductive layer 501a of the electrode 501. At this time, the In—Ga—Zn oxide film was formed using a sputtering target in which the atomic ratio of metal elements was In:Ga:Zn=1:3:6. The deposition conditions were as follows: a flow rate of Ar of 45 sccm; a pressure of 0.4 Pa; a power of 0.5 kW; and a substrate temperature of 300° C.

After that, as the transparent conductive layer 501b 2, an ITSO film was formed to a thickness of 10 inn over the transparent conductive layer 501b_1.

Next, as the hole-injection layer 531, PCPPn and MoO$_3$ were deposited over the electrode 501 by co-evaporation such that the deposited layer has a weight ratio of PCPPn:MoO$_3$=1:0.5 and a thickness of 9 nm.

<3-2. Fabrication of Light-emitting Element 4>

The light-emitting element 4 was fabricated through the same steps as those for the light-emitting element 3 except steps described below.

As the conductive layer 503b over and in contact with the conductive layer 503a of the electrode 503, an In—Ga—Zn oxide film was formed to a thickness of 10 nm. At this time, the In—Ga—Zn oxide film was formed using a sputtering target in which the atomic ratio of metal elements was In:Ga:Zn=1:3:4. The deposition conditions were as follows: a flow rate of Ar of 45 sccm; a pressure of 0.4 Pa; a power of 0.5 kW; and a substrate temperature of 300° C.

Note that in the light-emitting element 4, the electrode 503 was formed to include the conductive layer 503b using one transparent conductive layer, and the second transparent conductive layer was not formed.

Next, as the hole-injection layer 531, PCPPn and MoO$_3$ were deposited over the electrode 503 by co-evaporation such that the deposited layer has a weight ratio of PCPPn:MoO$_3$=1:0.5 and a thickness of 22.5 nm.

<3-3. Fabrication of Light-emitting Element 5>

The light-emitting element 5 was fabricated through the same steps as those for the light-emitting element 3 except steps described below.

As a conductive layer 504a of an electrode 504, an Al—Ni—La film was formed to a thickness of 200 nm over the substrate 510.

Next, a Ti film was formed to a thickness of 6 nm as a transparent conductive layer 504b_1 to form a conductive layer 504b over and in contact with the conductive layer 504a. After the Ti film was formed, bake treatment was performed at 300° C. for one hour to oxidize the Ti film; accordingly, a titanium oxide film was formed.

After that, as a transparent conductive layer 504b_2, an ITSO film was formed to a thickness of 10 nm over the transparent conductive layer 504b_1. Through the above steps, the electrode 504 was formed.

Next, as the hole-injection layer 531, PCPPn and MoO$_3$ were deposited over the electrode 504 by co-evaporation such that the deposited layer has a weight ratio of PCPPn:MoO$_3$=1:0.5 and a thickness of 5 nm.

As the optical element 514, a blue (Blue) color filter was provided for the sealing substrate 512 of each of the light-emitting elements 3 to 5.

<3-4. Characteristics of Light-emitting Elements>

Figure 36:
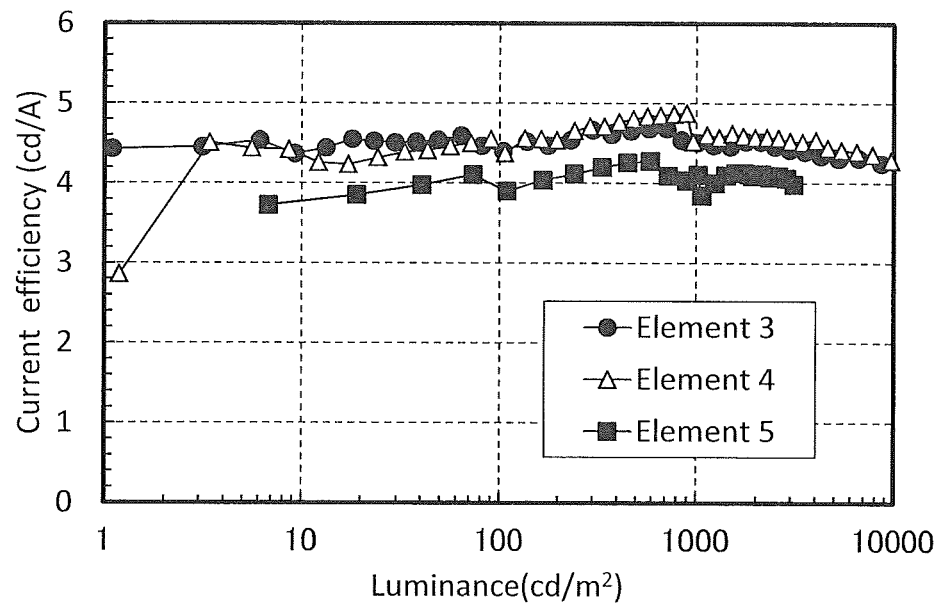
FIG. 36 shows current efficiency-luminance characteristics of light-emitting elements in Example.
Figure 37:
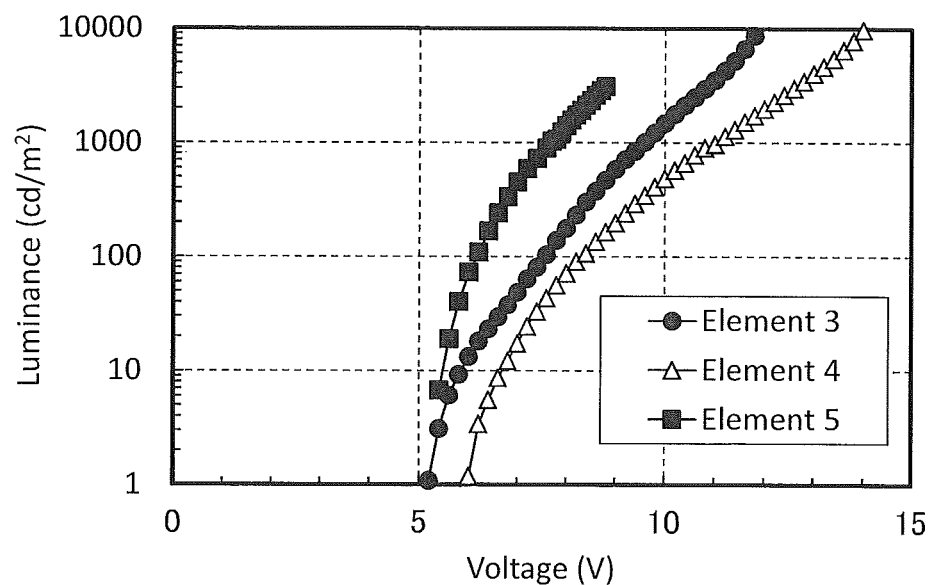
FIG. 37 shows luminance-voltage characteristics of light-emitting elements in Example.

Next, the current efficiency-luminance characteristics of the fabricated light-emitting elements 3 to 5 are shown in FIG. 36. Moreover, the luminance-voltage characteristics thereof are shown in FIG. 37. The measurements of the light-emitting elements were performed at room temperature (in an atmosphere kept at 23° C.).

Table 8 shows element characteristics of the light-emitting elements 3 to 5 at around 1000 cd/m$^2$.

TABLE 8

| | Voltage (V) | Current density (mA/cm$^2$) | Chromaticity (x,y) | Luminance (cd/m$^2$) | Current efficiency (cd/A) |
|---|---|---|---|---|---|
| Light-emitting element 3 | 9.6 | 22.5 | (0.14, 0.07) | 1010 | 4.5 |
| Light-emitting element 4 | 10.8 | 18.4 | (0.14, 0.06) | 897 | 4.9 |
| Light-emitting element 5 | 7.7 | 24.9 | (0.14, 0.06) | 1020 | 4.1 |

Figure 38:
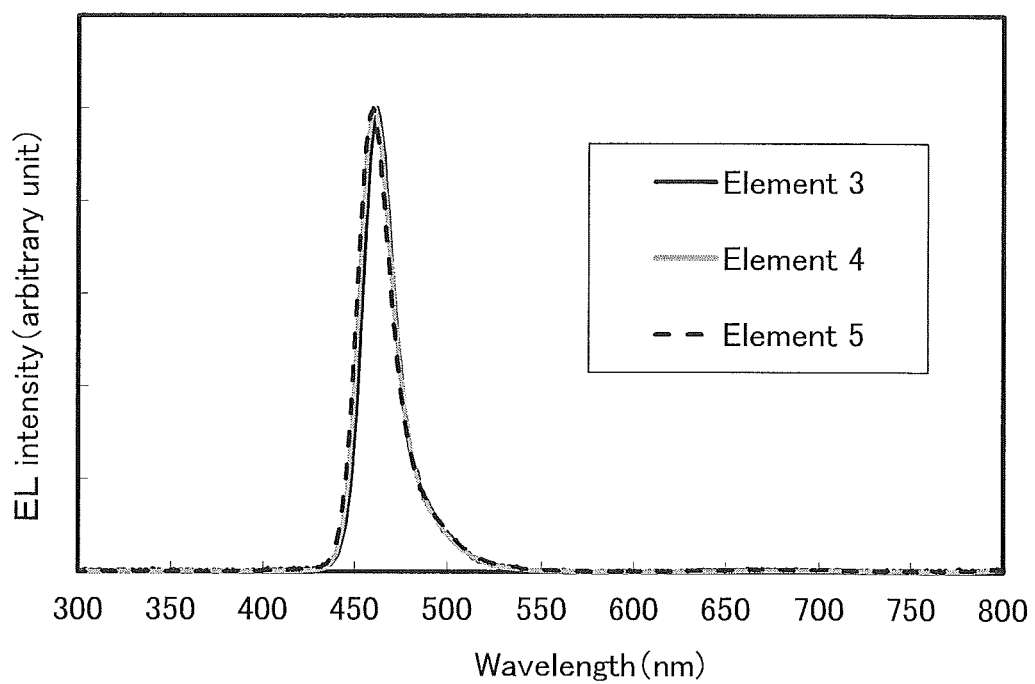
FIG. 38 shows electroluminescence spectra of light-emitting elements in Example.

FIG. 38 shows electroluminescence spectra when a current at a current density of 2.5 mA/cm$^2$ was supplied to the light-emitting elements 3 to 5.

As shown in FIG. 36, FIG. 37, FIG. 38, and Table 8, the light-emitting elements 3 and 4 emitted blue light having higher current efficiency than the light-emitting element 5 despite its high color purity. As described in Example 1, the structure of the electrode including an In—Ga—Zn oxide as a transparent conductive layer of one embodiment of the present invention has high reflectance particularly in a blue wavelength range. Therefore, the electrode structure used for the light-emitting elements 3 and 4 was found to be especially favorable for a light-emitting element that emits blue light.

As described above, with a component of one embodiment of the present invention, a light-emitting element having high current efficiency was able to be manufactured.

The structures described in Example 3 can be combined as appropriate with any of the structures described in the other examples and the embodiments.

This application is based on Japanese Patent Application serial no. 2014-227128 filed with Japan Patent Office on Nov. 7, 2014, the entire contents of which are hereby incorporated by reference.

What is claimed is:

1. A light-emitting element comprising:
   a first electrode and a second electrode; and
   an EL layer between the first electrode and the second electrode,
   wherein the first electrode comprises:
      a conductive layer configured to reflect light;
      a first transparent conductive layer in contact with the conductive layer, the first transparent conductive layer comprising a first oxide; and
      a second transparent conductive layer in contact with the first transparent conductive layer, the second transparent conductive layer comprising a second oxide,
   wherein the first oxide comprises In, Ga, and Zn,
   wherein a content of Zn is higher than a content of Ga in the first oxide,
   wherein the second oxide comprises indium tin oxide,
   wherein the first transparent conductive layer is sandwiched between the conductive layer and the second transparent conductive layer,
   wherein a resistivity of the second transparent conductive layer is lower than a resistivity of the first transparent conductive layer, and
   wherein a thickness of the second transparent conductive layer is greater than or equal to a thickness of the first transparent conductive layer.

2. The light-emitting element according to claim 1, wherein the conductive layer comprises Al.

3. The light-emitting element according to claim 1, wherein the thickness of the first transparent conductive layer is greater than or equal to 5 nm and less than or equal to 20 nm.

4. The light-emitting element according to claim 1, wherein the second oxide further comprises silicon or silicon oxide.

5. The light-emitting element according to claim 1, wherein the second electrode comprises at least one of In, Ag, and Mg.

6. The light-emitting element according to claim 1, wherein the EL layer comprises a first light-emitting layer and a second light-emitting layer.

7. The light-emitting element according to claim 1,
   wherein the EL layer comprises a first light-emitting layer and a second light-emitting layer,
   wherein the first light-emitting layer comprises a first compound which has a peak of an emission spectrum in any one color selected from violet, blue, and blue green, and
   wherein the second light-emitting layer comprises a second compound which has a peak of an emission spectrum in any one color selected from green, yellow green, yellow, orange, and red.

8. The light-emitting element according to claim 1,
   wherein the EL layer comprises a first light-emitting layer and a second light-emitting layer,
   wherein the first light-emitting layer comprises a first compound which is configured to convert singlet excitation energy into light emission, and
   wherein the second light-emitting layer comprises a second compound which is configured to convert triplet excitation energy into light emission.

9. A display device comprising:
   the light-emitting element according to claim 1; and
   a transistor electrically connected to the light-emitting element,
   wherein a channel region of the transistor comprises an oxide semiconductor.

10. An electronic device comprising the display device according to claim 9.

11. A lighting device comprising the light-emitting element according to claim 1.

12. A light-emitting element comprising:
a first electrode and a second electrode; and
an EL layer between the first electrode and the second electrode,
wherein the first electrode comprises:
   a conductive layer configured to reflect light;
   a first transparent conductive layer in contact with the conductive layer, the first transparent conductive layer comprising a first oxide; and
   a second transparent conductive layer in contact with the first transparent conductive layer, the second transparent conductive layer comprising a second oxide,
wherein the first oxide comprises In, Ga, and Zn,
wherein a content of Zn is higher than a content of Ga in the first oxide,
wherein the content of Ga is higher than a content of In in the first oxide,
wherein the second oxide comprises indium tin oxide,
wherein the first transparent conductive layer is sandwiched between the conductive layer and the second transparent conductive layer,
wherein a resistivity of the second transparent conductive layer is lower than a resistivity of the first transparent conductive layer, and
wherein a thickness of the second transparent conductive layer is greater than or equal to a thickness of the first transparent conductive layer.

13. The light-emitting element according to claim 12, wherein the conductive layer comprises Al.

14. The light-emitting element according to claim 12, wherein the thickness of the first transparent conductive layer is greater than or equal to 5 nm and less than or equal to 20 nm.

15. The light-emitting element according to claim 12, wherein the second oxide further comprises silicon or silicon oxide.

16. The light-emitting element according to claim 12, wherein the second electrode comprises at least one of In, Ag, and Mg.

17. The light-emitting element according to claim 12, wherein the EL layer comprises a first light-emitting layer and a second light-emitting layer.

18. A display device comprising:
the light-emitting element according to claim 12; and
a transistor electrically connected to the light-emitting element,
wherein a channel region of the transistor comprises an oxide semiconductor.

19. A light-emitting element comprising:
a first electrode and a second electrode; and
an EL layer between the first electrode and the second electrode,
wherein the first electrode comprises:
   a conductive layer configured to reflect light;
   a first transparent conductive layer in contact with the conductive layer, the first transparent conductive layer comprising a first oxide;
   a second transparent conductive layer in contact with the first transparent conductive layer, the second transparent conductive layer comprising a second oxide;
   a third transparent conductive layer in contact with the conductive layer, the third transparent conductive layer comprising the first oxide; and
   a fourth transparent conductive layer in contact with the third transparent conductive layer, the fourth transparent conductive layer comprising the second oxide,
wherein the conductive layer comprises Al,
wherein the first oxide comprises In, Ga, and Zn,
wherein a content of Zn is higher than a content of Ga in the first oxide,
wherein the content of Ga is higher than a content of In in the first oxide,
wherein the second oxide comprises indium tin oxide,
wherein the first transparent conductive layer is sandwiched between the conductive layer and the second transparent conductive layer,
wherein the third transparent conductive layer is sandwiched between the conductive layer and the fourth transparent conductive layer,
wherein a resistivity of the second transparent conductive layer is lower than a resistivity of the first transparent conductive layer, and
wherein a thickness of the second transparent conductive layer is greater than or equal to a thickness of the first transparent conductive layer.

20. The light-emitting element according to claim 19, wherein the thickness of the first transparent conductive layer is greater than or equal to 5 nm and less than or equal to 20 nm.

21. The light-emitting element according to claim 19, wherein the second oxide further comprises silicon or silicon oxide.

22. The light-emitting element according to claim 19, wherein the second electrode comprises at least one of In, Ag, and Mg.

23. The light-emitting element according to claim 19, wherein the EL layer comprises a first light-emitting layer and a second light-emitting layer.

24. A display device comprising:
the light-emitting element according to claim 19; and
a transistor electrically connected to the light-emitting element,
wherein a channel region of the transistor comprises an oxide semiconductor.

* * * * *